US007869085B2

(12) United States Patent
Nemoto et al.

(10) Patent No.: US 7,869,085 B2
(45) Date of Patent: Jan. 11, 2011

(54) MEMORY CONTROLLER, MEMORY CONTROL METHOD, RATE CONVERSION APPARATUS, RATE CONVERSION METHOD, IMAGE-SIGNAL-PROCESSING APPARATUS, IMAGE-SIGNAL-PROCESSING METHOD, AND PROGRAM FOR EXECUTING EACH OF THOSE METHODS

(75) Inventors: Kohtaro Nemoto, Chiba (JP); Tetsujiro Kondo, Tokyo (JP); Nobuyuki Asakura, Tokyo (JP); Satoshi Inoue, Tokyo (JP); Wataru Niitsuma, Tokyo (JP); Tatsuya Ishii, Kanagawa (JP); Takahide Ayata, Kanagawa (JP); Masanori Yamanaka, Kanagawa (JP); Yasushi Tatehira, Kanagawa (JP)

(73) Assignee: Sony Corporation, Tokyo (JP)

( * ) Notice: Subject to any disclaimer, the term of this patent is extended or adjusted under 35 U.S.C. 154(b) by 1181 days.

(21) Appl. No.: 10/921,267

(22) Filed: Aug. 19, 2004

(65) Prior Publication Data

US 2005/0128493 A1 Jun. 16, 2005

(30) Foreign Application Priority Data

Aug. 19, 2003 (JP) ............................ 2003-295511
Aug. 19, 2003 (JP) ............................ 2003-295512
Aug. 19, 2003 (JP) ............................ 2003-295513

(51) Int. Cl.
*G06F 15/00* (2006.01)
*G06K 15/00* (2006.01)
*H04N 1/405* (2006.01)
*G03F 3/08* (2006.01)

(52) U.S. Cl. ...................... 358/1.9; 358/1.16; 358/1.17; 358/1.2; 358/3.07; 358/3.2; 358/523

(58) Field of Classification Search ................. 358/415, 358/1.16, 1.9, 1.13, 474, 296, 475; 345/656, 345/690, 204, 99; 348/555, E5.007, E5.043; 341/61; 386/112, 46, 109, 111
See application file for complete search history.

(56) References Cited

U.S. PATENT DOCUMENTS 5,038,218 A * 8/1991 Matsumoto ................. 358/296

(Continued)

FOREIGN PATENT DOCUMENTS

| | | |
|---|---|---|
| JP | 07-225562 | 8/1995 |
| JP | 7-225562 | 8/1995 |
| JP | 8-328941 | 12/1996 |

(Continued)

OTHER PUBLICATIONS

Office Action issued Aug. 19, 2010, in Japanese Patent Application No. 2003-295511, filed Aug. 19, 2003.

*Primary Examiner*—King Y Poon
*Assistant Examiner*—Akwasi M Sarpong
(74) *Attorney, Agent, or Firm*—Oblon, Spivak, McClelland, Maier & Neustadt, L.L.P.

(57) ABSTRACT

A luminance signal Ya and a color-difference signal Ua/Va constituting an input image signal is transferred to a frame memory (first memory) in the unit of line synchronously with its horizontal synchronous signal and written therein. A memory TG211 reads out a read-out request RRQ. The cycle of this request RRQ is a time computed based on a single vertical effective period of an output image signal Sc and the number of lines objective for rate conversion of an input image signal Sa. The luminance signal Ya and color-difference signal Ua/Va are transferred in the unit of line from the frame memory to rate conversion units (second memory) through buffers. There occurs no deflection in this transfer cycle and in each transfer cycle, the stable data transmission band can be secured.

13 Claims, 36 Drawing Sheets

U.S. PATENT DOCUMENTS

| | | | | | |
|---|---|---|---|---|---|
| 5,208,583 | A | * | 5/1993 | Cusick et al. | 345/28 |
| 5,461,420 | A | * | 10/1995 | Yonemitsu et al. | 358/415 |
| 6,031,546 | A | * | 2/2000 | Shimizu | 345/656 |
| 6,057,889 | A | * | 5/2000 | Reitmeier et al. | 348/555 |
| 6,115,537 | A | * | 9/2000 | Yamada et al. | 348/E5.007 |
| 6,396,507 | B1 | * | 5/2002 | Kaizuka et al. | 345/661 |
| 6,400,903 | B1 | * | 6/2002 | Conoval | 348/E5.043 |
| 6,427,157 | B1 | * | 7/2002 | Webb | 341/61 |
| RE38,227 | E | * | 8/2003 | Sugiyama et al. | 386/112 |
| 6,839,154 | B1 | * | 1/2005 | Ohtsu | 358/475 |
| 7,154,539 | B1 | * | 12/2006 | Nishimura et al. | 348/220.1 |
| 2003/0011821 | A1 | * | 1/2003 | Obata et al. | 358/1.16 |
| 2003/0123074 | A1 | * | 7/2003 | Imai et al. | 358/1.9 |
| 2003/0137683 | A1 | * | 7/2003 | Mochizuki et al. | 358/1.13 |
| 2003/0156128 | A1 | * | 8/2003 | Ito | 345/690 |
| 2003/0169247 | A1 | * | 9/2003 | Kawabe et al. | 345/204 |
| 2003/0179419 | A1 | * | 9/2003 | Abe | 358/474 |
| 2004/0213542 | A1 | * | 10/2004 | Hamasaka et al. | 386/46 |

FOREIGN PATENT DOCUMENTS

| | | |
|---|---|---|
| JP | 10-333659 | 12/1998 |
| JP | 2000-227895 | 8/2000 |
| JP | 2000-341585 | 12/2000 |
| JP | 2001-36871 | 2/2001 |
| JP | 2002-500479 | 1/2002 |
| JP | 4264641 | 2/2009 |
| JP | 4265342 | 2/2009 |

* cited by examiner

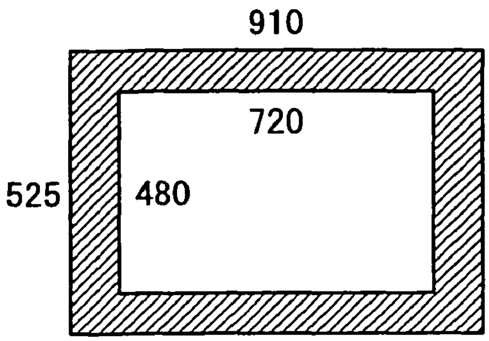
F I G. 2A
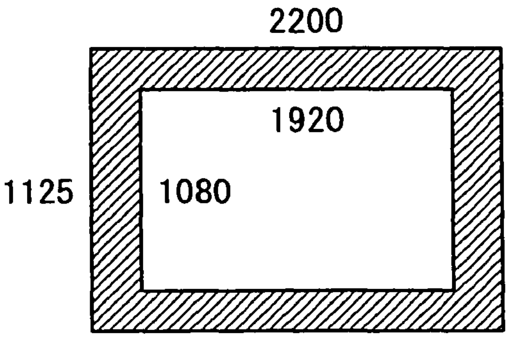
F I G. 2B
F I G. 4
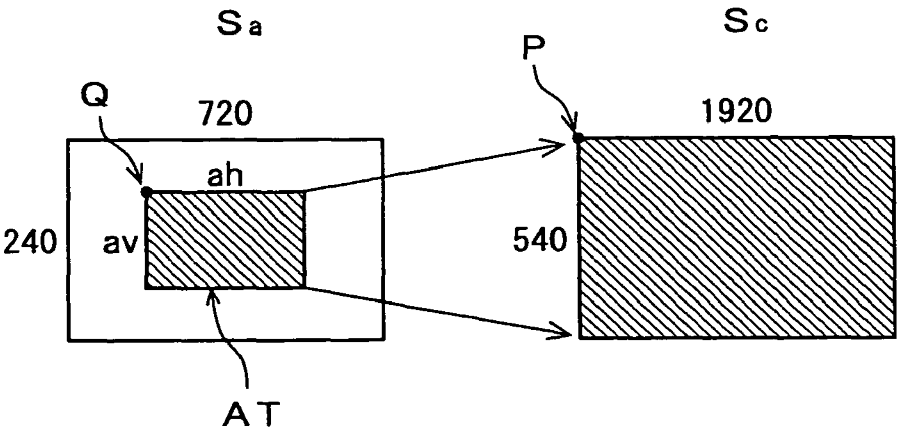

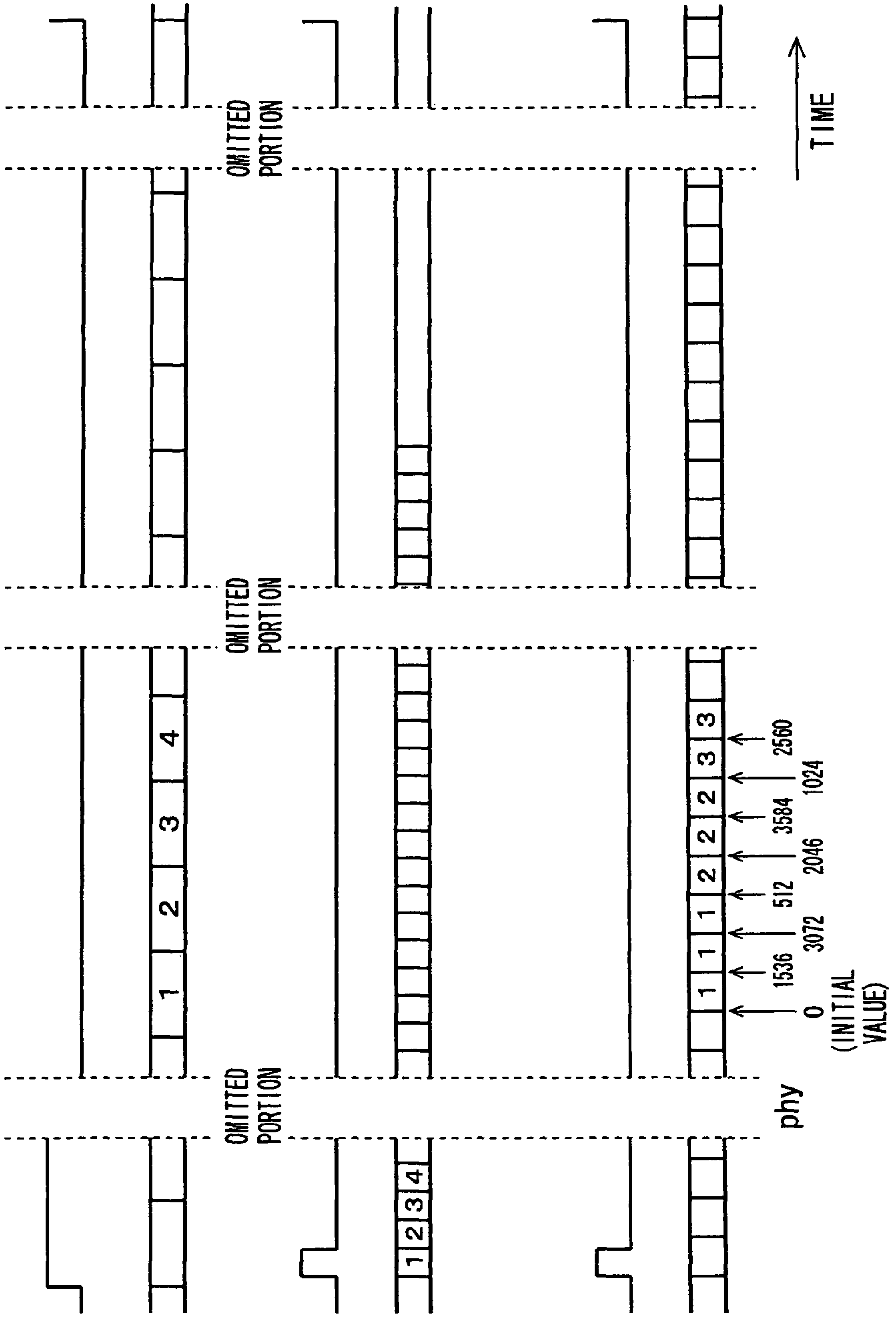
FIG. 11A (HDi)
FIG. 11B (Ya)
FIG. 11C (RRQ)
FIG. 11D (Ya)
FIG. 11E (HDo)
FIG. 11F (Yc)

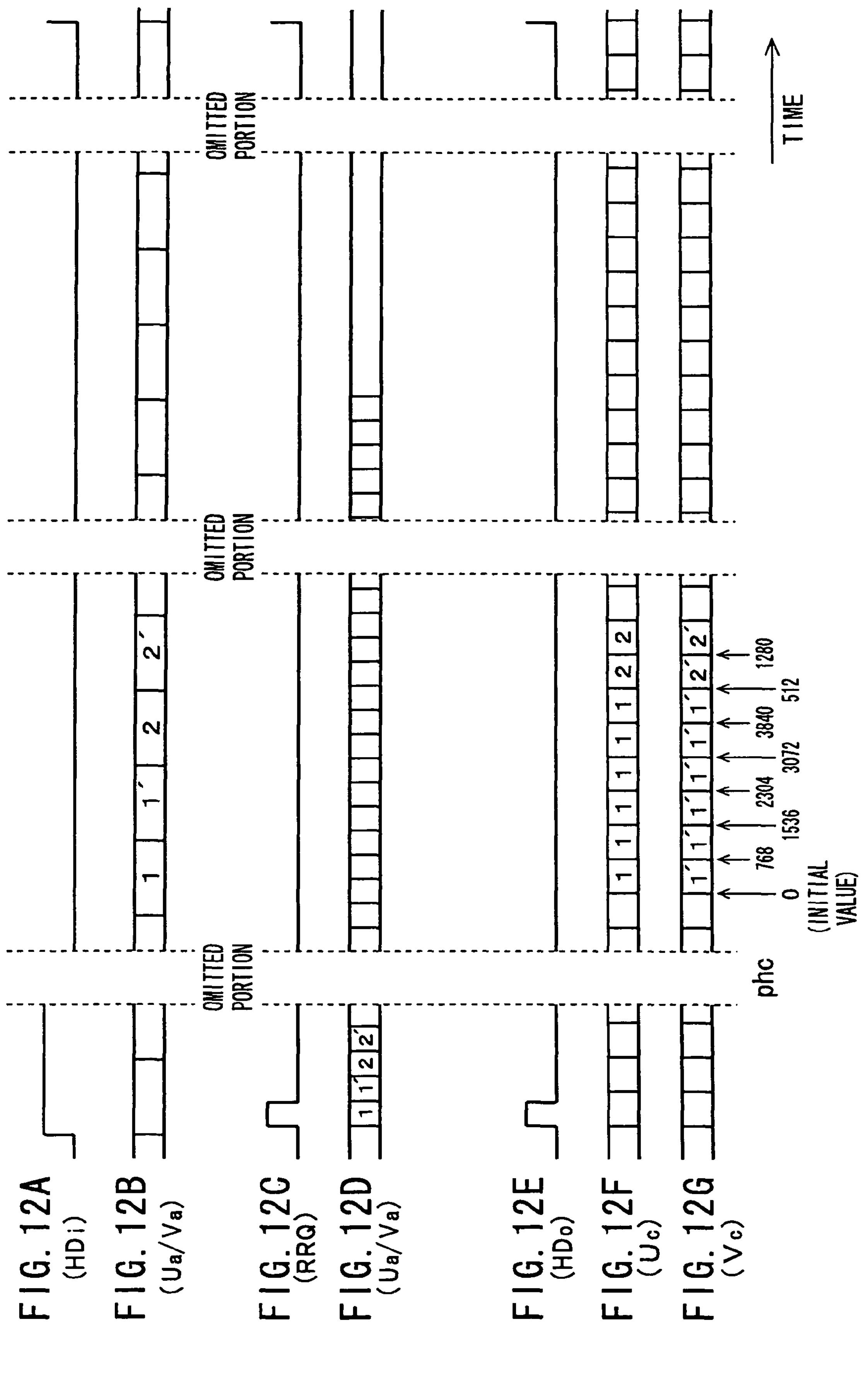
FIG. 12A (HDi)
FIG. 12B (Ua/Va)
FIG. 12C (RRQ)
FIG. 12D (Ua/Va)
FIG. 12E (HDo)
FIG. 12F (Uc)
FIG. 12G (Vc)
OMITTED PORTION
OMITTED PORTION
OMITTED PORTION
phc
0 (INITIAL VALUE)
768
1536
2304
3072
3840
512
1280
TIME

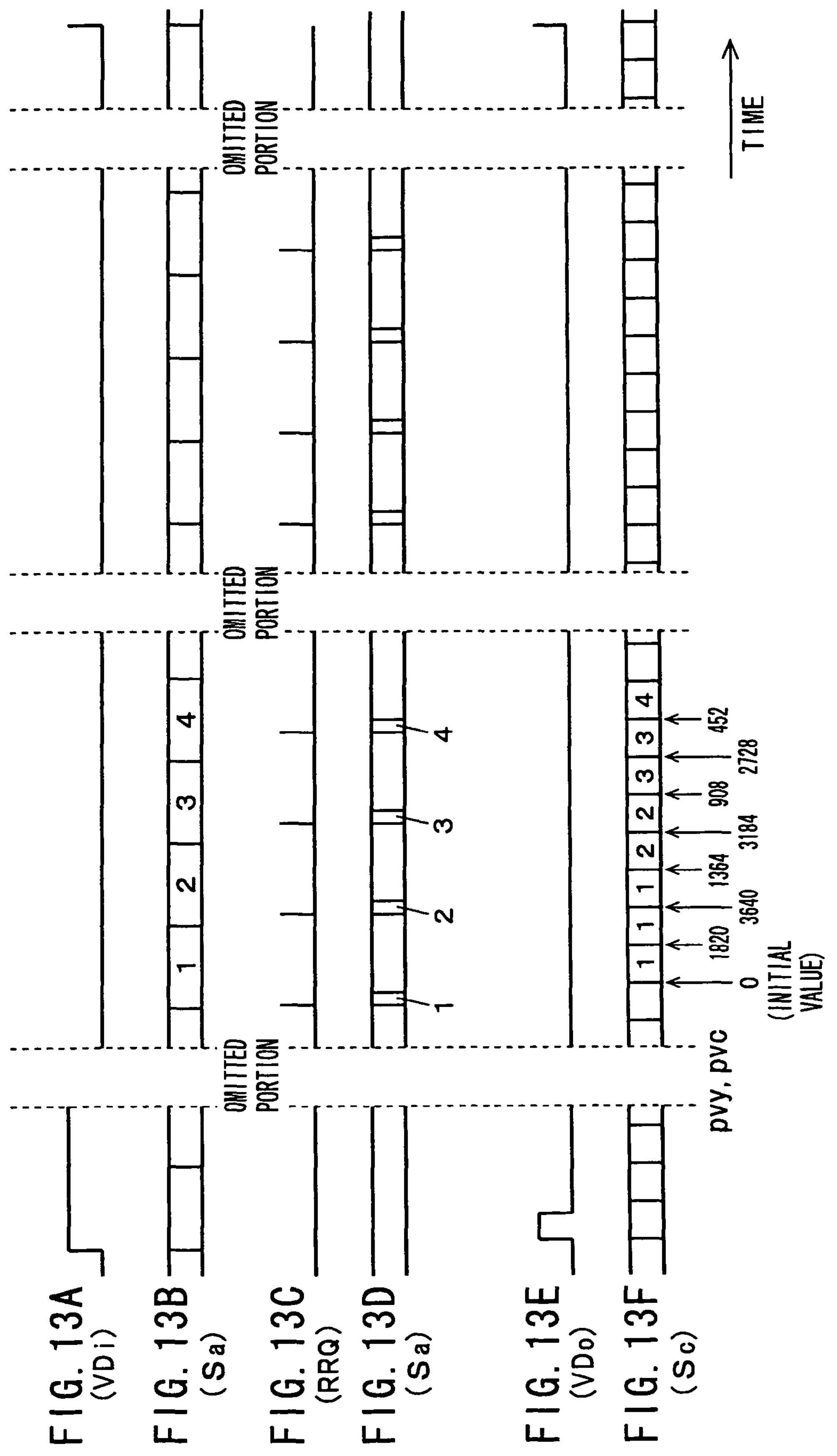
FIG. 13A (VDi)
FIG. 13B (Sa)
FIG. 13C (RRQ)
FIG. 13D (Sa)
FIG. 13E (VDo)
FIG. 13F (Sc)
OMITTED PORTION
OMITTED PORTION
OMITTED PORTION
TIME
pvy, pvc
0 (INITIAL VALUE)
1820
3640
1364
3184
908
2728
452
1
2
3
4

FIG. 20A
FIG. 20B
FIG. 20C
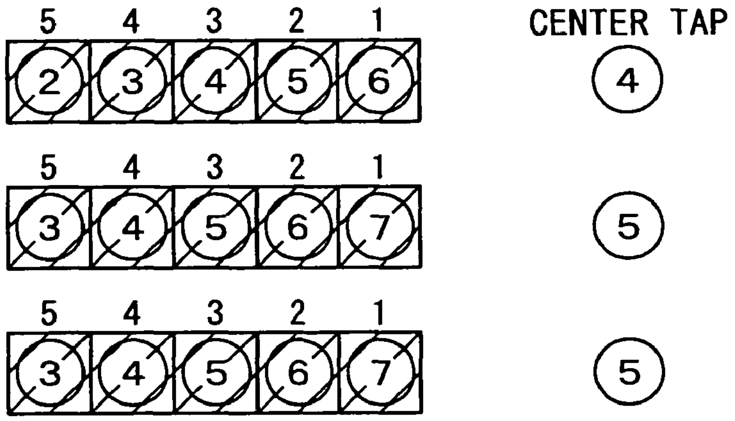
FIG. 21A
FIG. 21B
FIG. 21C
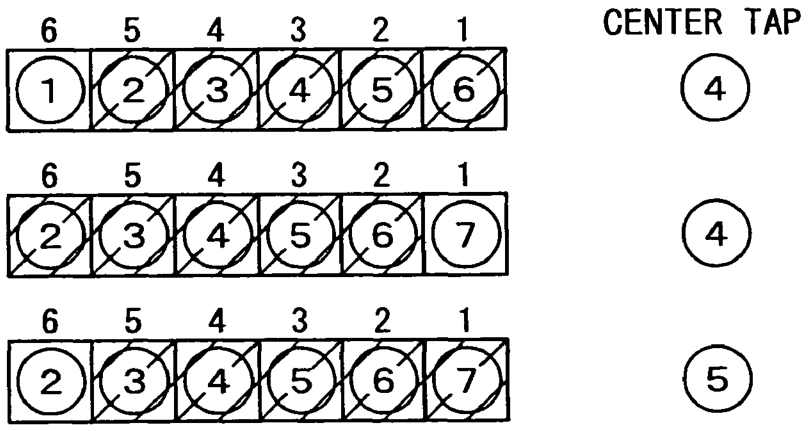

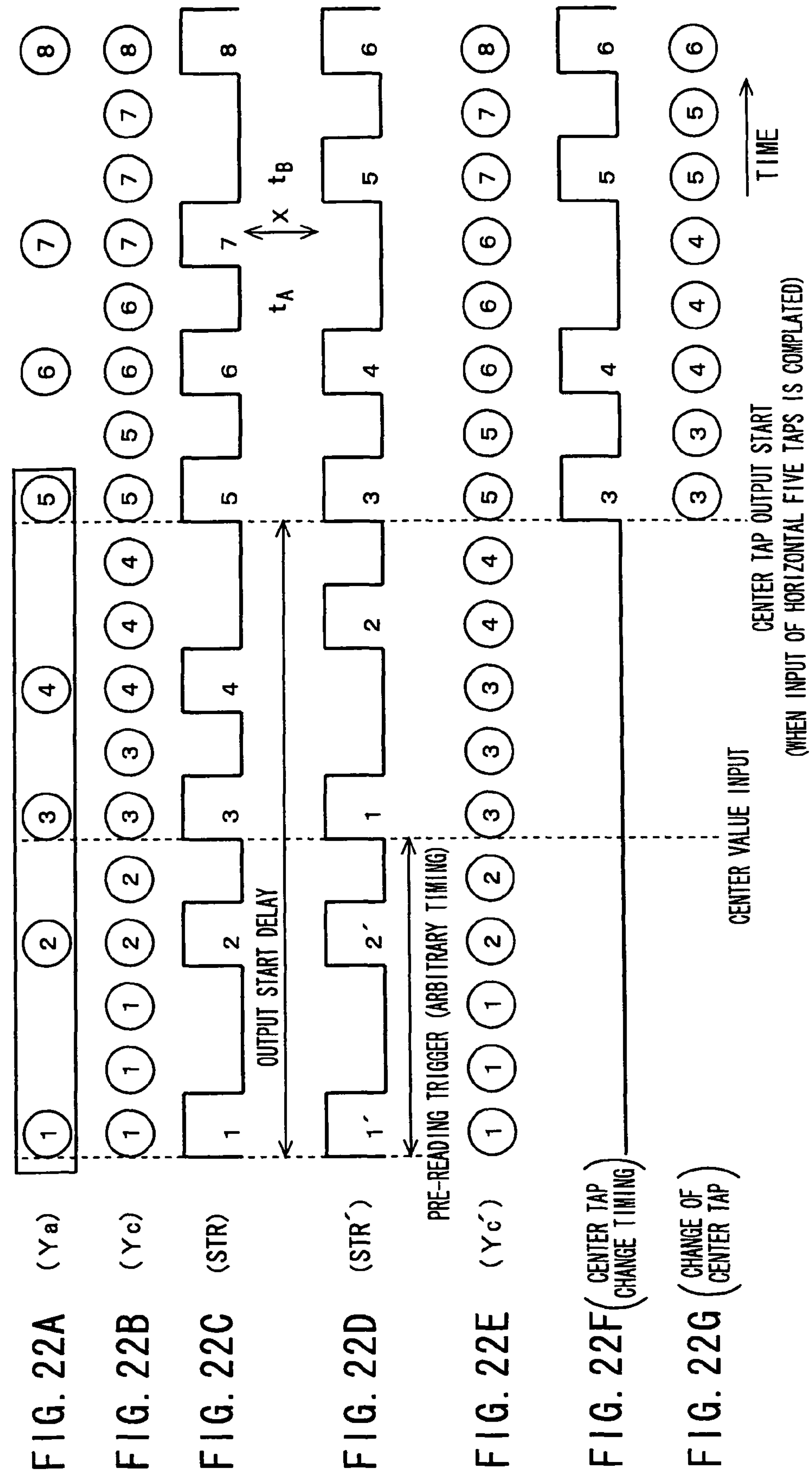
FIG. 22A (Ya)
FIG. 22B (Yc)
FIG. 22C (STR)
FIG. 22D (STR´)
FIG. 22E (Yc´)
FIG. 22F (CENTER TAP CHANGE TIMING)
FIG. 22G (CHANGE OF CENTER TAP)
OUTPUT START DELAY
PRE-READING TRIGGER (ARBITRARY TIMING)
CENTER VALUE INPUT
CENTER TAP OUTPUT START
(WHEN INPUT OF HORIZONTAL FIVE TAPS IS COMPLATED)
tA
X
tB
TIME FIG. 27A (HDi)
FIG. 27B (WRQ)
FIG. 27C (RRQ)
FIG. 27D (WFL)
FIG. 27E (WRITE CHANNEL COUNTER)
FIG. 27F (RFL)
FIG. 27G (READ CHANNEL COUNTER)
FIG. 27H (NUMBER OF HOLD)
FIG. 27I (CHANNEL COUNTER)
FIG. 27J (SDRAM BUS)

(Sa)

(SDRAM BUS)

150

500

MEMORY CONTROLLER, MEMORY CONTROL METHOD, RATE CONVERSION APPARATUS, RATE CONVERSION METHOD, IMAGE-SIGNAL-PROCESSING APPARATUS, IMAGE-SIGNAL-PROCESSING METHOD, AND PROGRAM FOR EXECUTING EACH OF THOSE METHODS

BACKGROUND OF THE INVENTION

1. Field of the Invention

The present invention relates to a memory controller, a memory control method, rate conversion apparatus, a rate conversion method, image-signal-processing apparatus, an image-signal-processing method and program for executing each of those methods.

More specifically, it relates to the memory controller and the like that are preferably applied when converting the number of pixels to another for a display.

2. Description of Related Art

As the flat panel display, liquid crystal display (LCD), plasma display (PDP) and the like have been well known. The fineness on the picture quality of these displays is determined depending on the quantities of pixels in the vertical and horizontal directions thereof. For example, there are standards such as XGA (768×1024 pixels), SXGA (1024×1280 pixels) and the like.

Further, as the image signal, 480i signal, 720p signal, 1080i signal and the like have been usually used. Here, these values indicate the number of lines, "i" indicates interlace type and "p" indicates progressive type. For example, the 480i signal has a resolution of 720×480 dots, the 720p signal has a resolution of 1024×720 dots and the 1080i signal has a resolution of 1920×1080 dots.

Conventionally, in the image display apparatus, the number of pixels has been converted to another in order to enable a part or all of input image signals to be displayed on its display. In this case, a rate conversion apparatus converts the quantities of pixels in the vertical and horizontal directions of the display.

The aforementioned rate conversion apparatus can be comprised of a first memory, for example, a frame memory, which is a burst transmission type large-capacity memory and a second memory, which is random access type dual port memory. In this apparatus, input image signals are stored in the first memory temporarily and the image signals are transferred from the first memory to the second memory successively in the unit of line and written therein. Then, the image signals are read out of the second memory at a pixel cycle and a line cycle of after-converted so as to obtain output image signals.

If such the transfer, however, is used, it is difficult to secure stable data transmission band between the first memory and the second memory. Such the transfer provides less use efficiency.

Further, in the rate conversion apparatus having the above configuration, write and read-out of the image signal to/of the first memory are carried out through the same data bus.

To secure stable data transmission band between the first memory and the second memory and raise the use efficiency in the rate conversion apparatus having the above configuration, it is conceivable that transmission of the image signals from the first memory to the second memory is carried out every specified time. In this case, the image signals are transferred from a write buffer to the first memory through the data bus based on a write request and written therein. The image signals are then transferred from the first memory to a read-out buffer through the data bus based on a read-out request every specified time. Finally, the image signals are transferred from this read-out buffer to the second memory.

This, however, depends on the write timing by the write request to perform the read-out based on an input of a read-out request every specified time.

Additionally, in the aforementioned rate conversion apparatus, for example, using a conversion objective pixel data string of the first image signal, a pixel data string of an effective pixel section in the horizontal direction of the second image signal is generated with keeping the same pixel data continuous at a rate corresponding to the magnification of the number of pixels.

For example, if an image-signal-processing unit for creating new pixel data corresponding to each pixel position of the effective pixel section in the horizontal direction of the second image signal is provided using a predetermined number of taps in the horizontal direction at a post stage of such the rate conversion apparatus, it is conceivable that this rate conversion apparatus builds up the predetermined number of the taps in the horizontal direction corresponding to each pixel position of the effective pixel section in the horizontal direction of the second image signal.

This, however, depends on the magnification of the number of pixels to obtain the predetermined number of the taps in the horizontal direction in the arrangement of the pixel data of the image signal (first image signal) before rate conversion. It is also depends on the magnification of the number of pixels that the output start delay until a predetermined number of the taps in the horizontal direction is outputted from a register since the pixel data string of an image signal after rate conversion is inputted to the shift register can be altered.

A first object of the present invention is to secure stable data transmission band between the first memory and the second memory and raise its use efficiency.

A second object of the present invention is to enable a read-out to be performed on the basis of an input of a read-out request every specified time without depending on the write timing by the write request.

A third object of the present invention is to obtain the predetermined number of the taps in the horizontal direction in the arrangement of the pixel data of the image signal (first image signal) before rate conversion without depending on the magnification of the number of pixels.

A fourth object of the present invention is that the output start delay until a predetermined number of the taps in the horizontal direction is outputted from the register since the pixel data string of an image signal after rate conversion is inputted to the shift register can be fixed at each line without depending upon the magnification of the number of pixels.

SUMMARY OF THE INVENTION

To achieve the objects of the present invention, according to a first aspect of the present invention, there is provided rate conversion apparatus. The apparatus comprises a first memory for storing an input image signal temporarily and a second memory for storing image signal transferred from the first memory successively in the unit of line and reading out the image signal at a pixel cycle and a line cycle of after-converted to obtain an output image signal. The apparatus also comprises a controller for controlling the write to and read-out of the first and the second memories. The controller controls transferring of the image signal from the first memory to the second memory to be performed every specified time.

According to a second aspect of the present invention, there is provided a rate conversion method. The method comprises the steps of storing an input image signal in a first memory temporarily and transferring image signal successively from the first memory to a second memory every specified time in the unit of line and writing the image signal therein. The method also comprises a step of reading out the image signal from the second memory at a pixel cycle and a line cycle of after-converted to obtain the output image signal.

The program concerning the present invention allows a computer to execute the above-described rate conversion method.

The recording medium concerning the present invention records the above program.

According to the present invention, the input image signals are stored in the first memory temporarily. Then, the second memory stores image signals transferred from the first memory successively in the unit of line. The second memory reads out the image signals at a pixel cycle and a line cycle of after-converted to obtain the output image signals. For example, the first memory is constituted of a burst transmission type frame memory and the second memory is constituted of a random access type dual port line memory.

The transfer of the image signals from the first memory to the second memory is carried out every specified time. A period for the transfer is a length of time obtained by dividing a single vertical effective period of the output image signal equally by the number of lines objective for conversion of the input image signal. The period for the transfer t is obtained according to an equation, $t=mo/mi/fo \times no$ wherein "fo" is a pixel frequency of the output image signal, "mi" is the number of lines objective for conversion of the input image signal, "mo" is the number of lines of a single vertical effective period of the output image signal, and "no" is the number of pixels per line of said output image signal.

For example, if there are plurality of the second memories, image signals each of a line are transferred from the first memory to the plurality of second memories for each period of the transfer in time division fashion through an identical data bus.

When reading the image signals out of the second memory in order to obtain pixels of a single horizontal period in the output image signals corresponding to a predetermined number of pixels in the horizontal direction of the input image signals, for example, a predetermined pixel determined based on a proportion of the number of pixels is read out repeatedly or thinned out. The predetermined number of pixels is equal to or fewer than the pixels of a single horizontal period.

When reading the image signals out of the second memory in order to obtain lines of a single vertical period in the output image signals corresponding to a predetermined number of lines in the vertical direction of the input image signals, for example, a predetermined line determined based on a proportion of lines is read out repeatedly or thinned out. The predetermined number of lines is equal to or fewer than the lines of a single vertical period.

As described above, according to the present invention, the input image signals are stored in the first memory temporarily and the image signals are transferred from the first memory to the second memory successively in the unit of line. Then, output image signals are obtained by reading the image signals out of this second memory at a pixel cycle and a line cycle of after-converted. Thus, the transfer of the image signals from the first memory to the second memory is carried out every specified time. This causes no deflection in the data transmission cycle to occur. Stable data transmission band can be secured between the first memory and the second memory, thereby raising its use efficiency. Therefore, the number of lines of image signals that can be transferred from the first memory to the second memory can be increased every data transmission cycle.

Unless the transfer of the image signal from the first memory to the second memory is carried out every specified time, the data transmission cycle becomes unstable, so that the data transmission band between the first memory and the second memory is stipulated by a higher cycle part in the data transmission cycle, thereby preventing the use efficiency from being raised.

For example, the controller comprises a write buffer for storing an image signal temporarily to write it into the first memory and a read buffer for storing an image signal read out from the first memory temporarily. The controller also comprises a write-address-generating unit for generating a write address of the first memory and a read-address-generating unit for generating a read-out address of the first memory. The controller further comprises a write/read-out control unit for controlling the write buffer, the read buffer, the write-address-generating unit, and the read-address-generating unit based on a write request supplied each time when the image signal of a line is stored in the write buffer and a read-out request supplied the every specified time, The write/read-out control unit gives a precedence to a control of transferring the image signal from the write buffer to the first memory through the data bus based on the write request and storing the image signal therein over a control of transferring the image signal from the first memory to the read buffer through the data bus based on the read-out request and storing the image signal therein. This causes the image signal to be read out of the first memory without being affected by the rate of the input image signal.

According to a third aspect of the present invention, there is provided an image-signal-processing apparatus for converting a first image signal composed of multiple items of pixel data to a second image signal composed of multiple items of pixel data. The image-signal-processing apparatus comprises a rate converter for obtaining a third image signal having pixel data corresponding to the pixel data constituting the second image signal based on the first image signal and a phase information generator for generating phase information of a target position in the second image signal. The image-signal-processing apparatus also comprises a pixel data generator for generating pixel data of the target position in the second image signal using the third image signal based on the phase information generated by the phase information generator.

The rate converter comprises a first memory for storing the first image signal temporarily and a second memory for storing the first image signal transferred from the first memory successively in the unit of line and reading out the first image signal at a pixel cycle and a line cycle of after-converted to obtain the third image signal. The rate converter also comprises a controller for controlling the write to and read-out of the first memory and the second memory. The controller controls transferring of the image signal from the first memory to the second memory to be performed every predetermined time.

According to a fourth aspect of the present invention, there is provided an image-signal-conversion method for converting the first image signal composed of multiple items of pixel data to the second image signal composed of multiple items of pixel data. The conversion method comprises a rate conversion step of obtaining a third image signal having pixel data corresponding to the pixel data constituting the second image signal based on the first image signal. The conversion method also comprises a phase-information-generating step of generating phase information of a target position in the second image signal. The conversion method further comprises a pixel-data-generating step of generating pixel data of the target position in the second image signal using the third image signal based on the phase information generated by the phase-information-generating step. In the rate converting step, the first image signal is temporarily stored in a first memory. The first image signal is transferred from the first memory to the second memory successively in the unit of line every specified time and written in the second memory. The first image signal is then read out of the second memory at a pixel cycle and a line cycle of after-converted to obtain the third image signal.

The program therefor according to the invention allows a computer to execute the above-described image-signal-conversion method.

The recording medium concerning the present invention records the above program.

According to the present invention, the number of pixels of the first image signal is converted so as to obtain the third image signal having pixel data corresponding to the pixel data constituting the second image signal. Further, the phase information of a target position in the second image signal is generated. Then, the pixel data of the target position in the second image signal is generated using the third image signal based on this phase information.

The generation of this pixel data is carried out using, for example, an estimation equation. That is, coefficient data for use in the estimation equation corresponding to the phase information is generated. Multiple items of pixel data located around the target position in the second image signal are extracted based on the third image signal. The pixel data of the target position in the second image signal is computed based on the estimation equation using these coefficient data and the multiple items of pixel data.

The pixel data generated using such the estimation equation, as the pixel data of the target position in the second image signal, may have a higher accuracy than the one obtained according to linear interpolation or the like if using the coefficient data obtained through learning processing which uses a teacher signal corresponding to the second image signal and a student signal corresponding to the first image signal.

According to the invention, when converting the rate with the rate converter, the transfer of image signals from the first memory to the second memory is carried out every specified time. Because a period of the data transfer has no deflection, stable data transmission band between the first memory and the second memory can be secured, thereby raising its use efficiency. Thus, the number of lines of the image signals transferred from the first memory to the second memory every period of the data transfer can be increased so that the pixel data generator can generate the pixel data of the target position in the second image signal at a higher accuracy using far more lines.

According to a fifth aspect of the present invention, there is provided a memory controller for controlling a memory to which the write to and read-out of image signals is performed through identical data bus. The memory controller comprises a write buffer for storing an input image signal temporarily to write it into the memory and a read buffer for storing an output image signal read out of the memory temporarily. The memory controller also comprises a write-address-generating unit for generating a write address of the memory and a read-address-generating unit for generating a read-out address of the memory. The memory controller further comprises a control unit for controlling the write buffer, the read buffer, the write-address-generating unit, and the read-address-generating unit based on a write request supplied each time when a predetermined amount of the input image signals is stored in the write buffer and a read-out request supplied every specified time. The control unit gives a precedence to any one of a first control of transferring the input image signal from the write buffer to the memory through a data bus based on the write request and storing the input image signal therein and a second control of transferring the output image signal from the memory to the read buffer through the data bus based on the read-out request and storing the output image signal therein over the other.

According to a sixth aspect of the present invention, there is provided a memory control method. The memory control method comprises a first control step of, based on a write request supplied each time when a predetermined amount of image signals is stored in the write buffer, transferring the image signal from the write buffer to a memory through a data bus and writing it therein. The method also comprises a second control step of, based on the read-out request supplied every specified time, transferring the image signal from the memory to the read buffer through the data bus and writing it therein. In the method, any one of the first control step based on the write request and the second control based on the read-out request is executed with a precedence over the other.

The program pertinent to the present invention allows a computer to execute the above-described memory control method.

The recording medium concerning the present invention records the above program.

According to the present invention, the input image signals are transferred from the write buffer to the memory through the data bus and written therein based on the write request supplied each time when a predetermined amount of the image signals is stored in the write buffer. Further, the output image signals are transferred from the memory to the read buffer through the data bus and written therein based on a read-out request supplied every specified time.

For example, the memory comprises a burst transmission type frame memory such as SDRAM. If this memory is a SDRAM, refresh is carried out, for example, in the vertical blanking period. For example, n (n is an integer) image signals of a single horizontal period are written into the memory corresponding to one of the write requests and m (m is an integer while m>n) image signals of a horizontal period are read out of the memory corresponding to one of the read-out requests.

In this case, any one of a write control (first control) based on the write request and a read-out control (second control) based on the read-out request has a precedence over the other. This allows adjustment on the write to and read-out executed through the same data bus to be carried out excellently, thereby enabling the output image signals to be read based on an input of a read-out request every specified time without depending on the write timing of the write request.

For example, the write control based on the write request is given a precedence over the read-out control based on the read-out request. For example, when the write request and the read-out request are supplied at the same time, the write is executed into the memory based on the write request and the read-out request is held. After the write ends, the read-out from the memory is executed based on the held read-out request.

If a read-out request is supplied during a write into the memory, this read-out request is held and after the write ends, a read-out from the memory is executed based on this held read-out request. Further, if a write request is supplied during a read-out from the memory, the read-out is stopped temporarily and the write into the memory is executed based on the write request. After the write ends, the remainder of the stopped reading is read out.

Because the write control based on the write request is given a precedence over the read-out control based on the read-out request, there can be generated a waiting time for read-out based on the read-out request. For example, if “n” image signals of a single horizontal period are written into the memory corresponding to a single write request while “m” (m>n) image signals of a single horizontal period are read out corresponding to a single read-out request, the maximum waiting time becomes a period for processing “n” image signals, which is shorter than the maximum value (equivalent to m) of the waiting time for write based on a write request in case where the read-out control based on the read-out request is given a precedence over the write control based on the write request.

According to a seventh aspect of the present invention, there is provided another rate conversion apparatus. The rate conversion apparatus comprises a first memory for storing an input image signal temporarily and a second memory for storing image signal transferred from the first memory successively in the unit of line and reading out the input image signal at a pixel cycle and a line cycle of after-converted to obtain an output image signal. The apparatus also comprises a controller for controlling the write to and read-out of the first memory and the second memory.

The controller comprises a write buffer for storing the input image signal temporarily to write the input image signal into the first memory and a read buffer for storing the output image signal read out from the first memory temporarily. The controller also comprises a write-address-generating unit for generating a write address of the first memory and a read-address-generating unit for generating a read-out address of the first memory. The controller further comprises a write/read-out control unit for controlling the write buffer, the read buffer, the write-address-generating unit, and the read-address-generating unit based on the write request supplied each time when a predetermined amount of the input image signal is stored in the write buffer and a read-out request supplied every specified time. The write/read-out control unit gives a precedence to any one of a first control of transferring the input image signal from the write buffer to the first memory through the data bus based on the write request and writing the input image signal therein and a second control of transferring the output image signal from the first memory to the read-out buffer through the data bus based on the read-out request and writing the output image signal therein over the other.

According to an eighth aspect of the present invention, there is provided another image-signal-processing apparatus for converting a first image signal composed of multiple items of pixel data to a second image signal composed of multiple items of pixel data. The apparatus comprises a rate converter for obtaining a third image signal having pixel data corresponding to the pixel data constituting the second image signal based on the first image signal and a phase information generator for generating phase information of a target position in the second image signal. The apparatus also comprises a pixel data generator for generating pixel data of the target position in the second image signal using the third image signal based on the phase information generated by the phase information generator. The rate converter comprises a first memory for storing the first image signal temporarily and a second memory for storing the first image signal transferred from the first memory successively in the unit of line and reading out the first image signal at a pixel cycle and a line cycle of after-converted to obtain the third image signal. The rate converter also comprises a controller for controlling the write and read-out of the first memory and the second memory.

The controller comprises a write buffer for storing the first image signal temporarily to write it into the first memory and a read buffer for storing the first image signal read out from the first memory temporarily. The controller also comprises a write-address-generating unit for generating a write address of the first memory and a read-address-generating unit for generating a read-out address of the first memory. The controller further comprises a write/read-out control unit for controlling the write buffer, the read buffer, the write-address-generating unit, and the read-address-generating unit based on the write request supplied each time when a predetermined amount of the first image signal is stored in the write buffer and a read-out request supplied every specified time. The write/read-out control unit gives a precedence to any one of a first control of transferring the first image signal from the write buffer to the first memory through a data bus based on the write request and storing the first image signal therein and a second control of transferring the first image signal from the first memory to the read buffer through the data bus based on the read-out request and storing the first image signal therein over the other.

According to the present invention, the number of pixels of the first image signal is converted and as a result, the third image signal having the pixel data corresponding to the pixel data constituting the second image signal is obtained. Further, the phase information of a target position in the second image signal is generated. Then, the pixel data of the target position in the second image signal is generated using the third image signal based on this phase information.

The generation of this pixel data is also carried out using, for example, the estimation equation. That is, coefficient data for use in the estimation equation corresponding to the phase information is generated. Multiple items of pixel data located around the target position in the second image signal are extracted based on the third image signal. Then, by using the coefficient data and the multiple items of pixel data, the pixel data of the target position in the second image signal is computed based on the estimation equation.

The pixel data generated using such the estimation equation, as the pixel data of the target position in the second image signal, may have a higher accuracy than the one obtained according to linear interpolation or the like when using the coefficient data obtained through learning processing which uses a teacher signal corresponding to the second image signal and a student signal corresponding to the first image signal.

According to the invention, when converting the rate with the rate converter, the transfer of image signals from the first memory to the second memory is carried out every specified time. Thus, a period of the data transfer has no deflection so that stable data transmission band between the first memory and the second memory can be secured, thereby raising its use efficiency. This allows the number of lines of the image signal which can be transferred from the first memory to the second memory every period of the data transfer to be increased. The pixel data generator can generate the pixel data of the target position in the second image signal at a higher accuracy by using far more lines.

Further, the image signals are transferred from the write buffer to the first memory through the data bus based on a write request supplied each time when a predetermined amount of the image signals are stored in the write buffer and written therein. Further, the image signals are transferred from the first memory to the read buffer through the data bus based on the read-out request supplied every specified time and written therein.

In this case, any one of a write control (first control) based on the write request and a read-out control (second control) based on the read-out request has a precedence over the other. This allows adjustment on the write and read-out executed through the same data bus to be carried out excellently, thereby enabling the image signals to read based on an input of a read-out request every specified time without depending on the write timing of the write request.

According to a ninth aspect of the present invention, there is provided further rate conversion apparatus. The rate conversion apparatus comprises a rate converter for generating a proper pixel data string of an effective pixel section in a horizontal direction of a second image signal using a part or all conversion objective pixel data string in the effective pixel section in a horizontal direction of a first image signal with identical pixel data being continuous at a rate corresponding to a magnification of the number of pixels and further, for obtaining a modified pixel data string by modifying the proper pixel data string. The apparatus also comprises a shift trigger generator for generating a shift trigger corresponding to a change position of the pixel data in the modified pixel data string obtained in the rate converter. The apparatus further comprises a tap building portion having a shift register composed of the same number of registers as that of taps in the horizontal direction to be built, for taking pixel data of the change position of the modified pixel data string obtained by the rate converter into the shift register using the shift trigger generated by the shift trigger generator and for building a predetermined number of taps in the horizontal direction corresponding to each pixel position of the effective pixel section in the horizontal direction of the second image signal. The modified pixel data string obtained by the rate converter is obtained by modifying the change position of the pixel data in the proper pixel data string so that the change of a center tap of a predetermined number of the taps in the horizontal direction built by the tap building portion coincides with arrangement of the proper pixel data string generated by the rate converter.

According to a tenth aspect of the present invention, there is provided further rate conversion method. The rate conversion method comprises a rate conversion step of generating a proper pixel data string of an effective pixel section in a horizontal direction of a second image signal using at least a part of conversion objective pixel data string in the effective pixel section in a horizontal direction of a first image signal with identical pixel data being continuous at a rate corresponding to a magnification of the number of pixels and modifying the proper pixel data string so as to obtain a modified pixel data string. The method also comprises a shift trigger generating step of generating a shift trigger corresponding to a change position of the pixel data in the modified pixel data string obtained by the rate conversion step. The method further comprises a tap building step of taking pixel data of the change position of the modified pixel data string obtained by the rate conversion step into a shift register constituted of the same number of registers as that of taps in the horizontal direction to be built using the shift trigger generated in the shift trigger generating step and building a predetermined number of the taps in the horizontal direction corresponding to each pixel position of the effective pixel section in the horizontal direction of the second image signal. The modified pixel data string obtained by the rate conversion step is obtained by modifying the change position of the pixel data in the proper pixel data string so that the change of a center tap of a predetermined number of the taps in the horizontal direction built by the tap building step coincides with arrangement of the proper pixel data string generated by the rate conversion step.

The program pertinent to the present invention allows a computer to execute the above-described rate conversion method.

The recording medium concerning the present invention records the above program.

According to the present invention, the proper pixel data string of the effective pixel section in the horizontal direction of the second image signal is generated from a part or all of the conversion objective pixel data string of the effective pixel section in the horizontal direction of the first image signal. In this case, the number of the pixels is increased by keeping the identical pixel data of the conversion objective pixel data string continuous at a rate corresponding to the magnification of the number of the pixels.

The proper pixel data string generated in this way is not supplied to the shift register as it is, but the modified pixel data string obtained by modifying this proper pixel data string is supplied to the shift register. Further, this shift register is supplied with a shift trigger corresponding to the change position of the pixel data in the modified pixel data string.

This shift register is constituted of the same number of registers as that of the taps in the horizontal direction to be built up. The pixel data of the change position of the modified pixel data string is taken into this shift register successively by the shift trigger. This allows a predetermined number of the taps in the horizontal direction to be obtained by the shift register corresponding to each pixel position of the effective pixel section in the second image signal.

In this case, the modified pixel data string is obtained by modifying the change position of the pixel data in the proper pixel data string so that a change of the center tap coincides with the arrangement of the proper pixel data string. As a result, the change of the center tap coincides with the arrangement of the proper pixel data string, thereby obtaining a predetermined number of the taps in the horizontal direction in the arrangement of the pixel data in the image signal (first image signal) before rate conversion without depending upon the magnification of the number of pixels.

When the shift register is provided with "no" registers on an output side thereof and "ni" registers on an input side thereof with respect to a register for outputting the center tap, the modified pixel data string is regarded as a result of changing the first (no+ni) pixel data continuously. Consequently, the first continuously changed (no+ni) items of the pixel data are taken into the shift register at each line. Thus, the output start delay until a predetermined number of the taps in the horizontal direction is outputted from that given register since the pixel data string of an image signal after rate conversion is inputted to the shift register can be fixed to (no+ni) clock time at each line without depending upon the magnification of the number of pixels.

According to an eleventh aspect of the present invention, there is provided further image-signal-processing apparatus for converting a first image signal composed of multiple items of pixel data to a second image signal composed of multiple items of pixel data. The apparatus comprises a rate converter for obtaining a third image signal having pixel data corresponding to the pixel data constituting the second image signal based on the first image signal and a phase information generator for generating phase information of a target position in the second image signal relative to a pixel position of the first image signal. The apparatus also comprises a pixel data generator for generating pixel data of the target position in the second image signal using the third image signal obtained by the rate converter based on the phase information generated by the phase information generator.

The rate converter comprises a rate conversion unit for generating a proper pixel data string of an effective pixel section in a horizontal direction in the third image signal using a part or all conversion objective pixel data string in the effective pixel section in a horizontal direction of a first image signal with identical pixel data being continuous at a rate corresponding to a magnification of the number of pixels and further, for obtaining a modified pixel data string by modifying the proper pixel data string. The rate converter also comprises a shift trigger generating unit for generating a shift trigger corresponding to a change position of the pixel data in the modified pixel data string obtained in the rate conversion unit. The rate converter further comprises a tap building portion having a shift register composed of the same number of registers as that of taps in the horizontal direction to be built, for taking pixel data of the change position of the modified pixel data string obtained by the rate conversion unit into the shift register using the shift trigger generated by the shift trigger generating unit and for building a predetermined number of taps in the horizontal direction corresponding to each pixel position of the effective pixel section in the horizontal direction of the third image signal.

The modified pixel data string obtained by the rate conversion unit is obtained by modifying the change position of the pixel data in the proper pixel data string so that the change of a center tap of the taps of a predetermined number of the taps in the horizontal direction built by the tap building unit coincides with arrangement of the proper pixel data string generated by the rate conversion unit.

According to the present invention, the third image signal having the pixel data corresponding to the one constituting the second image signal is obtained by converting the number of pixels of the first image signal.

In this case, the proper pixel data string of the effective pixel section in the horizontal direction in the third image signal is generated from the conversion objective pixel data string of a part or all of the effective pixel section in the horizontal direction in the first image signal. The number of pixels can be increased by keeping the same pixel data of the conversion objective pixel data string continuous at a rate corresponding to the magnification of the number of the pixels.

The proper pixel data string generated in this way is not supplied to the shift register as it is, but the modified pixel data string obtained by modifying this proper pixel data string is supplied to the shift register. Further, this shift register is supplied with the shift trigger corresponding to the change position of the pixel data in the modified pixel data string.

This shift register is constituted of the same number of registers as that of the taps in the horizontal direction to be built up. The pixel data of the change position of the modified pixel data string is taken into this shift register successively by the shift trigger. This allows a predetermined number of the taps in the horizontal direction to be obtained by the shift register corresponding to each pixel of the effective pixel section in the third image signal.

In this case, the modified pixel data string is obtained by modifying the change position of the pixel data in the proper pixel data string so that a change of the center tap coincides with the arrangement of the proper pixel data string. As a result, the change of the center tap coincides with the arrangement of the proper pixel data string, thereby obtaining a predetermined number of the taps in the horizontal direction to be obtained in the arrangement of the pixel data in the image signal (first image signal) before rate conversion without depending upon the magnification of the number of pixels.

When the shift register is provided with "no" registers on an output side and "ni" registers on an input side with respect to the register for outputting the center tap, the modified pixel data string is regarded as a result of changing the first (no+ni) pixel data continuously. Consequently, the first continuously changed (no+ni) items of pixel data are taken into the shift register at each line. Thus, the output start delay until a predetermined number of the taps in the horizontal direction is outputted from that given register since the pixel data string of an image signal after rate conversion is inputted to the shift register can be fixed to (no+ni) clock time at each line without depending upon the magnification of the number of pixels.

Phase information of the target position in the second image signal is generated relative to the pixel position of the first image signal. Based on this phase information, the pixel data of the target position of the second image signal is generated using the above-described third image signal.

The generation of this pixel data is also carried out using, for example, an estimation equation. That is, coefficient data for use in the estimation equation corresponding to the phase information is generated. Multiple items of pixel data located around the target position in the second image signal are extracted based on the third image signal. The pixel data of the target position in the second image signal are then computed based on the estimation equation using the coefficient data and the multiple items of pixel data.

The pixel data generated using such the estimation equation, as the pixel data of the target position in the second image signal, may have a higher accuracy than the one obtained according to linear interpolation or the like when using the coefficient data obtained through learning processing which uses a teacher signal corresponding to the second image signal and a student signal corresponding to the first image signal.

Thus, a predetermined number of the taps in the horizontal direction obtained corresponding to each pixel position of the effective pixel section in the third image signal is obtained in the arrangement of the pixel data in the image signal (first image signal) before rate conversion without depending upon the magnification of the number of pixels. Even if the magnification of the number of pixels changes, a correspondence relationship between the predetermined number of the taps in the horizontal direction and the phase information never collapses, so that the pixel data of the target position in the second image signal can be obtained excellently.

As described above, the output start delay until a predetermined number of the taps in the horizontal direction is outputted from that given register since the pixel data string of an image signal after rate conversion is inputted to the shift register can be fixed to (no+ni) clock time at each line without depending upon the magnification of the number of pixels. Thus, it is not necessary to provide with any variable delay circuit capable of changing the delay time depending on the magnification of the number of pixels for time adjustment between the predetermined number of the taps in the horizontal direction and, for example, the phase information.

The concluding unit of this specification particularly points out and directly claims the subject matter of the present invention. However, those skill in the art will best understand both the organization and method of operation of the invention, together with further advantages and objects thereof, by reading the remaining units of the specification in view of the accompanying drawing(s) wherein like reference characters refer to like elements.

BRIEF DESCRIPTION OF THE DRAWINGS

FIG. 2A is a diagram for illustrating numbers of lines and the number of horizontal pixels of a 480i signal;

FIG. 2B is a diagram for illustrating numbers of lines and the number of horizontal pixels of a 1080i signal;

FIG. 4 is a diagram for illustrating rate conversion;

FIGS. 11A-F are timing charts on pixel quantity conversion in the horizontal direction of the luminance signal;

FIGS. 12A-G are timing charts on pixel quantity conversion in the horizontal direction of the color-difference signal;

FIGS. 13A-F are timing charts of line number conversion in the vertical direction;

FIGS. 20A-C are diagrams for illustrating changes of the shift register condition and changes of the center tap in an operation example of FIG. 19;

FIGS. 21A-C are diagrams for illustrating changes of the shift register condition and changes of the center tap in case where the number of registers which constitute the shift register is increased by one;

FIGS. 22A-G are diagrams showing an example of the operation (pixel quantity conversion at an arbitrary magnification) of tap building in case where a pre-reading trigger is provided to allow the change of the center tap to be made corresponding to arrangement of the intensity data in the luminance signal Yc after conversion;

DETAILED DESCRIPTION OF THE PREFERRED EMBODIMENTS

Figure 1:
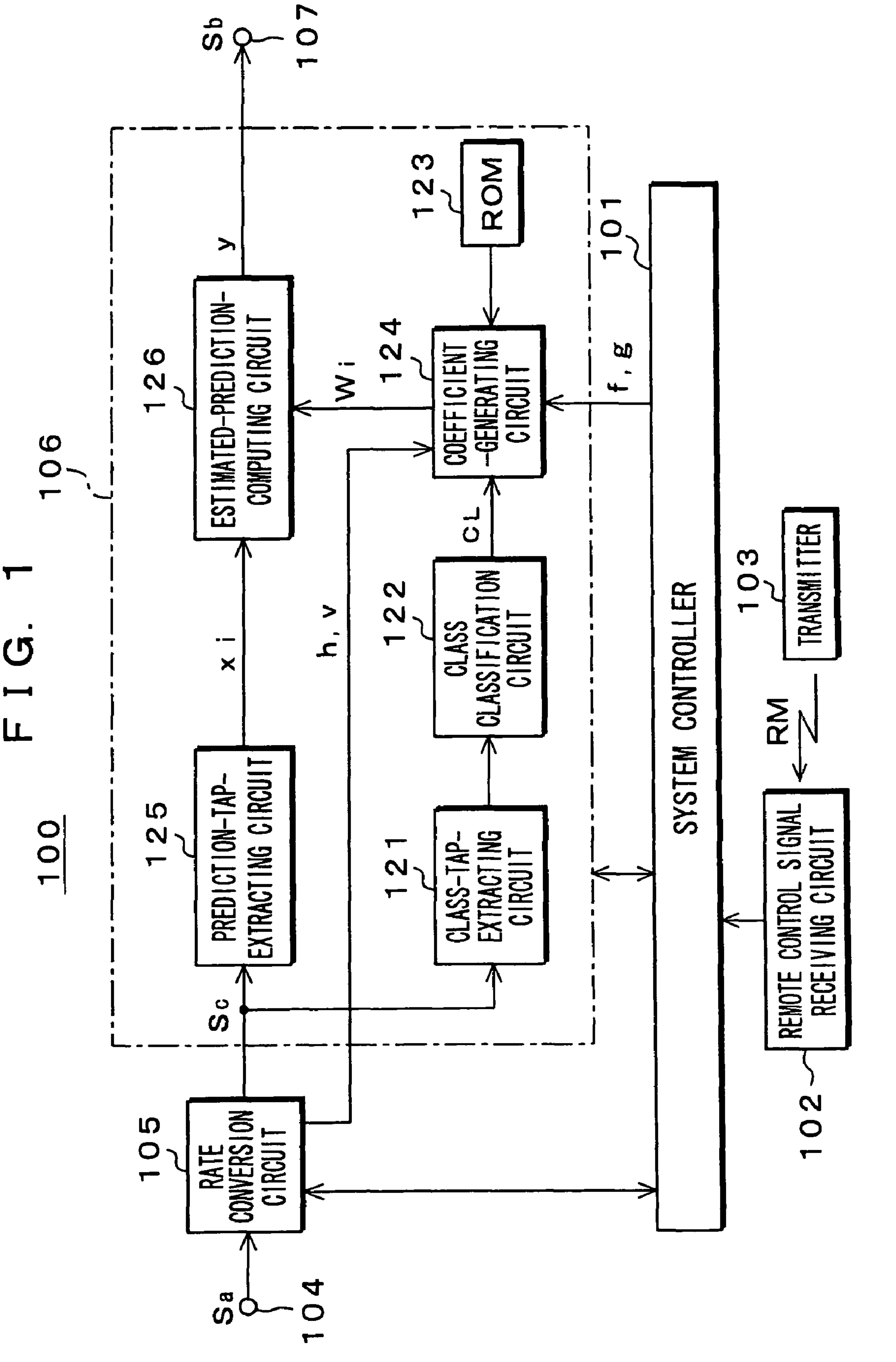
FIG. 1 is a block diagram showing a configuration of an embodiment of the image-signal-processing apparatus according to the invention.

Hereinafter, the preferred embodiments of the present invention will be described with reference to the accompanying drawings. FIG. 1 shows a configuration of an embodiment of the image-signal-processing apparatus 100 according to the invention. This image signal processing apparatus 100 converts an input image signal Sa to an output image signal Sb. Although the following description is carried out assuming that the image signal Sa is 480i signal and the image signal Sb is 1080i signal for convenience for the explanation, the present invention is not restricted to this example. The 480i signal is an interlace type image signal in which the number of scanning lines is 525, the number of effective scanning lines is 480, the number of effective pixels is lateral×longitudinal=720×480 and the sampling frequency is 13.5 MHz (see FIG. 2A). The 1080i signal is an interlace type image signal in which the number of scanning lines is 1125, the number of effective scanning lines is 1080, the number of effective pixels is lateral×longitudinal=1920×1080 and the sampling frequency is 74.25 MHz (see FIG. 2B).

The image signal processing apparatus 100 includes a microcomputer, which comprises a system controller 101 for controlling the operation of its entire system and a remote control signal receiving circuit 102 for receiving a remote control signal. The remote control signal receiving circuit 102 is connected to the system controller 101 and receives a remote control signal RM outputted by a remote control signal transmitter 103 corresponding to user's operation to supply an operation signal corresponding to that signal RM to the system controller 101.

The image signal processing apparatus 100 comprises an input terminal 104 to which an image signal Sa is to be inputted and a rate conversion circuit 105 which possesses pixel data corresponding to pixel data constituting the image signal Sb based on the image signal Sa inputted to this input terminal 104 so as to obtain an image signal Sc as the 1080i signal.

Further, the image signal processing apparatus 100 comprises an image signal processing unit 106 which generates the image signal Sb based on the image signal Sc obtained through the rate conversion circuit 105 and outputs and an output terminal 107 for outputting an image signal obtained by this image signal processing unit 106.

The image signal processing apparatus 100 shown in FIG. 1 will be described. The image signal Sa, which is the 480i signal, is supplied to the input terminal 104 and this image signal Sa is supplied to the rate conversion circuit 105. This rate conversion circuit 105 converts the quantities of horizontal and vertical pixels of the image signal Sa so as to generate the image signal Sc, which is the 1080i signal.

According to this embodiment, normal mode and zoom mode are selectable by user's operation of the remote control signal transmitter 103. Under the normal mode, all the effective pixel sections of the image signal Sa are objectives for rate conversion so as to generate the image signal Sc. In case of the zoom mode, the objective for conversion within the effective pixel section of the image signal Sa change corresponding to the magnification rate specified by user, so that the image signal Sc corresponding to the magnification rate of this image is generated. In this case, as the magnification rate of the image increases, the objective for conversion within the effective pixel section of the image signal Sa narrows.

The image signal Sc obtained by the rate conversion circuit 105 is supplied to the image-signal-processing unit 106. This image-signal-processing unit 106 generates the image signal Sb based on the image signal Sc. This image signal Sb is introduced to the output terminal 107. The aforementioned rate conversion circuit 105 reads out a predetermined pixel repeatedly and by reading out a predetermined line repeatedly, horizontal and vertical pixels are converted. Corresponding to each of the items of the pixel data constituting the image signal Sc, this image-signal-processing unit 106 computes each pixel data constituting the image signal Sb using coefficient data corresponding to the pixel data phase information and multiple items of pixel data located around that pixel data according to an estimation equation.

The user may adjust the image resolution and noise removal level with the image signal Sb by his or her operation of the remote control signal transmitter 103. In the image-signal-processing unit 106, as described above, each pixel data constituting the image signal Sb is computed according to the estimation equation. As the coefficient data of this estimation equation, data generated according to a generation equation containing a parameter f, which specifies the resolution, and a parameter g, which specifies the noise removal level, is used. The parameters f, g are adjusted by user's operation of the remote control signal transmitter 103. Consequently, the image resolution and noise removal level with the image signal Sb generated by the image-signal-processing unit 106 comes to correspond to the adjusted parameters f, g.

Figure 3:
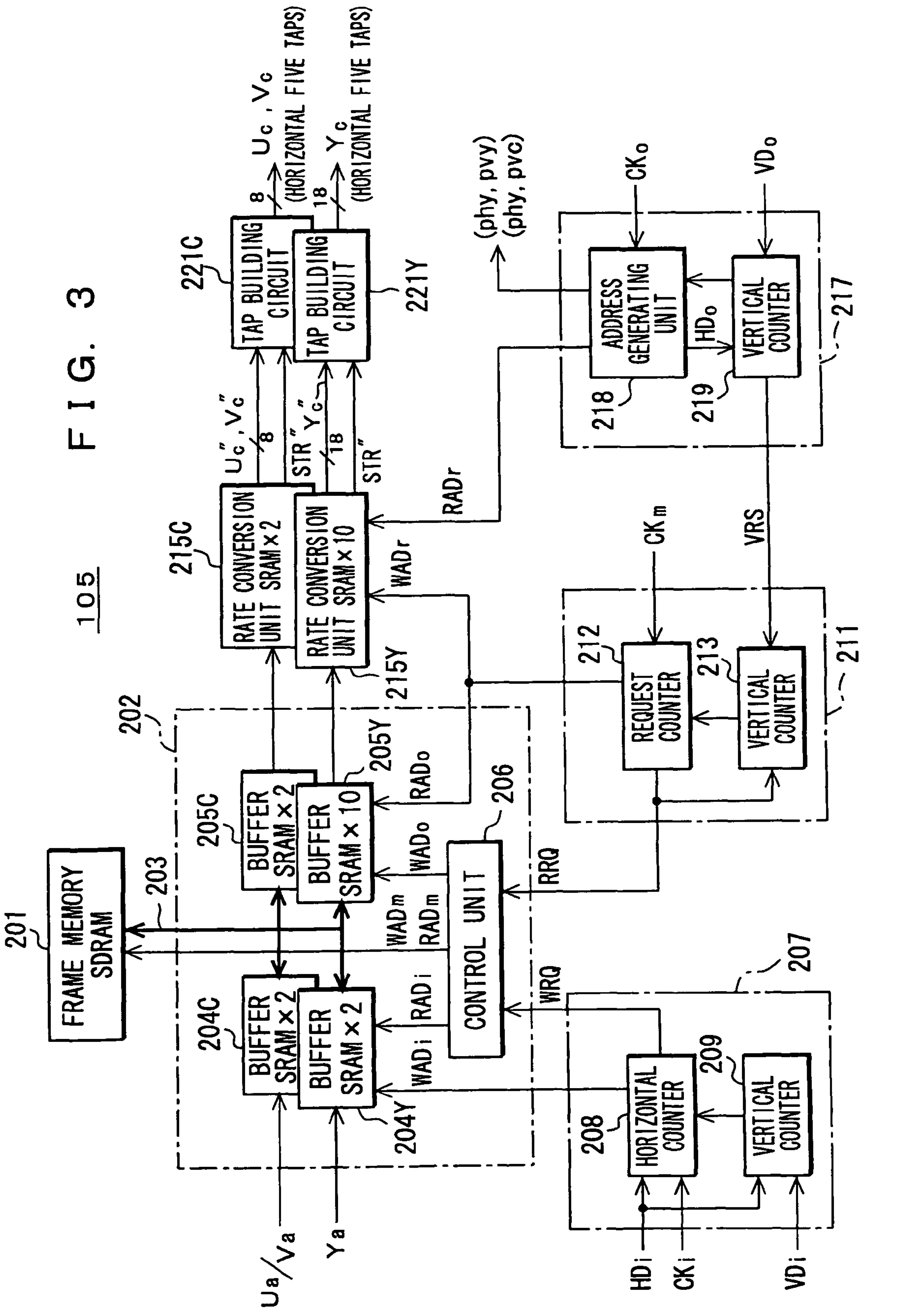
FIG. 3 is a block diagram showing a configuration of a rate conversion circuit.

Next, the rate conversion circuit 105 will be described in detail. FIG. 3 shows a configuration of the rate conversion circuit 105.

This rate conversion circuit 105 has a frame memory 201 as a first memory for storing an input image signal temporarily. This frame memory 201 is constituted of a burst transmission type large capacity memory. As the burst transmission type large capacity memory, synchronous dynamic RAM (SDRAM), a flash memory and the like are available. According to this embodiment, the frame memory 201 is constituted of the SDRAM. This frame memory 201 contains memory capacity for a plurality of fields.

The rate conversion circuit 105 possesses a SDRAM controller 202 for controlling write and read-out of the frame memory (SDRAM) 201. This SDRAM controller 202 is connected to the frame memory 201 through the SDRAM bus (data bus) 203 or the like.

This SDRAM controller 202 possesses buffers 204Y, 204C as a write buffer. These buffers 204Y, 204C are connected to the SDRAM bus 203. These buffers 204Y, 204C store luminance signal Ya and color-difference signal Ua/Va that constitute the image signal Sa (see FIG. 1) as the input image signal temporarily.

Here, the color-difference signal Ua/Va is dot sequential signal composed of a blue color-difference signal Ua and a red color-difference signal Va. That is, the sampling rate of the luminance signal Ya is 13.5 MHz while the sampling rate of the color-difference signals Ua, Va are 13.5/2 MHz. The buffers 204Y, 204C are constituted of static RAMs (SRAM) for two lines, respectively. The reason why the SRAMs for two lines are used is as follows.

That is, the write side buffers need to receive the input image signal Sa continuously. If the SDRAM bus 203 is occupied by data under the read-out operation, all the content of the buffer cannot be sent to the frame memory 201. Thus, if the buffers 204Y, 204C are constituted of a SRAM for a single line, there occurs a time contradiction. For the reason, according to this embodiment, the buffers 204Y, 204C are constituted of the SRAMs for two lines and if the SDRAM bus 203 is occupied by data under the read-out operation, sending of the content of the buffer to the frame memory 201 can be on standby so as to avoid a generation of the time contradiction.

Synchronously with the input clock CKi of 13.5 MHz, the luminance signal Ya and the color-difference signal Ua/Va are written successively into these buffers 204Y, 204C. In this case, only the effective pixel sections thereof are written, so that each line (720 pixels) is subjected to write in a period of 720 clocks in terms of the input clock CKi.

The luminance signal Ya and the color-difference signals Ua/Va of each line written into these buffers 204Y, 204C are read out in time-division fashion synchronous with the memory clock CKm of 108 MHz and written into the frame memory 201. In this case, 8-bit data is converted to 32-bit data and transmitted. That is, four pixels are processed in parallel and each line (720 pixels) is sent from the buffers 204Y, 204C to the frame memory 201 in a period of 180 clocks in terms of the memory clock CKm and written therein.

Further, the SDRAM controller 202 is provided with buffers 205Y, 205C as a read buffer. These buffers 205Y, 205C store the image signals read out from the frame memory 201, that is, the luminance signal and color-difference signal temporarily. These buffers 205Y, 205C are connected to the SDRAM bus 203.

The buffer 205Y is constituted of SRAMs for 10 lines. The reason why the SRAM for 10 lines is used is that the luminance signal Ya read out from the frame memory 201 corresponding to a single request RRQ described later is for 10 lines. Further, the buffer 205C is constituted of the SRAMs for two lines. The reason why the SRAM for two lines is used is that the color-difference signal Ua/Va read out from the frame memory 201 corresponding to a single read-out request RRQ described later is for two lines.

The luminance signal Ya and the color-difference signal Ua/Va for each line written into the frame memory 201 are read out synchronously with a memory clock CKm of 108 MHz and written into the buffers 205Y, 205C. In this case, four pixels are processed in parallel, so that each line (720 pixels) is sent out from the frame memory 201 to the buffers 205Y, 205C in a period of 180 clocks in terms of the memory clock CKm and written therein.

In this case, the luminance signal Ya for each line to be written into each of the SRAMs for 10 lines constituting the buffer 205Y and the color-difference signal Ua/Va for each line to be written into each of the SRAMs for two lines constituting the buffer 205C are transferred in time division fashion from the frame memory 201 through the SDRAM bus 203.

Further, the SDRAM controller 202 possesses a control unit 206. Corresponding to a write request WRQ supplied from an input timing generator (input TG) 207 described later, this control unit 206 generates a read address RADi to be supplied to the buffers 204Y, 204C and a write address WADm to be supplied to the frame memory 201. Further, this control unit 206, corresponding to a read request RRQ supplied from a memory timing generator (memory TG) 211 described later, generates a read address RADm to be supplied to the frame memory 201 and a write address WADo to be supplied to the buffers 205Y, 205C.

The rate conversion circuit 105 has an input timing generator (input TG) 207. This input TG207 is constituted of a horizontal counter 208 and a vertical counter 209. An input clock CKi synchronous with the aforementioned luminance signal Ya and color-difference signal Ua/Va and the horizontal synchronous signal HDi are supplied to the horizontal counter 208. A horizontal synchronous signal HDi synchronous with the aforementioned luminance signal Ya and the color-difference signal Ua/Va and vertical synchronous signal VDi are supplied to the vertical counter 209.

The vertical counter 209 resets a count value to “0 with the vertical synchronous signal VDi and each time when the horizontal synchronous signal HDi is supplied, it increments that count value and supplies the count value to the horizontal counter 208.

The horizontal counter 208 resets the count value to “0 with the horizontal synchronous signal HDi and each time when the input clock CKi is supplied, it increments the count value. The horizontal counter 208 generates a write address WADi synchronously with the input clock CKi at each line corresponding to the effective pixel section in the vertical direction and for the effective pixel section in the horizontal direction based on a count value from the vertical counter 209 and its self count value and supplies it to the buffers 204Y, 204C within the SDRAM controller 202.

Further, after the horizontal counter 208 generates a write address WADi for the effective pixel section in the horizontal direction at each line corresponding to the effective pixel section in the vertical direction, it generates a write request WRQ synchronously with the horizontal synchronous signal HDi and supplies the request to the control unit 206 within the SDRAM controller 202.

The rate conversion circuit 105 has a memory timing generator (memory TG) 211. This memory TG211 is comprised of a request counter 212 and a vertical counter 213. A memory clock CKm is supplied to the request counter 212. A vertical reset signal VRS is supplied from output timing generator (output TG) 217 described later to the vertical counter 213 at a starting timing of the effective pixel section in the vertical direction of the output image signal Sc. A read-out request RRQ outputted from the request counter 212 is supplied to the vertical counter 213.

The vertical counter 213 resets the count value to “0 with the vertical reset signal VRS and each time when the read-out request RRQ is supplied, it increments that count value and supplies the incremented count value to the request counter 212. When the count value exists in “0–“N−1, the request counter 212 generates each read-out request RRQ based on a count value from the vertical counter 213, supplies it to the control unit 206 within the SDRAM controller 202 and then supplies it to the vertical counter 213.

Although in this case, the request counter 212 generates a read-out request RRQ when the count value from the vertical counter 213 turns to “0, after that, the read-out request RRQ is generated each time when “n” memory clocks CKm are counted.

When carrying out a rate conversion for obtaining the effective pixel section of an output image signal Sc from a part or all of the effective pixel section of the input image signal Sa shown in FIG. 4, that is, a unit of av line (av≦240) in the vertical direction and ah pixels (ah≦720) in the horizontal direction (rate conversion objective unit AT), the aforementioned N becomes av. In the meantime, because FIG. 4 shows a single field, the number of pixels (number of lines) in the vertical direction of the effective pixel section of each of the input image signal Sa and output image signal Sc is half the number of pixels (number of lines) shown in FIG. 2.

Each time when the read-out request RRQ is generated, the luminance signal Ya for 10 lines and the color-difference signal Ua/Va for two lines are read out from the frame memory 201 and supplied to the buffers 205Y, 205C. In this case, the luminance signal Ya for 10 lines, as described later, is employed for acquiring a prediction tap and a class tap when the image-signal-processing unit 106 acquires intensity data at a target position of the luminance signal Yb. Likewise, as described later, the color-difference signal Ua/Va for two lines are employed for acquiring the prediction tap and the class tap when the image-signal-processing unit 106 acquires color-difference data at a target position of the color-difference signal Ub/Vb.

When the rate conversion is carried out as shown in FIG. 4, the luminance signal Ya for 10 lines and the color-difference signal Ua/Va for two lines of a first line of the av lines corresponding to the rate conversion objective unit AT of the input image signal Sa are read out of the frame memory 201 to correspond to a read-out request RRQ generated when the count value of the vertical counter 213 is "0, and supplied to the buffers 205Y, 205C. To correspond to the read-out request RRQ generated when the count value of the vertical counter 213 is "1-"N-1, the luminance signal Ya for 10 lines and color-difference signal Ua/Va for two lines of the second line -N line of the av lines corresponding to the rate conversion objective unit AT of the input image signal Sa are read out from the frame memory 201 and supplied to the buffers 205Y, 205C.

The period of the read-out request RRQ generated in the request counter 212 is a time obtained by dividing a single vertical effective period of the output image signal Sc equally by the number of lines that are objective for rate conversion of the input image signal Sa. That is, assuming that the period is "t", the pixel frequency of the output image signal Sc is "fo", the number of lines which are objective for conversion of the input image signal Sa is "mi", the number of lines in a single vertical effective period of the output image signal Sc is "mo" and the number of pixels per line of the output image signal Sc is "no", there is a relation of $t=mo/mi/fo\times no$.

As described above, the request counter 212 generates the read-out request RRQ each time when "n" memory clocks CKm are counted. This "n" is obtained by dividing the aforementioned period "t" by the period of the memory clock CKm. That is, because the period of the memory clock CKm is 1/108 MHz, it comes that $n=mo/mi\times 108$ MHz$/fo\times no$.

Figure 5:
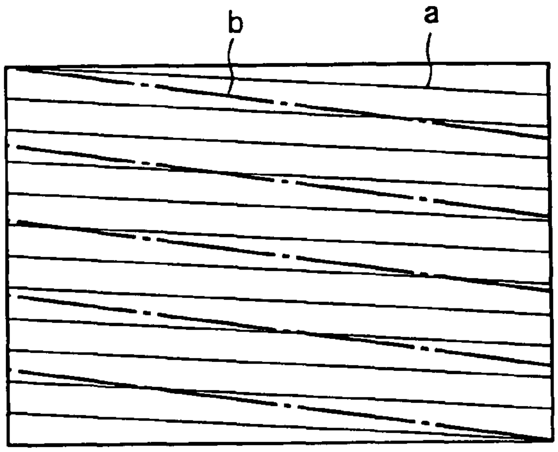
FIG. 5 is a diagram showing a correspondence between lines in a single vertical effective period of an output image signal and conversion objective lines of an input image signal when reading out the conversion objective line from a frame memory every predetermined time.

To facilitate the understanding, FIG. 5 shows a correspondence between lines in a single vertical effective period of the output image signal Sc and lines objective for conversion of the input image signal Sa in case where lines objective for conversion are read out of the frame memory 201 every predetermined time assuming that the number of lines "mi" objective for conversion of the input image signal Sa is 5 and the number of lines "mo" in a single vertical effective period of the output image signal Sc is 12. Referring to FIG. 5, its solid line "a" indicates lines of the output image signal Sc and its dot and an alternate long and short dashed line "b" indicates lines objective for conversion of the input image signal Sa.

Figure 6A:
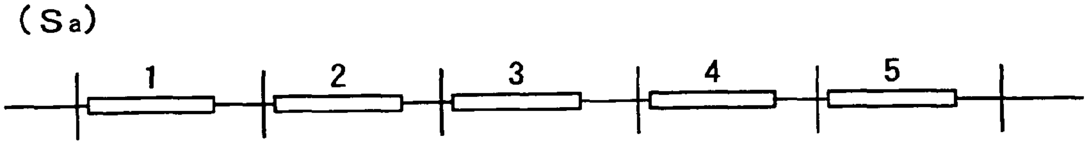
FIGS. 6A, 6B are diagrams showing the relation between a read-out input image signal and output image signal when reading out the conversion objective line from the frame memory every predetermined time.
Figure 6B:
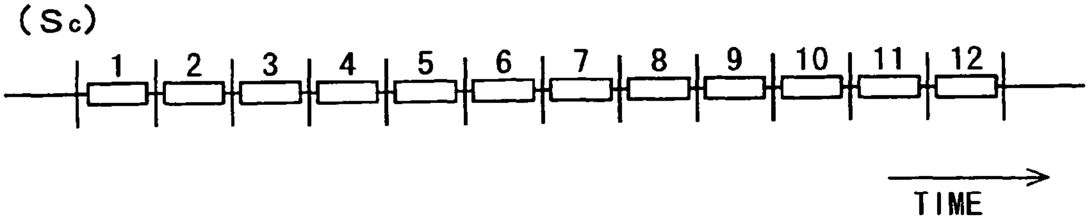

FIG. 6A shows each line objective for conversion of the input image signal Sa to be read out from the frame memory 201. FIG. 6B shows each line in a single vertical effective period of the output image signal Sc. In this case, because there is no deflection in the transmission period of data to the buffers 205Y, 205C from the frame memory 201, its stable data transmission band can be secured.

Figure 7:
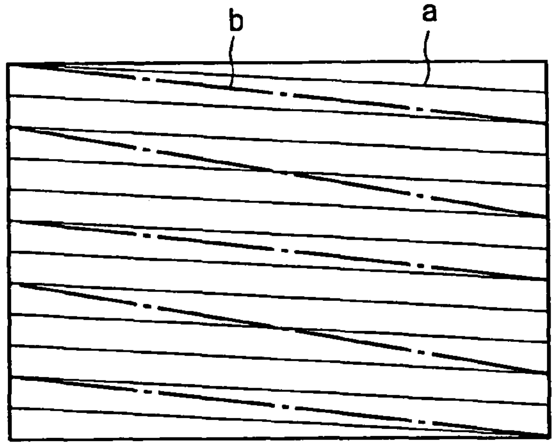
FIG. 7 is a diagram showing a correspondence between lines in a single vertical effective period of the output image signal and conversion objective lines of the input image signal when reading out a conversion objective line from the frame memory synchronously with the line of the output image signal.

FIG. 7, different from this embodiment, shows a correspondence between lines in a single vertical effective period of the output image signal Sc and lines objective for conversion of the input image signal Sa in case where the lines objective for conversion are read out of the frame memory 201 synchronously with the lines of the output image signal Sc. In FIG. 7, its solid line "a" indicates lines of the output image signal Sc and its alternate long and short dashed line "b" indicates lines objective for conversion of the input image signal Sa.

Figure 8A:
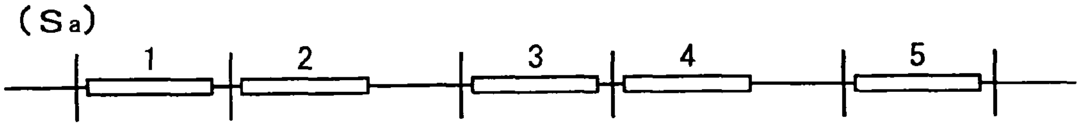
FIGS. 8A, 8B are diagrams showing the relation between the read-out input image signal and output image signal when reading out the conversion objective line from the frame memory synchronously with the line of the output image signal.
Figure 8B:
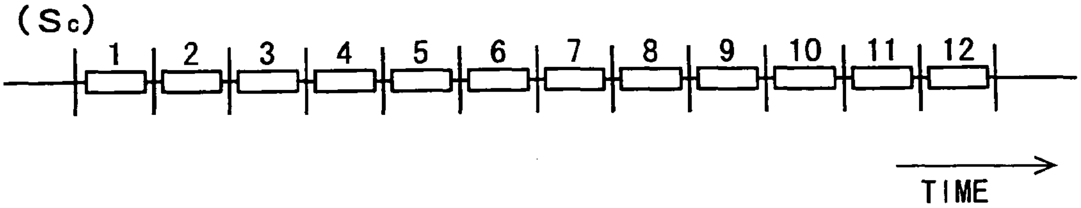

FIG. 8A shows each line objective for conversion of the input image signal Sa to be read out from the frame memory 201. FIG. 8B shows each line of a single vertical effective period of the output image signal Sc. In this case, because the data transmission period to the buffers 205Y, 205C from the frame memory 201 fluctuates, the use efficiency of the data transmission band is specified by its short unit (of the transfer period).

Corresponding to the read-out request RRQ, the luminance signal Ya and color-difference signal Ua/Va are transmitted from the frame memory 201 to the buffers 205Y, 205C and stored therein and after that, the request counter 212 of the memory TG211 generates a read-out address RADo to be supplied to the buffers 205Y, 205C and a write address WADr to be supplied to the rate conversion units 215Y, 215C as the second memory described later.

Further, the rate conversion circuit 105 has rate conversion units 215Y, 215C. The rate conversion unit 215Y is constituted of dual port line memories (SRAM) for 10 lines corresponding to it that the aforementioned buffer 205Y is constituted of the SRAMs for 10 lines. Likewise, the rate conversion unit 215C is constituted of dual port line memories (SRAM) for two lines corresponding to it that the aforementioned buffer 205C is constituted of the SRAMs for two lines. The SRAM of each system has a ring structure, and it has a memory capacity of more than a predetermined one so that in the rate conversion processing, write does not exceed read-out.

As described above, the read-out address RADo is supplied from the memory TG211 to the buffers 205Y, 205C, and write address WADr is supplied to the rate conversion units 215Y, 215C. Consequently, corresponding to each read-out request RRQ, the luminance signal Ya for 10 lines and the color-difference signal Ua/Va for two lines, after transmitted from the frame memory 201 to the buffers 205Y, 205C in time division fashion, are further transmitted to the rate conversion units 215Y, 215C in parallel and written therein.

Further, the rate conversion circuit 105 has an output timing generator (output TG) 217. This output TG217 is comprised of an address generating unit 218 and a vertical counter 219. An output clock CKo of 74.25 MHz synchronous with the output image signal Sc is supplied to the address generating unit 218. The address generating unit 218 generates a horizontal synchronous signal HDo synchronous with the output image signal Sc by counting this output clock CKo. This horizontal synchronous signal HDo is supplied to the vertical counter 219.

Further, the vertical synchronous signal VDo synchronous with the output image signal Sc is supplied to the vertical counter 219. The vertical counter 219 resets the count value to "0 with vertical synchronous signal VDo and increments the count value each time when the horizontal synchronous signal HDo is supplied. Then, this vertical counter 219 generates the aforementioned vertical reset signal VRS at the starting pixel position of the effective pixel section in the vertical direction of the output image signal Sc based on that count value and supplies this vertical reset signal VRS to the vertical counter 213 of the memory TG211.

The count value of the vertical counter 219 is supplied to the address generating unit 218. The address generating unit 218 generates a read-out address RADr corresponding to an effective unit in the horizontal direction at each line of the effective pixel section in the vertical direction of the output image signal Sc and supplies it to the rate conversion units 215Y, 215C.

In this case, the address generating unit 218 generates a reference address RADr0 at the starting pixel position (see point P in FIG. 4) of the effective pixel section in the horizontal direction and vertical direction of the output image signal Sc. This reference address RADr0 indicates the recording position of pixel data corresponding to the starting position (see point Q of FIG. 4) of the rate conversion objective unit AT of the input image signal Sa in the rate conversion units 215Y, 215C.

With phase information of the starting pixel position of the effective pixel section in the horizontal direction as 0, the address generating unit 218 adds an inverse number Mh of a horizontal expansion rate for each pixel position to be supplied with the output clock CKo. If the addition value is smaller than 4096, that addition value is regarded as phase information h in the horizontal direction of the pixel position. On the other hand, if the addition value is not smaller than 4096, carry occurs, so that a value obtained by subtracting 4096 from that addition value is regarded as phase information h in the horizontal direction of that pixel position. Meanwhile, the phase information "h" is, for example, a value obtained by rounding figures below the zero point. The same can be said of phase information "v" in the vertical direction.

If the addition value is smaller than 4096 and no carry occurs, as a read-out address RADr corresponding to the pixel position, the address generating unit 218 outputs the same one as a pixel position just before. On the other hand, if carry occurs, as a read-out address RADr corresponding to the pixel position, it outputs an address advanced by 1 from the address of the pixel position just before.

As described above, when the addition value is smaller than 4096 with no generation of carry, as a read-out address RADr corresponding to that pixel position, the same one as a pixel position just before is outputted and at that pixel position, the same pixel data as the pixel position just before is read out from the rate conversion units 215Y, 215C and consequently, the number of pixels in the horizontal direction can be increased.

Here, the inverse number Mh of the expansion rate can be obtained according to an equation of Mh=(number of pixels in the horizontal direction of the rate conversion objective unit AT of the input image signal Sa)/(number of pixels in the horizontal direction of the effective pixel section of the output image signal Sc)×normalization constant. According to this embodiment, the normalization constant is 4096. This is the reason that pixels in the horizontal direction of the input image signal Sa is divided equally by 4096 so as to define the phase in the horizontal direction of each pixel of the output image signal. For example, if the rate conversion as shown in FIG. 4 is carried out, it comes that Mh=ah/1920×4096.

With phase information of the starting pixel position of the effective pixel section in the vertical direction as 0, the address generating unit 218 adds an inverse number Mv of the vertical expansion rate at each line where the horizontal synchronous signal HDo is generated. When the addition value is smaller than 4096, that addition value is regarded as phase information "v" in the vertical direction of that line. On the other hand, if the addition value is not smaller than 4096, carry occurs and a value obtained by subtracting 4096 from the addition value is regarded as phase information "v" in the vertical direction of that line.

When the addition value is smaller than 4096 and no carry occurs, as a read-out address RADr corresponding to that line, the address generating unit 218 outputs the same one as a line just before. On the other hand, if carry occurs, as a read-out address RADr corresponding to that line, it outputs the one modified to read out pixel data at a next line of the input image signal Sa.

Here, the inverse number Mv of the expansion rate can be obtained according to an equation of Mv=(number of pixels in the vertical direction of a rate conversion objective unit AT of the input image signal Sa)/(number of pixels in the vertical direction of the effective pixel section of the output image signal Sc)×normalization constant. According to this embodiment, the normalization constant is 4096. This is the reason that pixels in the vertical direction of the input image signal Sa is divided equally by 4096 so as to define the phase in the vertical direction of each pixel of the output image signal. For example, when carrying out the rate conversion as shown in FIG. 4, it comes that Mv=av/540×4096.

As described above, when the addition value is smaller than 4096 with no generation of carry, as a read-out address RADr corresponding to that line, the same one as a line just before is outputted and at that line, the same pixel data as the pixel line just before is read out of the rate conversion units 215Y, 215C. Consequently, the number of pixels (number of lines) in the horizontal direction can be increased.

Figure 9:
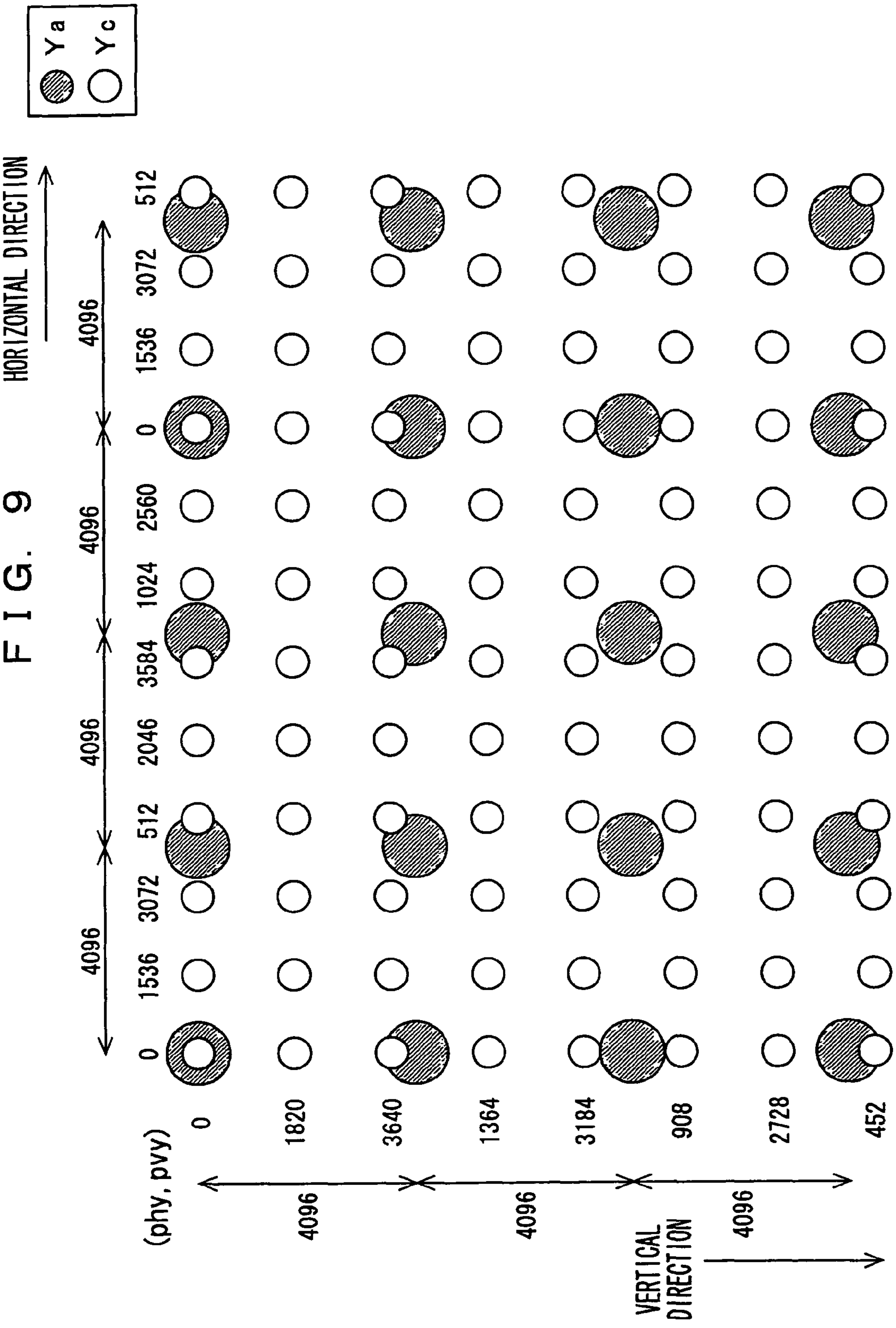
FIG. 9 is a diagram showing an example of rate conversion of the luminance signal, that is, an example of a case where an effective pixel section of horizontal 1920 pixels and vertical 480 pixels of the luminance signal Yc is obtained from a rate conversion objective unit AT of horizontal 720 pixels and vertical 240 pixels of the luminance signal Ya.

FIG. 9 shows an embodiment of rate conversion from the luminance signal Ya of the input image signal Sa to the luminance signal Yc of the output image signal Sc. According to this embodiment, an effective pixel section of horizontal 1920 pixels and vertical 480 pixels of the luminance signal Yc is obtained from a rate conversion objective unit AT of horizontal 720 pixels and vertical 240 pixels of the luminance signal Ya.

In this case, the inverse number "Mh" of the expansion rate in the horizontal direction is Mh=720/1920×4096=1536, so that phase information "phy" of each pixel position in the horizontal direction of the luminance signal Yc changes from 0 to 1536 to 3072 to 512 (=4608−4096) to 2046 to . . . . Further, the inverse number "Mv" of the expansion rate in the vertical direction is Mv=240/540×4096≈1820 and phase information "pvy" of each pixel position in the vertical direction of the luminance signal Yc changes from 0 to 1820 to 3640 to 1364 (=5460−4096) to 3184 to . . . .

Figure 10:
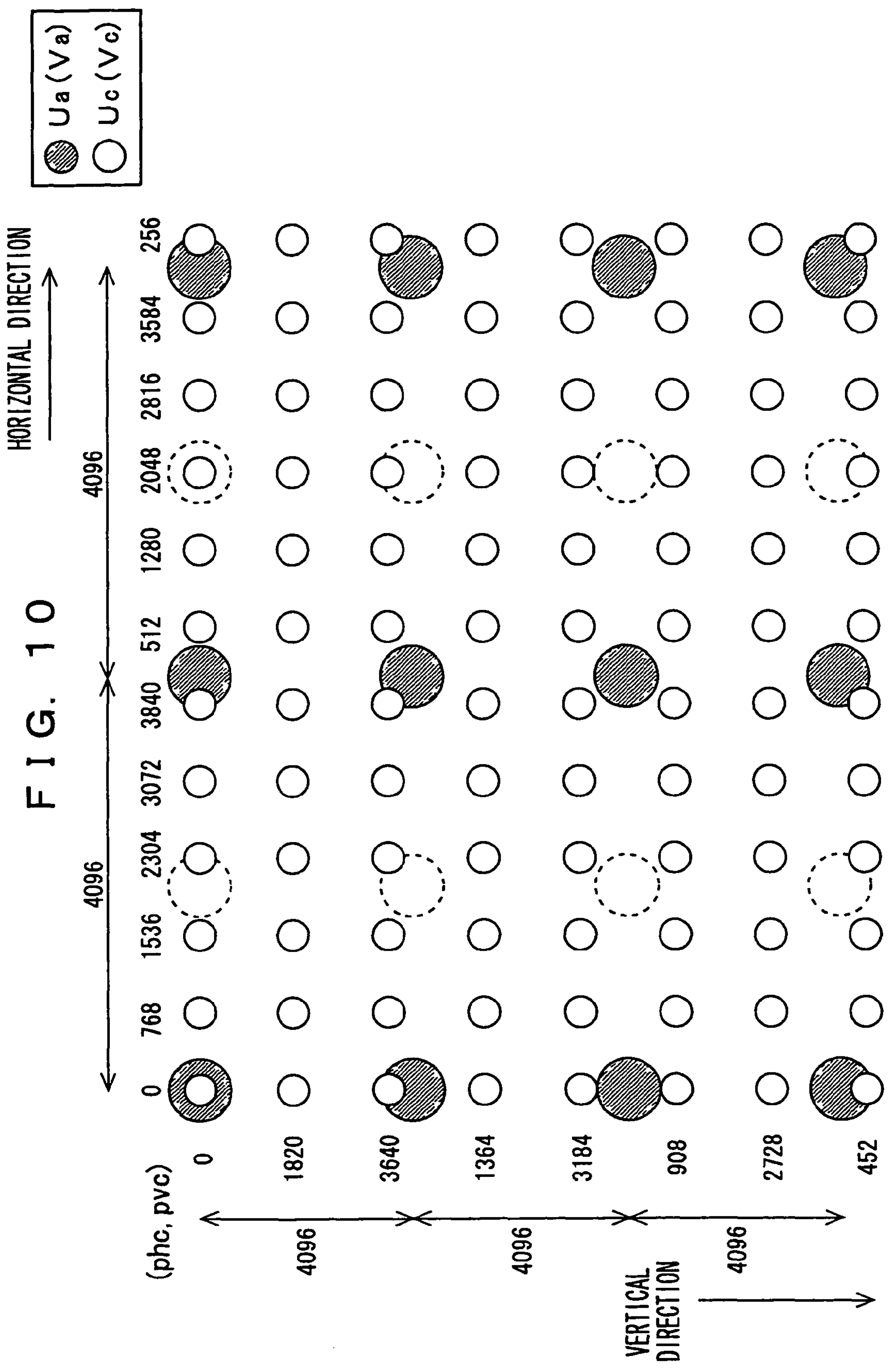
FIG. 10 is a diagram showing an example of rate conversion of the color-difference signal, that is, an example of a case where an effective pixel section of horizontal 1920 pixels and vertical 480 pixels of the color-difference signal Uc (Vc) is obtained from a rate conversion objective unit AT of horizontal 360 pixels and vertical 240 pixels of the color-difference signal Ua (Va)

FIG. 10 shows an embodiment of rate conversion from a color-difference signal Ua (Va) of the input image signal Sa to a color-difference signal Uc of the output image signal Sc. According to this embodiment, an effective pixel section of horizontal 1920 pixels and vertical 480 pixels of the color-difference signal Uc(Vc) is obtained from a rate conversion objective unit AT of horizontal 360 pixels and vertical 240 pixels of the color-difference signal Ua(Va). Meanwhile, as described above, the blue color-difference signal Ua and red color-difference signal Va of the input image signal Sa are dot sequential signals and the number of the pixels of each is half the luminance signal Ya. Thus, the horizontal 360 pixels of the color-difference signal Ua(Va) correspond to horizontal 720 pixels of the aforementioned luminance signal.

In this case, the inverse number "Mh" of the expansion rate in the horizontal direction is Mh=360/1920×4096=768. The phase information "phc" of each pixel position in the horizontal direction of the color-difference signal Uc(Vc) changes from 0 to 768 to 1536 to 2304 to 3072 to 3840 to 512 (=4608−4096) to 1280 to . . . . Further, the inverse number "Mv" of the expansion rate in the vertical direction is Mv=240/540×4096≈1820 and then, the position information "pvc" of each pixel position in the vertical direction of the color difference signal Uc(Vc) changes from 0 to 1820 to 3640 to 1364 (=5460−4096) to 3184 to . . . .

As described above, the blue color-difference signal Ua and the red color-difference signal Va of the input image signal Sa are dot sequential signals and in the rate conversion unit 215C, the dot sequential signals are written into each of the two systems of the SRAMs. However, when an output is made from this rate conversion unit 215C, the blue color-difference signal Uc and the red color-difference signal Vc are outputted independently. In this case, the rate conversion unit 215C is provided with a read-out port for the blue color-difference signal Uc and a read-out port for the red color-difference signal Vc. As the read-out address RADr to be outputted from the address generating unit 218 of the output TG 217, address for the blue color-difference signal Uc and address for the red color-difference signal Vc are supplied independently.

FIGS. 11A-F show timing charts for conversion of the number of pixels in the horizontal direction of the luminance signal corresponding to the example of FIG. 9. FIG. 11A shows a horizontal synchronous signal HDi synchronous with the luminance signal Ya. FIG. 11B shows lines in the luminance signal Ya and numbers 1, 2, 3, . . . indicate first pixel data, second pixel data, third pixel data . . . which constitute the rate conversion objective unit AT.

FIG. 11C shows a read-out request RRQ which is outputted from the memory TG211 and supplied to the control unit 206 within the SDRAM controller 202. FIG. 11D shows the luminance signal Ya which is read out of the frame memory 201 corresponding to the read-out request RRQ and inputted to the rate conversion unit 215Y through the buffer 205Y.

FIG. 11E shows a horizontal synchronous signal HDo synchronous with the luminance signal Yc. FIG. 11F shows a line containing the luminance signal Yc outputted from the rate conversion unit 215Y. Numbers 1, 2, 3, . . . respectively indicate pixel data corresponding to the first pixel data, second pixel data, third pixel data, ad the like of the luminance signal Ya constituting the rate conversion objective unit AT.

FIGS. 12A-G show timing charts on conversion of the number of pixels in the horizontal direction of a color-difference signal corresponding to FIG. 10. FIG. 12A shows the horizontal synchronous signal HDi synchronous with the color-difference signal Ua/Va. FIG. 12B shows a line containing the color-difference signal Ua/Va. Numbers 1, 2, . . . indicate the first pixel data, second pixel data . . . of the blue color-difference signal Ua which constitutes the rate conversion objective unit AT. Numbers 1, 2, . . . indicate the first pixel data, second pixel data of the red color-difference signal Va which constitutes the rate conversion objective unit AT.

FIG. 12C shows a read-out request RRQ, which is outputted from the memory TG211 and supplied to the control unit 206 within the SDRAM controller 202. FIG. 12D shows the color-difference signal Ua/Va, which is read out of the frame memory 201 corresponding to the read-out request RRQ and inputted to the rate conversion unit 215C through the buffer 205C.

FIG. 12E shows the horizontal synchronous signal HDo synchronous with the blue color-difference signal Uc and red color-difference signal Vc. FIG. 12F shows a line containing the blue color-difference signal Uc outputted from the rate conversion unit 215C. Numbers 1, 2, 3, . . . indicate pixel data corresponding to the first pixel data, second pixel data, third pixel data, . . . of the blue color-difference signal Ua which constitutes the rate conversion objective unit AT. FIG. 12G shows a line containing the red color-difference signal Vc outputted from the rate conversion unit 215C. Numbers 1, 2, 3 . . . indicate pixel data corresponding to the first pixel data, second pixel data, third pixel data, . . . of the red color-difference signal Va which constitutes the rate conversion objective unit AT.

FIGS. 13A-F show timing charts on conversion of the number of lines (conversion of the number of pixels) in the vertical direction of the image signals (luminance signal, color-difference signal). FIG. 13A shows a vertical synchronous signal VDi synchronous with the image signal Sa (luminance signal Ya, color-difference signal Ua/Va). FIG. 13B shows continuous line of an image signal Sa and numbers 1, 2, 3, . . . indicate the first line, second line, third line and the like which constitute the rate conversion objective unit AT.

FIG. 13C shows a read-out request RRQ, which is outputted form the memory TG211 and supplied to the control unit 206 within the SDRAM controller 202. FIG. 13D shows the image signal Sa which is read out of the frame memory 201 corresponding to the read-out request RRQ and inputted to the rate conversion units 215Y, 215C through the buffers 205Y, 205C.

FIG. 13E shows a vertical synchronous signal VDo synchronous with the image signal Sc (luminance signal Yc, blue color-difference signal Uc, ad red color difference signal Vc). FIG. 13F shows continuous lines of the image signal Sc outputted from the rate conversion units 215Y, 215C. Numbers 1, 2, 3, . . . indicate lines corresponding to the first line, second line, third line, . . . of the image signal Sa which constitutes the rate conversion objective unit AT.

Returning back to FIG. 3, the rate conversion unit 215Y is constituted of the SRAMs for 10 lines as described above and outputs the luminance signals Yc of 10 lines in parallel based on the read-out address RADr generated by the output TG217. Further, it also outputs the luminance signal of eight lines having line delay in parallel. In this case, the SRAM of each line of the rate conversion unit 215Y has a ring structure, so that by reading a small address only by the number of pixels of a single line from the address of some read-out port through a different port, the luminance signal having line delay can be obtained.

In conclusion, the luminance signal Yc of 18 lines is obtained from the rate conversion unit 215Y in parallel. The luminance signal Yc of 18 lines is used to extract the prediction tap and the class tap when obtaining the intensity data at a target position in the luminance signal Yb, which constitutes the output image signal Sb, in the image-signal-processing unit 106 as described later.

Figure 14A:
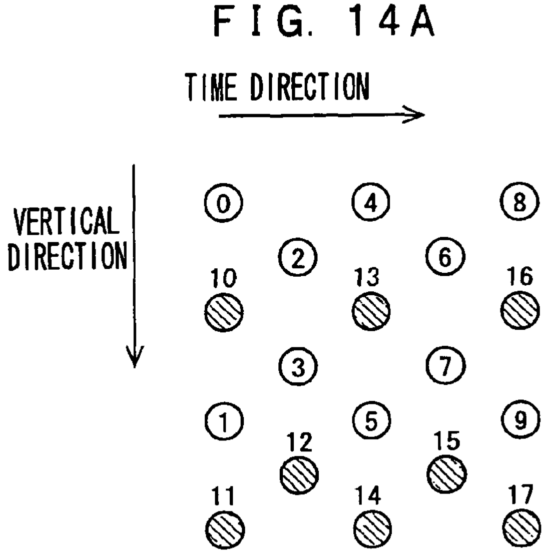
FIG. 14A is a diagram showing an example of a tap region for extracting the class tap and prediction tap in the luminance signal obtained with a rate conversion circuit.

FIG. 14A shows an example of the tap region of the luminance signal and 10 lines 0-9 indicated with white circles indicate lines having no line delay while eight lines 10-17 indicated with hatched circles indicate lines having line delay. In this case, for example, line 13 is located at the center position.

Figure 15A:
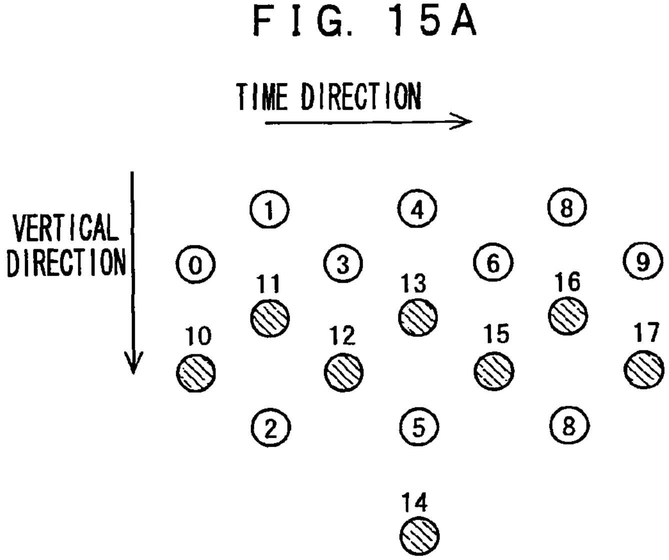
FIG. 15A is a diagram showing an example of a tap region for extracting the class tap and prediction tap in the luminance signal obtained with the rate conversion circuit.

FIG. 15A shows other example of the tap region of the luminance signal and 10 lines 0-9 indicated with white circles indicate lines having no line delay while eight lines 10-17 indicated with hatched circles indicate lines having line delay. In this case, line 13 is located at the center position.

The rate conversion unit 215C is constituted of the SRAMs of two lines as described above and outputs color-difference signals of two lines about the blue color-difference signal Uc and the red color-difference signal Vc in parallel based on the read-out address RADr generated by the output TG 217. Further, it outputs the color-difference signal of two lines having line delay about the blue color-difference signal Uc and red color-difference signal Vc in parallel. In this case, the SRAM of each line of the rate conversion unit 215C has a ring structure, so that by reading out a small address only by the number of pixels of a single line from an address of some read-out port through a different port, it is possible to obtain a color-difference signal having line delay.

In conclusion, the color-difference signal of four lines is obtained in parallel about each of the blue color-difference signal Uc and red color-difference signal Vc from the rate conversion unit 215C. The color-difference signal of four lines is used to extract the prediction tap and the class tap when obtaining color-difference data at a target position in the color-difference signal, which constitutes the output image signal Sb, in the image-signal-processing unit 106 as described later.

Figure 14B:
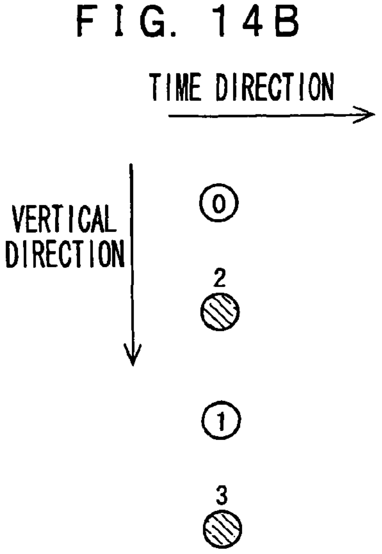
FIG. 14B is a diagram showing an example of a tap region for extracting the class tap and prediction tap in the color-difference signal obtained with the rate conversion circuit.

FIG. 14B shows an example of the tap region of the color-difference signal. Two lines 0, 1 indicated with white circles indicate lines having no line delay while two lines 2, 3 indicated with hatched circles indicate lines having line delay. In this case, for example, line 2 is located at the center position.

Figure 15B:
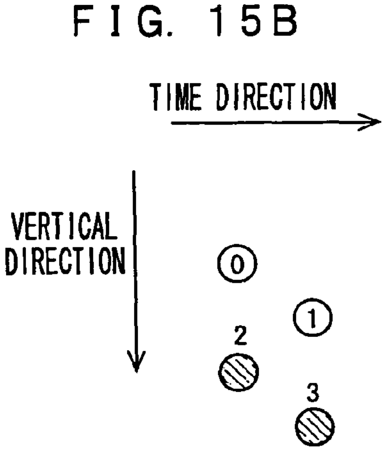
FIG. 15B is a diagram showing an example of a tap region for extracting the class tap and prediction tap in the color-difference signal obtained with the rate conversion circuit.

FIG. 15B shows other example of the tap region of the color-difference signal. Two lines 0, 1 indicated with white circles indicate lines having no line delay and two lines 2, 3 indicated with hatched circles indicate lines having line delay. In this case, for example, line 2 is located at the center position.

As described above, the SRAM of each line possessed by the rate conversion units 215Y, 215C has a ring structure. In this case, how much memory capacity is required by each line of the SRAM is guaranteed by emulation with theoretical value with an operating model shown in FIGS. 16A-C and under actual usage condition.

Figure 16A:
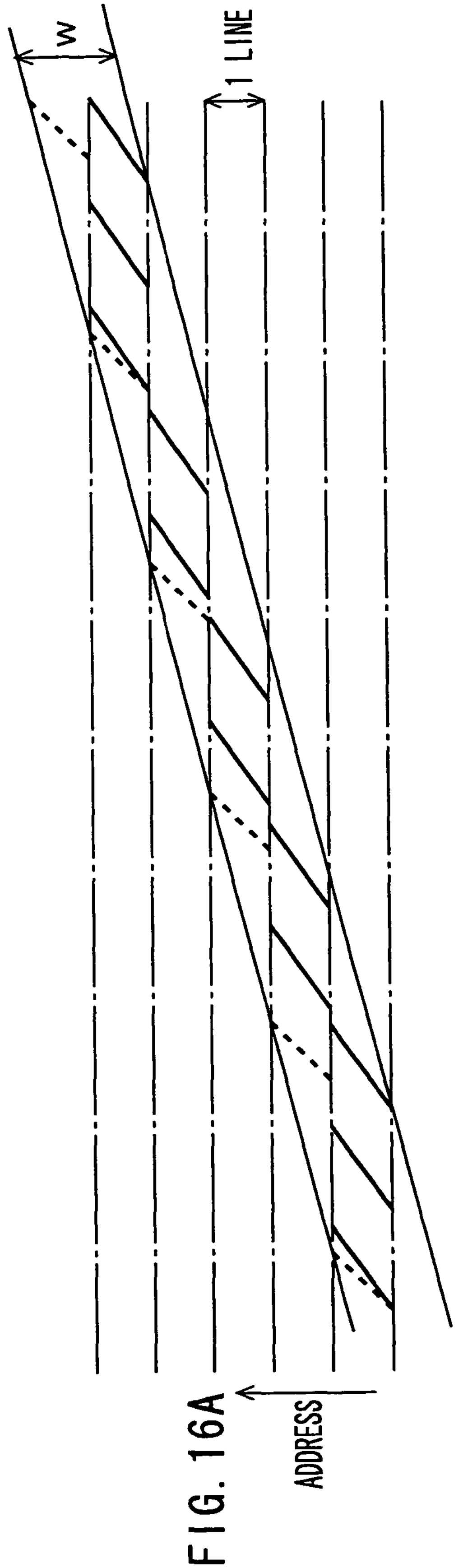
FIGS. 16A-C are diagrams showing an operation model for obtaining a theoretical value of the memory capacity that SRAM having a ring structure should have for each signal in a rate converter.
Figure 16B:
Figure 16C:
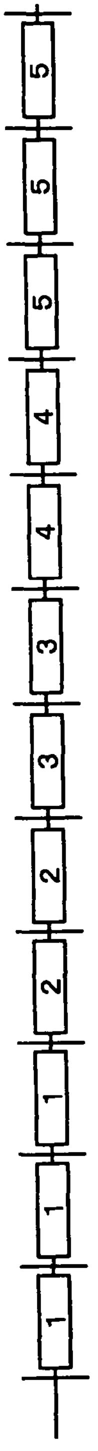

FIG. 16B shows an input line to the rate conversion unit and FIG. 16C shows its output line. FIG. 16A shows transition (indicated with dotted line) of write address corresponding to the input line and transition (indicated with solid line) of read-out address corresponding to the output line. This FIG. 16A indicates that the memory capacity of the SRAM of each line needs to be W or more.

Returning back to FIG. 3 again, the rate conversion circuit 105 has tap building circuits 221Y, 221C. The tap building circuit 221Y selects and builds up a horizontal tap used as the prediction tap and the class tap for each of the luminance signal Yc of 18 lines obtained by the rate conversion unit 215Y when the image signal processing unit 106 described later acquires the intensity data at a target position in the luminance signal Yb, which constitutes the output image signal Sb.

The tap building circuit 221C selects and builds up a horizontal tap used as the prediction tap and the class tap about each of the blue color-difference signal of four lines obtained by the rate conversion unit 215C when the image signal processing unit 106 described later acquires the color-difference data at a target position in the blue color-difference signal Ub, which constitutes the output image signal Sb.

Further, the tap building circuit 221C selects and builds up a horizontal tap used as the prediction tap and the class tap about each of the red color-difference signal Vc of four lines obtained by the rate conversion unit 215C when the image signal processing unit 106 described later acquires color-difference data at a target position in the red color-difference signal Vb, which constitutes the output image signal Sb.

The tap building circuit 221Y will be described in detail.

Figure 17:
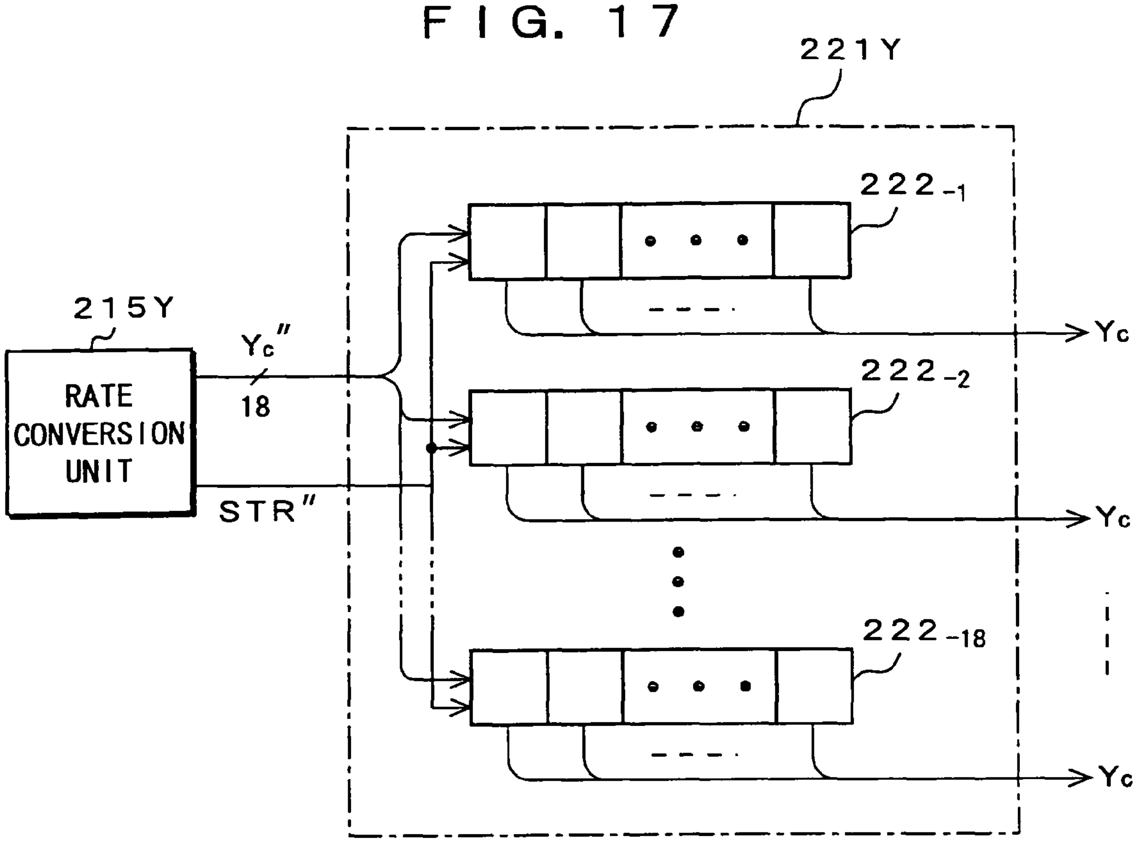
FIG. 17 is a block diagram showing a configuration of a Y tap building circuit.

This tap building circuit 221Y, as shown in FIG. 17, has 18 shift registers 222-1 to 222-18 corresponding to the luminance signals Yc for 18 lines obtained by the rate conversion unit 215Y. Each shift register is constituted of registers of the same numbers as those of the taps in the horizontal direction to be built. According to this embodiment, horizontal five taps are built up.

Consider a case where corresponding to the effective pixel section of each line, just the intensity data string of the luminance signal Yc after rate conversion obtained as described above, that is, its proper intensity data string is inputted to the shift register. In the meantime, assume that a shift trigger STR corresponding to a change position of the intensity data of the intensity data string of the luminance signal Yc is supplied to the shift register so that the intensity data at the change position of the intensity data string of the luminance signal Yc is taken in successively.

Figures 18A, 18B, 18C, 18D, 18E:
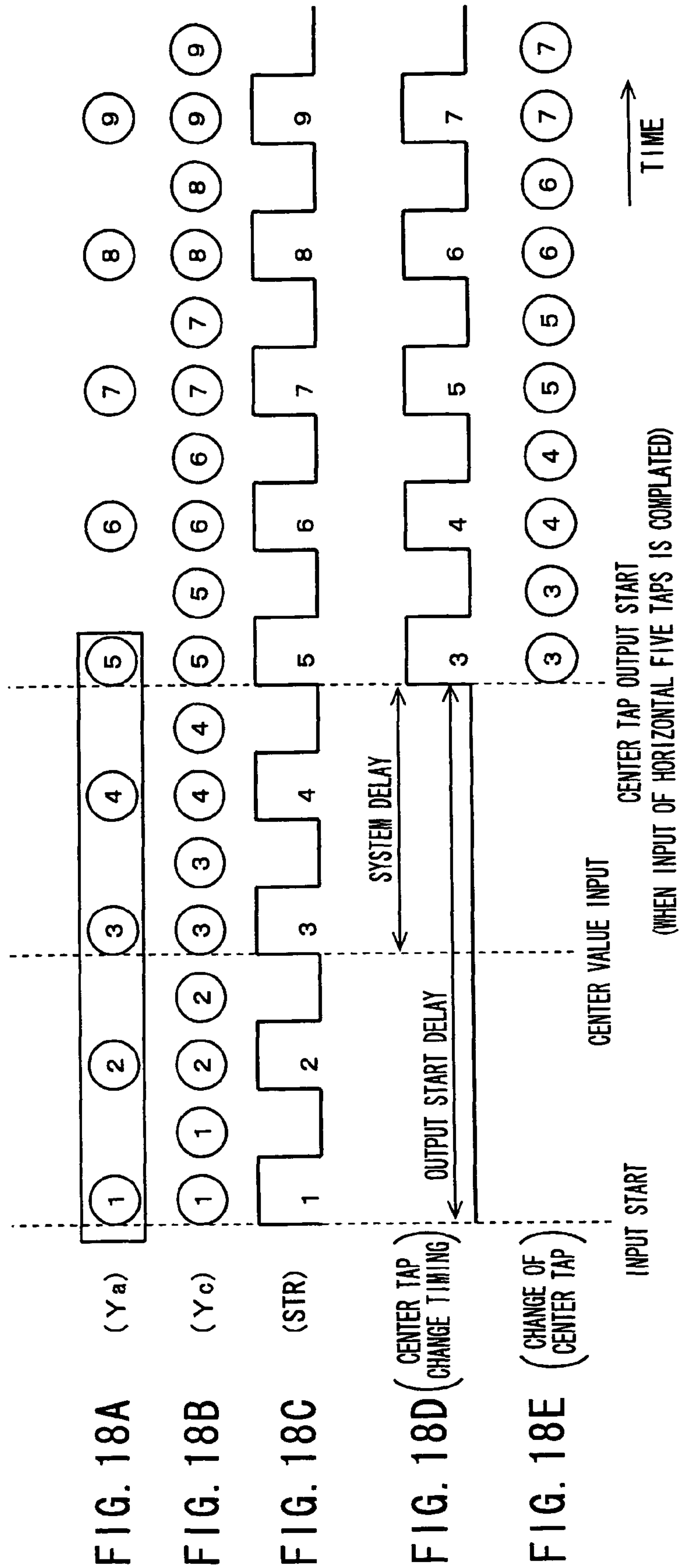
FIGS. 18A-E are diagrams showing an example of operation (pixel quantity conversion by a fixed integer time) of tap building.

First, a case where the number of pixels in the horizontal direction is converted to an integer time, for example, two folds by the rate conversion unit 215Y will be described. In this case, the states shown in FIGS. 18A-E are obtained. FIG. 18B shows a line containing the luminance signal Yc after rate conversion and numbers 1, 2, 3, . . . indicate intensity data corresponding to the first intensity data, second intensity data, third intensity data, . . . which constitute the rate conversion objective unit AT of the luminance signal Ya before rate conversion. FIG. 18C shows a shift trigger STR generated corresponding to a change point of the intensity data. FIG. 18A shows arrangement of each item of intensity data of the luminance signal Ya before rate conversion in correspondence with the change position of the intensity data in the intensity data string of the luminance signal Yc.

When building up horizontal 5 taps with the tap building circuit 221Y, the center tap changes as shown in FIG. 18E. In the meantime, FIG. 18D shows the change timing of the center tap.

In this case, because the center tap change comes to correspond to the arrangement of the intensity data string of the luminance signal Yc after rate conversion, the horizontal five taps can be obtained in the arrangement of the intensity data in the luminance signal Ya before the rate conversion.

In the meantime, time from a period when an input of the luminance signal Yc into the tap building unit 221Y is started to a period when the intensity data of the horizontal five taps is taken into the shift register and the first horizontal five taps are outputted is referred to as output start delay. Time from a period when the intensity data of the center tap is taken into the shift register to a period when it is outputted as the center tap is referred to as system delay.

The output start delay deflects depending on the conversion magnification of the number of pixels. Thus, if the horizontal five taps of the luminance signal Yc built in this tap building circuit 221Y is used, the image-signal-processing unit 106 described later needs a variable delay circuit capable of changing the delay time depending on the conversion magnification of the number of pixels in order to perform time adjustment with a signal of other system.

Next, a case where the number of pixels in the horizontal direction is converted to an arbitrary magnification, for example, 7/3 magnifications by the rate conversion unit 215Y will be described.

Figures 19A, 19B, 19C, 19D, 19E, 19F:
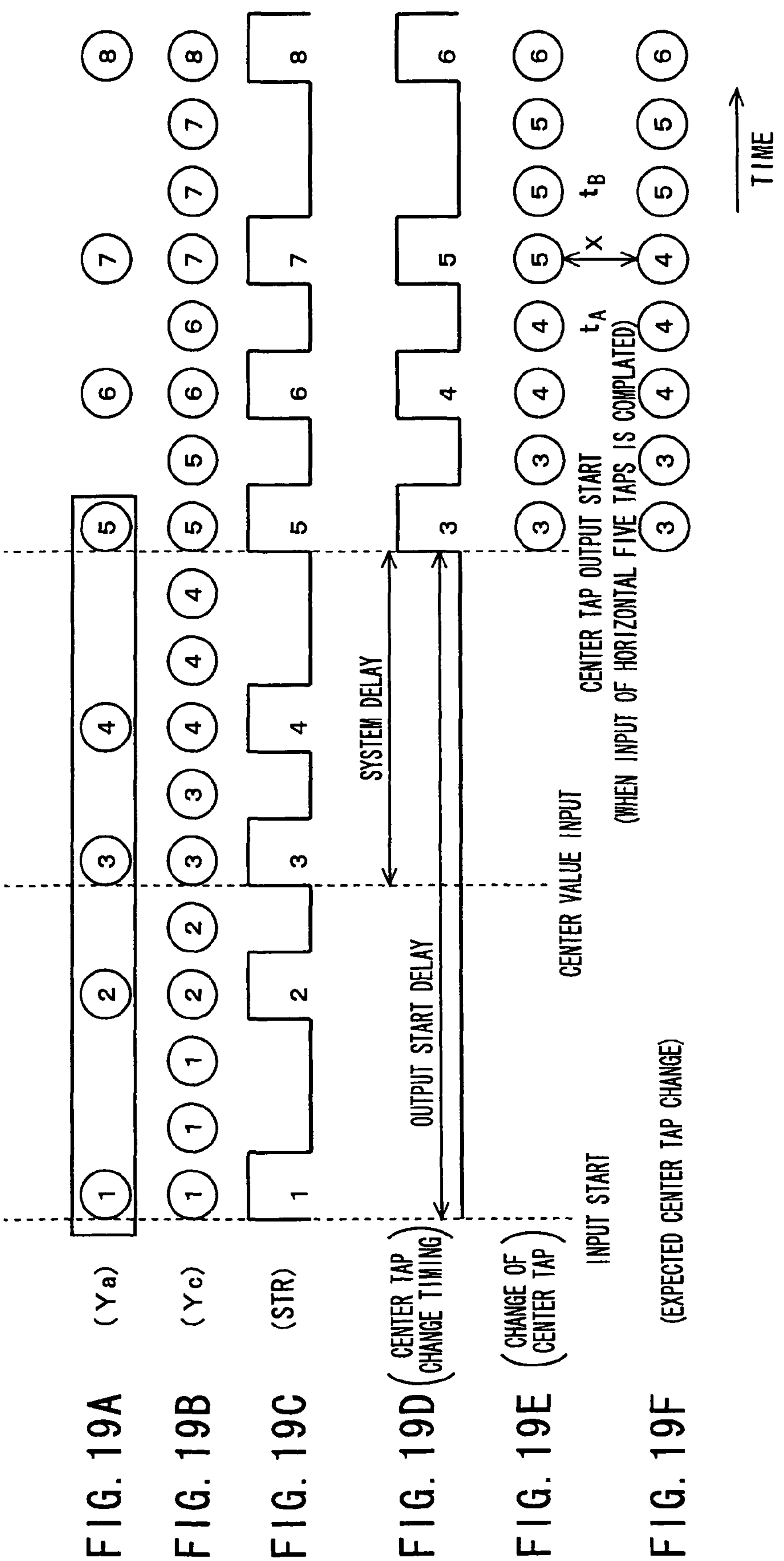
FIGS. 19A-F are diagrams showing an example of operation (pixel quantity conversion at an arbitrary magnification) of the tap building.

In this case, the state shown in FIGS. 19A-F arises. FIG. 19B shows lines containing the luminance signal Yc after the rate conversion and numbers 1, 2, 3, . . . indicate intensity data corresponding to the first intensity data, second intensity data, third intensity data, . . . constituting the rate conversion objective unit AT of the luminance signal Yal. FIG. 19C indicates a shift trigger STR that occurs corresponding to a change point of the intensity datal. FIG. 19A shows arrangement of each item of intensity data of the luminance signal Ya before the rate conversion in correspondence with a change position of the intensity data in the intensity data string of the luminance signal Yc.

When building the horizontal five taps by means of the tap building circuit 221Y, the center tap changes as shown in FIG. 19El. In the meantime, FIG. 19D shows the change timing of the center tap.

In this case, there is generated a unit where the change of the center tap does not agree with the arrangement of the intensity data string of the luminance signal Yc after rate conversionl. That is, at time $t_A$, the state of the shift register is one as shown in FIG. 20A and as the center tap, intensity data "4 is outputtedl. Then, because the shift trigger STR is supplied at next time X, the state of the shift register changes as shown in FIG. 20B and as the center tap, intensity data "5 is outputtedl. Further, because at next time $t_B$, no shift trigger is supplied, the state of the shift register is one shown in FIG. 20C like the state at time X and as the center tap, the intensity data "5 is outputted.

FIG. 19F shows expected changes of the center tap and at time X, as the center tap, not the intensity data "4 but the intensity data "5 is outputted. Thus, in this case, the horizontal five taps cannot be obtained in the arrangement of the intensity data in the luminance signal Ya before rate conversion.

Then, increasing the number of registers constituting the shift register by only one so as to gain six and then building up horizontal five taps by selecting them from the shift register is considered. In this case, at time $t_A$, the state of the shift register is one shown in FIG. 21A and the output of the registers 1-5 is outputted as a tap so that the center tap has the intensity data "4. Because at next time X, the shift trigger STR is supplied, the state of the shift register changes as shown in FIG. 21B and the registers 2-6 output a tap so that the center tap has the intensity data "4. Further, because at next time $t_B$, no shift trigger is supplied, the state of the shift register is one shown in FIG. 21C like the state at time X. Thus, the registers 1-5 output a tap so that the center tap has the intensity data "5.

Consequently, the change of the center tap comes to correspond to the arrangement of the intensity data string of the luminance signal Yc after rate conversion, so that the horizontal five taps can be obtained in the arrangement of the intensity data in the luminance signal Ya before rate conversion. However, in this case, a circuit for computing the phase and specifying the position of the center tap is needed. In this case also, output start delay changes depending on the conversion magnification of the number of pixels.

Then, what is considered is to modify the change position of the intensity data in the intensity data string of the luminance signal Yc and input that modified intensity data string into the shift register, so that the change of the center tap comes to correspond to the arrangement of the intensity data string of the luminance signal Yc after rate conversion.

In this case, a luminance signal Yc' shown in FIG. 22E obtained by modifying the luminance signal Yc (shown in FIG. 22B) is supplied from the rate conversion unit 215Y to the tap building unit 221Y. In this case, a shift trigger STR' corresponding to the change position of the intensity data in the intensity data string of the luminance signal Yc' is supplied, as shown in FIG. 22D, from the rate conversion unit 215Y to the shift register of the tap building unit 221Y instead of the shift trigger STR (shown in FIG. 22C).

Corresponding to a register which the shift register outputs the center tap, "no" registers are provided on its output side and "ni" registers are provided on its input side. As described above, when the horizontal five taps are built up, there is a relation of no=ni=2. The shift trigger STR' is the shift trigger STR having ni pre-reading triggers at its head. The timing of the pre-reading triggers is not limited to the timing in FIG. 22D and its requirement is satisfied if the intensity data "1, "2 are taken into the shift register.

When horizontal five taps are built in the tap building circuit 221Y, the center tap changes as shown in FIG. 22G. FIG. 22F shows the changing timing of the center tap. FIG. 22A shows arrangement of each item of intensity data of the luminance signal Ya before rate conversion in correspondence to the change position of the intensity data in the intensity data string of the luminance signal Yc.

Figures 23A, 23B, 23C:
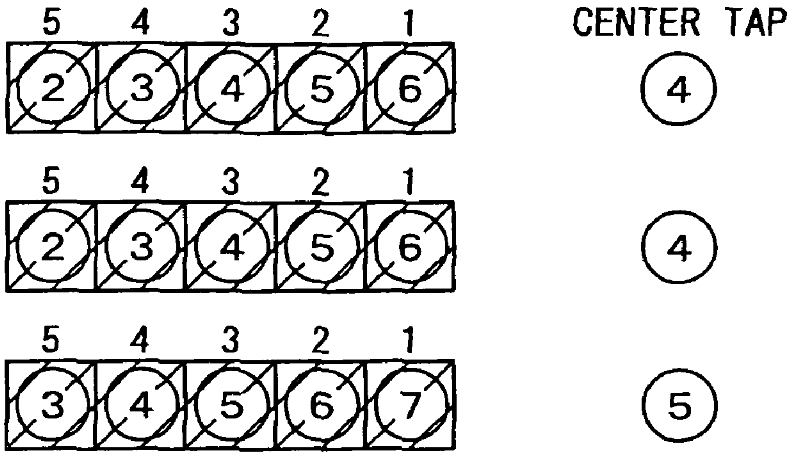
FIGS. 23A-C are diagrams for illustrating the change of the shift register condition and the changes of the center tap in the operation example of FIG. 22.

In this case, the state of the shift register at time $t_A$ is as shown in FIG. 23A and as the center tap, intensity data "4 is outputted. Because no shift trigger STR is supplied at next time X, the state of the shift register is as shown in FIG. 23B like the state at time $t_A$ and as the center tap, intensity data "4 is outputted. Further, because the shift trigger STR' is supplied at next time $t_B$, the state of the shift register changes as shown in FIG. 23B and as the center tap, intensity data "5 is outputted.

By supplying the luminance signal Yc' (shown in FIG. 22E) and the shift trigger STR' (shown in FIG. 22D) from the rate conversion unit 215Y to the tap building circuit 221Y, the change of the center tap comes to correspond to the arrangement of the intensity data string of the luminance signal Yc after rate conversion, so that horizontal five taps can be obtained in the arrangement as the intensity data of the luminance signal Ya before rate conversion.

However, the output start delay changes depending on the conversion magnification of the number of pixels. Thus, when horizontal five taps of the luminance signal Yc built by this tap building circuit 221Y is used, the image-signal-processing unit 106 requires a variable delay circuit capable of changing the delay time according to the conversion magnification of the number of pixels in order to adjust time with other signal, for example, phase information (phy, pvy)(phc, pvc) described later.

Then, according to this embodiment, the output start delay is adjusted to be constant not depending on the conversion magnification of the number of pixels.

Thus, what can be considered is to input intensity data string in which first (no+ni) items of intensity data change continuously into the shift register when providing with "no" registers on the output side and "ni" registers on the input side in correspondence to a register to which the shift register outputs the center tap. When building up the horizontal five taps as described above, there are relations of no=ni=2 and no+ni=4.

Figures 24A, 24B, 24C, 24D, 24E, 24F, 24G:
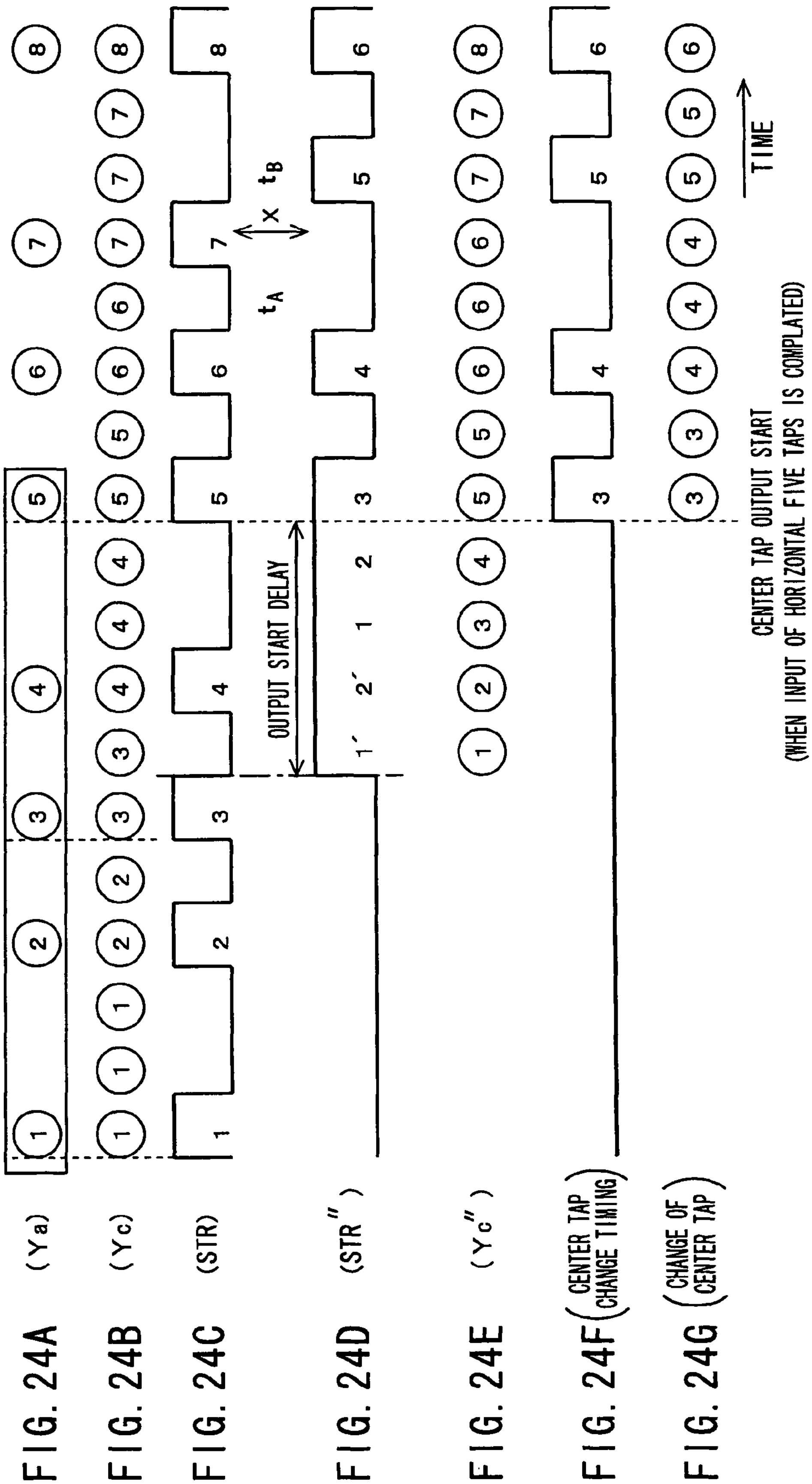
FIGS. 24A-G are diagrams showing an example of the operation (pixel quantity conversion at an arbitrary magnification) of the tap building in case where a predetermined item of the intensity data is taken into the shift register coping with the rate of the output image signal Sc with the output start delay set constant.

In this case, the luminance signal Yc" obtained by modifying the luminance signal Yc (shown in FIG. 24B) shown in FIG. 24E is supplied from the rate conversion unit 215Y to the tap building unit 221Y. In this case, a shift trigger STR" corresponding to the change position of intensity data in the intensity data string of the luminance signal Yc" as shown in FIG. 24D is supplied from the rate conversion unit 215Y to the shift register of the tap building unit 221Y instead of the shift trigger STR (shown in FIG. 24C).

If the horizontal five taps are built with the tap building circuit 221Y, the center tap changes as shown in FIG. 24G. FIG. 24F shows the change timing of the center tap. FIG. 24A shows arrangement of each item of intensity data of the luminance signal Ya before rate conversion in correspondence to the change position of the intensity data in the intensity data string of the luminance signal Yc.

By inputting an intensity data string in which first (no+ni) items of intensity data change continuously into the shift register of each line, the output start delay can be fixed to clock time (no+ni) of output clock CKo.

In this case also, the change of the center tap comes to correspond to the arrangement of the intensity data string of the luminance signal Yc after rate conversion, so that the horizontal five taps can be obtained in the arrangement of the intensity data in the luminance signal Ya before rate conversion.

Although it has been described above that the shift triggers STR', STR" can be obtained from the rate conversion unit 215Y, it can be obtained from other unit than the rate conversion unit 215Y, for example, the output TG217. This output TG217 supplies the rate conversion unit 215Y with read-out address RADr, thereby making it possible to obtain information about the change position of the intensity data in the intensity data string of the luminance signals Yc', Yc" easily.

Although a detailed description is omitted, the tap building circuit 221C is built in the same manner as the aforementioned tap building circuit 221Y. In this case, the color-difference signals Uc", Vc" and shift trigger STR", which are modified like the aforementioned luminance signal Yc" and shift trigger STR" are supplied from the rate conversion unit 215C to the tap building circuit 221C. Consequently, the tap building circuit 221C can obtain horizontal five taps in the arrangement of the color-difference signals Ua, Va before rate conversion and fix the output start delay.

Next, the operation of the rate conversion circuit 105 shown in FIG. 3 will be described.

The luminance signal Ya and color-difference signal Ua/Va, which constitute the image signal Sa to be inputted to the input terminal 104 (see FIG. 1) are supplied to the buffers 204Y, 204C within the SDRAM controller 202. Corresponding to the effective pixel section in the horizontal direction, the write address WADi is supplied from the input TG 207 to each of these buffers 204Y, 204C in each line and the luminance signal Ya and the color-difference signal Ua/Va are written successively.

After the effective pixel section in the horizontal direction is terminated at each line, a write request WRQ is generated from the input TG207. This write request WRQ is supplied to the control unit 206 within the SDRAM controller 202. The control unit 206 generates read-out address RADi to be supplied to the buffers 204Y, 204C and write address WADm to be supplied to the frame memory 201.

The read-out address RADi generated in the control unit 206 is supplied to the buffers 204Y, 204C. The write address WADm generated in the control unit 206 is supplied to the frame memory 201. Consequently, the effective pixel section of the luminance signal Ya and color-difference signal Ua/Va stored in the buffers 204Y, 204C temporarily is read in the time division fashion out of the buffers 204Y,204C, transferred to the frame memory 201 through the SDRAM bus 203 and then written into a predetermined address of this frame memory 201.

Further, a read-out request RRQ is generated from the memory TG211. This read-out request RRQ is generated every specified time (see FIGS. 5, 6A, B). The vertical counter 213 of the memory TG211 is reset to "0 with a vertical reset signal VRS supplied at the start timing of the effective pixel section in the vertical direction in the output image signal Sc from the output TG217. Although the read-out request RRQ is generated first when the count value of the vertical counter 213 turns to "0, after that, it is generated each time when the memory clock CKm (108 MHz) counts n.

In this case, the period "t" of the read-out request RRQ is a time obtained by dividing a single vertical effective period of the output image signal Sc by the number of lines objective for rate conversion of the input image signal Sa. That is, when the period is "t", the pixel frequency of the output image signal Sc is "fo", the number of lines objective for conversion of the input image signal Sa is "mi", the number of lines in a single vertical effective period of the output image signal Sc is "mo", and the number of pixels per line of the output image signal Sc is "no", there is a relation of $t=mo/mi/fo\times no$. Therefore, the aforementioned n turns to $n=t\times108$ MHz.

The read-out request RRQ generated by the memory TG211 is supplied to the control unit 206 within the SDRAM controller 201. Corresponding to the read-out request RRQ, this control unit 206 generates a read-out address RADm to be supplied to the frame memory 201 and a write address WADo to be supplied to the buffers 205Y, 205C. The read-out address RADm generated by the control unit 206 is supplied to the frame memory 201. Further, the write address WADo generated by the control unit 206 is supplied to the buffers 205Y, 205Y.

Consequently, each time when the read-out request RRQ is generated, the luminance signal Ya for 10 lines and the color-difference signal Ua/Va for two lines are read out synchronously with the memory clock CKm (108 MHz) from the frame memory 201 and supplied to the buffers 205Y, 205C through the SDRAM bus 203. In this case, the luminance signal Ya for 10 lines and the color-difference signal Ua/Va for two lines, that is, the signals for 12 lines are transferred in the time division fashion.

Each of the luminance signals Ya for 10 lines supplied to the buffer 205Y is written into each of the SRAMs for 10 lines which constitute the buffer 205Y. Likewise, the color-difference signal Ua/Va for two lines supplied to the buffer 205C is written into each of the SRAMs for two lines which constitute the buffer 205C.

After corresponding to the read-out request RRQ, the luminance signal Ya and color-difference signal Ua/Va are transferred from the frame memory 201 to the buffers 205Y, 205C and written therein, the read-out address RADo to be supplied to the buffers 205Y, 205C and the write address WADr to be supplied to the rate conversion units 215Y, 215C described later are generated at memory TG 211. The real-out address RADo is supplied to the buffers 205Y, 205C. Further, the write address WADr is supplied to the rate conversion units 215Y, 215C.

Each time when a read-out request RRQ is generated, it is transferred from the frame memory 201 and stored in the buffers 205Y, 205C temporarily. The luminance signal Ya for 10 lines and the color-difference signal Ua/Va for two lines are transferred to the rate conversion units 215Y, 215C synchronously with the output clock CKm (108 MHz) and then written into the rate conversion units 215Y, 215C.

The rate conversion unit 215Y is constituted of the SRAMs of 10 lines corresponding to that the buffer 205Y is constituted of the SRAMs of 10 lines. Likewise, the rate conversion unit 215C is constituted of the SRAMs of two lines corresponding to that the buffer 205C is constituted of the SRAMs of two lines. Thus, the luminance signal Ya of 10 lines and the color-difference signal Ua/Va of two lines, that is, the signals of 12 lines are transferred in parallel from the buffers 205Y, 205C to the rate conversion units 215Y, 215C and written therein.

A read-out address RADr is generated from the address generating unit 218 of the output TG217 corresponding to the effective unit in the horizontal direction at each line of the effective pixel section in the vertical direction of the output image signal Sc. This read-out address RADr is supplied to the rate conversion units 215Y, 215C.

In this case, the address generating unit 218 generates a reference address RADr0 at a start pixel position (see point P of FIG. 4) of the effective pixel section in the horizontal direction and vertical direction of the output image signal Sc. This reference address RADr0 indicates a recording position of pixel data corresponding to the start position (see point Q of FIG. 4) of the rate conversion objective unit AT of the input image signal Sa of the rate conversion units 215Y, 215C.

With phase information of the starting pixel position of the effective pixel section in the horizontal direction as 0, the address generating unit 218 adds an inverse number Mh of a horizontal expansion rate for each pixel position to be supplied with the output clock CKo. If the addition value is smaller than 4096, that addition value is regarded as phase information "h" in the horizontal direction of the pixel position. On the other hand, if the addition value is not smaller than 4096, carry occurs, so that a value obtained by subtracting 4096 from that addition value is regarded as phase information "h" in the horizontal direction of that pixel position.

If the addition value is smaller than 4096 and no carry occurs, as a read-out address RADr corresponding to the pixel position, the address generating unit 218 outputs the same one as a pixel position just before. On the other hand, if carry occurs, as a read-out address RADr corresponding to the pixel position, it outputs an address advanced by 1 from the address of the pixel position just before.

Consequently, if the addition value is smaller than 4096 and no carry occurs, as the read-out address RADr corresponding to its pixel position, the same one as the pixel position just before is used and the same pixel data as the pixel position just before is read out of the rate conversion units 215Y, 215C at that pixel position. Thus, the rate conversion units 215Y, 215C obtain the luminance signal Yc and the color-difference signals Uc, Vc after rate conversion, in which the number of pixels in the horizontal direction is increased corresponding to the expansion rate in the horizontal direction with respect to the luminance signal Ya and the color-difference signals Ua, Va before rate conversion.

With phase information of the starting pixel position of the effective pixel section in the vertical direction as 0, the address generating unit 218 adds an inverse number Mv of the vertical expansion rate at each line where the horizontal synchronous signal HDo is generated. When the addition value is smaller than 4096, that addition value is regarded as phase information "v" in the vertical direction of that line. On the other hand, if the addition value is not smaller than 4096, carry occurs and a value obtained by subtracting 4096 from the addition value is regarded as phase information "v" in the vertical direction of that line.

When the addition value is smaller than 4096 and no carry occurs, as a read-out address RADr corresponding to that line, the address generating unit 218 outputs the same one as a line just before. On the other hand, if carry occurs, as a read-out address RADr corresponding to that line, the address generating unit 218 outputs the one modified to read out pixel data at a next line of the input image signal Sa.

When the addition value is smaller than 4096 and no carry occurs, as the read-out address RADr corresponding to that line, the same one as a line just before is used and the same pixel data as the line just before is read out of the rate conversion units 215Y, 215C at that line. Thus, the rate conversion units 215Y, 215C obtain the luminance signal Yc and color-difference signals Uc, Vc after rate conversion in which the number of pixels in the vertical direction is increased corresponding to the expansion rate in the vertical direction (see FIGS. 9, 10) with respect to the luminance signal Ya and color-difference signals Ua, Va before rate conversion.

From the rate conversion unit 215Y, the luminance signal Yc for 10 lines based on the read-out address RADr generated by the output TG217 and the luminance signal Yc for eight lines based on an address smaller by the number of pixels of a single line are obtained by the aforementioned SRAMs of 10 lines. That is, the luminance signals Yc of 18 lines are obtained in parallel from the rate conversion unit 215Y (see FIG. 14A, FIG. 15A). The luminance signal Yc of 18 lines is used to extract the prediction tap and the class tap when the image-signal-processing unit 106 obtains the intensity data at a target position in the luminance signal Yb which constitutes the output image signal Sb.

From the rate conversion unit 215C, the color-difference signals Uc, Vc for two lines each based on the read-out address RADr generated by the output TG217 and the color-difference signals Uc, Vc for two lines based on an address smaller by the number of pixels of a single line are obtained by the aforementioned SRAMs of two lines. That is, the color-difference signals Uc, Vc for four lines each are obtained in parallel from the rate conversion unit 215C (see FIG. 14B, FIG. 15B). The color difference signals Uc, Vc for four lines each are used to extract the prediction tap and the class tap when the image-signal-processing unit 106 obtains the color-difference data at a target position in the color-difference signals Ub, Vb which constitutes the output image signal Sb.

The luminance signals Yc for 18 lines obtained by the rate conversion units 215Y, 215C and the color-difference signals Uc, Vc for four lines each are extended in the vertical direction and time direction. Although the tap in the vertical direction and time direction (class tap, prediction tap) can be extracted easily by means of the image-signal-processing unit 106, the tap in the horizontal direction is not extended and it is difficult to extract the tap in the horizontal direction.

The tap building circuits 221Y, 221C build up a tap in the horizontal direction based on the luminance signal Yc for 10 lines and the color-difference signals Uc, Vc for two lines each obtained by the rate conversion units 215Y, 215C. The tap building circuit 221Y is provided with 18 shift registers 222-1 to 222-18 corresponding to the luminance signals Yc for 18 lines (see FIG. 17). Likewise, the tap building circuit 221C is provided with 8 shift registers corresponding to each of the color-difference signals Uc, Vc for four lines each. Then, each register is constituted of resisters of the same number as that of the taps in the horizontal direction to be built up.

A luminance signal after rate conversion is inputted to the shift register that constitutes the tap building circuit 221Y. A shift trigger corresponding to the change position of the intensity data in the intensity data string of that luminance signal is supplied to that shift register. Each time when the shift trigger is supplied to the shift register, intensity data corresponding to the conversion position of the intensity data string of the luminance signal is taken in continuously. The same thing can be said of the tap building circuit 221C.

According to this embodiment, for a change of the center tap to correspond to the arrangement of the intensity data string of the luminance signal Yc after rate conversion, modified intensity data string obtained by modifying the change position of the intensity data in the intensity data string of the luminance signal Yc is inputted to the shift register. When in correspondence to register for outputting the center tap, "no" registers are provided on its output side while "ni" registers are provided on the input side, this modified intensity data string is regarded as a result of changing of continuous the first (no+ni) items of intensity data and that (no+ni) items of intensity data are taken into the shift register continuously.

According to this embodiment, luminance signal Yc" obtained by modifying the intensity data string (proper intensity data string) of the luminance signal Yc is inputted to the tap building unit 221Y from the rate conversion unit 215Y. Further, shift trigger STR" corresponding to the change position of the intensity data in the intensity data string of this luminance signal Yc" is supplied (see FIG. 24A-G). The same thing can be said of the rate conversion unit 215C and the tap building circuit 221C.

Consequently, the center tap changes corresponding to the arrangement of the luminance signal Yc, intensity data string of color-difference signals Uc, Vc and color-difference data string after rate conversion so that horizontal five taps can be obtained in the arrangement of intensity data and color-difference data in the luminance signal Ya and color-difference signals Ua, Va before rate conversion. Further, the output start delay in the tap building circuits 221Y, 221C can be fixed to clock time (no+ni) of the output clock CKo, so that the image-signal-processing unit 106 does not need to be provided with a variable delay circuit capable of changing the delay time depending on the conversion magnification of the number of pixels in order to execute time adjustment with other signal, for example, phase information (phy, pvy) (phc, pvc).

In the rate conversion circuit 105 shown in FIG. 3, a read-out request RRQ is generated from the memory TG211 and the luminance signal Ya and color-difference signals Ua/Va are transferred by the unit of line to the rate conversion units 215Y, 215C from the frame memory 201 through the buffers 205Y, 205C based on this read-out request RRQ. Thus, there is no deflection in the transfer period of the luminance signal Ya and the color-difference signals Ua/Va from the frame memory 201 as the first memory to the rate conversion units 215Y, 215C as the second memory, so that stable data transfer band can be secured in each transfer period. Consequently, the rate conversion circuit 105 is capable of stably transferring the luminance signal Ya for 10 lines and the color-difference signals Ua/Va for two lines, that is, totally signals for 12 lines, from the frame memory 201 to the rate conversion units 215Y, 215C for each transfer period.

Figure 25:
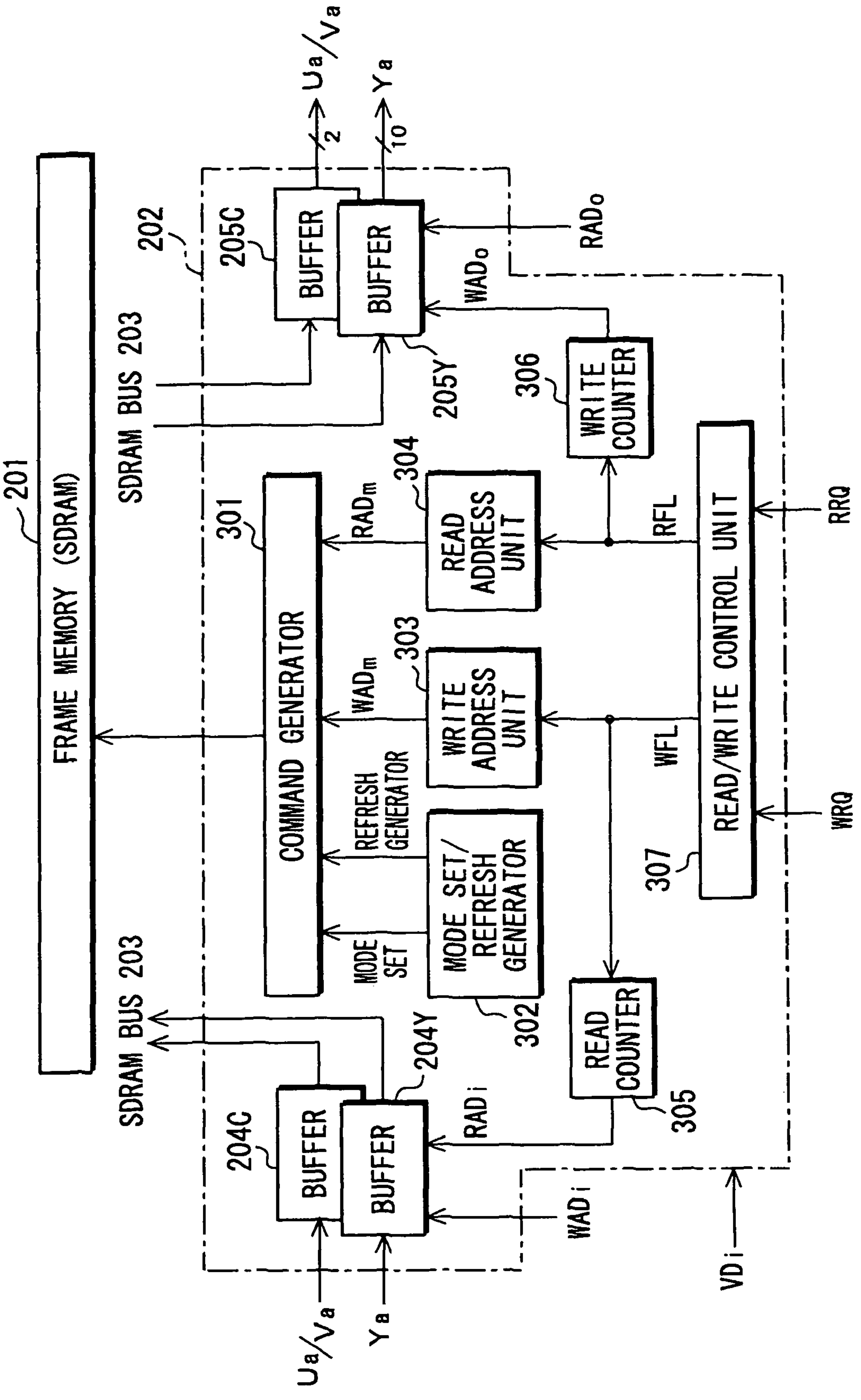
FIG. 25 is a block diagram showing a configuration of the SDRAM controller that constitutes the rate conversion circuit.

Next, the SDRAM controller 202 will be described further in detail with reference to FIG. 25. In FIG. 25, like reference numerals are attached to components corresponding to FIG. 3 and description thereof is omitted.

The SDRAM controller 202 comprises buffers 204Y, 204C as a write buffer, buffers 205Y, 205C as a read-out buffer, a command generator 301, a mode set/refresh generator 302, a write address unit 303, a read address unit 304, a read counter 305, a write counter 306, and a read/write control unit 307. Here, the command generator 301, the mode set/refresh generator 302, the write address unit 303, the read address unit 304, the read counter 305, the write counter 306, and the read/write control unit 307 correspond to the control unit 206 in FIG. 3.

This SDRAM controller 202 is supplied with a vertical synchronous signal VDi synchronous with an input image signal Sa and additionally as external parameters, with the number of effective pixels in the horizontal direction of the input image signal Sa, the number of effective pixels (number of effective lines) in the vertical direction of the input image signal Sa, number of output channels, center position field and its start line and a difference from the center position of each output channel.

As described above, corresponding to a single read-out request RRQ, the luminance signal Ya for 10 lines and the color-difference signal Ua/Va for two lines are read out of the frame memory 201 (SDRAM). Here, data of a single line is treated as 1-channel data.

How many fields the field of the center position is located relatively ahead of a field written into the frame memory 201 is specified. Its start line is assumed to be a first line of the av line corresponding to the rate conversion objective unit AT (see FIG. 4). Further, the position of each channel is assumed to be a difference from the aforementioned center position, that is, ±fields, ±lines from the center position.

The read/write control unit 307 generates a write flag WFL accompanying channel information corresponding to the write request WRQ supplied from the input TG 207 (see FIG. 1) and further generates a read-out flag RFL accompanying channel information corresponding to the read-out request RRQ supplied from the memory TG211 (see FIG. 3).

The read counter 305 generates a read-out address RADi to be supplied to the buffers 204Y, 204C as a write buffer corresponding to the supply of the write flag WFL from the read/write control unit 307. This read-out address RADi is supplied to the buffers 204Y, 204C. The write address unit 303 generates a write address WADm to be supplied to the frame memory 201 corresponding to the supply of the write flag WFL from the read/write control unit 307. This write address WADm is supplied to the frame memory 201 through the command generator 301.

The read address unit 304 generates a read-out address RADm to be supplied to the frame memory 201 corresponding to the supply of the read-out flag RFL from the read/write control unit 307. This read-out address RADm is supplied to the frame memory 201 through the command generator 301. The write counter 306 generates a write address WADo to be supplied to the buffers 205Y, 205C as a read-out buffer corresponding to the supply of the read-out flag RFL from the read/write control unit 307. This write address WADo is supplied to the buffers 205Y, 205C.

The read address generating unit 304 generates a read-out address RADm for reading out 12-channel data relating to the first line of the av line corresponding to the rate conversion objective unit AT of the input image signal Sa from the frame memory 201, corresponding to a first read-out flag RFL at each field. This read-out address RADm is computed based on a difference between the field of center position given as an external parameter as described above and the starting line, or a difference from the center position of each output channel in the vertical blanking period of each field.

The read address generating unit 304 generates a read-out address RADm for reading out 12-channel data relating to the second-N line of the av line corresponding to the rate conversion objective unit AT of the input image signal Sa from the frame memory 201. In this case, by incrementing the read-out address RADm for the first line gradually, the read-out address RADm for the second-N line can be obtained.

The power ON sequence of this SDRAM controller 202 will be described. Because the state of the frame memory (SDRAM) 201 is not clarified when it is powered ON, it is specified to execute pre-charge, mode reset and refresh on all banks, after power stabilization time when the power is turned ON. However, because the SDRAM controller 202 executes mode rest and refresh if a vertical synchronous signal VDi is inputted, power ON sequence is automatically carried out when some of the vertical synchronous signals VDi are inputted.

The mode set/refresh generator 302 generates a control flag for mode set/refresh of the frame memory 201 accompanied by the input of the vertical synchronous signal VDi. The command generator 301 generates a command necessary for control of the frame memory 201 based on the control flag.

Here, the refresh cycle of the SDRAM will be described. The SDRAM needs a refresh operation to maintain written data.

According to this embodiment, for example, SDRAM of 16 Mbit×4 banks is used. As for this SDRAM, the refresh cycle of any memory product is set to 4096 times/64 ms. Because the field cycle of the input image signal Sa is 60 Hz or 50 Hz, according to this embodiment, each time when the vertical synchronous signal VDi is inputted, the refreshing is carried out all at once using the blanking period.

Although in the above description, it has been described that the input image signal Sa is 480i (60 Hz) signal and the output image signal Sb is 1080i (60 Hz) signal for convenience for explanation, the input image signal Sa and the output image signal Sb are not restricted to those cases. In this case, because the field cycle and blanking period are different depending on the formats of the input image signal Sa and the output image signal Sb, there is provided a refresh mode which satisfies the condition of 4096 times/64 ms by dividing the refresh by inputting the vertical synchronous signal VDi twice or three times.

The operations of the SDRAM controller 202 shown in FIG. 25 will be described.

The mode set/refresh generator 302, the write address unit 303, the read address unit 304 and the read/write control unit 307 computes for mode set/refresh of the frame memory 201, a write address WADm of the frame memory 201, and a read-out address RADm of the frame memory 201 before write to and read-out from the frame memory 201 begin with an input of the vertical synchronous signal VDi. The reason why the write address unit 303 and the read address unit 304 are provided separately is that write to the frame memory 201 and read-out from the frame memory 201 are carried out independently of each other.

When the vertical synchronous signal VDi is inputted, a control flag for executing the mode set and refresh for the frame memory 201 is posted in the mode set/refresh generator 302. This control flag is supplied to the command generator 301. The command generator 301 generates a command necessary for control of the frame memory 201 based on the control flag. This command is supplied to the frame memory 201. Consequently, each time when the vertical synchronous signal VDi is inputted, the mode setting and refreshing of the frame memory 201 are carried out.

The write address WADi is supplied to each of the buffers 204Y, 204C from the input TG207 (see FIG. 3) corresponding to the effective pixel section in the horizontal direction at each line and the luminance signal Ya and the color-difference signals Ua/Va which constitute the input image signal Sa are written in successively.

After the effective pixel section in the horizontal direction is terminated at each line, the write request WRQ is supplied to the read/write control unit 307 from the input TG 207. In the meantime, the buffers 204Y, 204C need to store the luminance signal Ya and color-difference signals Ua/Va of a next line inputted newly until read-out is executed since the write request WRQ is dispatched. Thus, the dual port SRAM is used as these buffers 204Y, 204C.

The read/write control unit 307 judges write or read-out in the frame memory 201. When it determines that the frame memory is about to be in the write operation, it supplies a write flag WFL accompanying channel information to the read counter 305 and the write address unit 303. Consequently, a read-out address RADi is generated from the read counter 305 and supplied to the buffers 204Y, 204C and at the same time, a write address WADm is generated from the write address unit 303 and supplied to the frame memory 201 through the command generator 301.

The effective pixel section of the luminance signal Ya and color-difference signal Ua/Va, stored in the buffers 204Y and 204C temporarily at each line, is read out of the buffers 204Y, 204C, transferred to the frame memory 201 through the SDRAM bus 203 and written into a predetermined address of the frame memory 201. In this case, the luminance signal Ya and the color-difference signals Ua/Va are inputted to the buffers 204Y, 204C at the rate of 8 bits and input clock CKi. The luminance signal Ya and color-difference signals Ua/Va are converted to 32-bit data from the buffers 204Y, 204C to the frame memory 201 and transferred at the rate of the memory clock CKm (108 MHz). In this case, 2-channel data, that is, the luminance signal Ya and color-difference signals Ua/Va are transferred to the frame memory 201 through the SDRAM bus 203 in the time division fashion and written therein.

Further, a read-out request RRQ is supplied from the memory TG211 to the read/write control unit 307. The read/write control unit 307 judges write or read-out in the frame memory 201. If it is determined that the frame memory is about to be in the read-out operation, it supplies a read-out flag RFL accompanying channel information to the read address unit 304 and the write counter 306. Consequently, a read-out address RADm is generated from the read address unit 304 and supplied to the frame memory 201 through the command generator 301. A write address WADo is generated from the write counter 306 and supplied to the buffers 205Y, 205C.

Thus, each time when a read-out flag is generated from the read/write control unit 307 corresponding to the read-out request RRQ, 12-channel data is read out of the frame memory 201 synchronously with the memory clock CKm (108 MHz) and transferred to the buffer 205Y and buffer 205C through the SDRAM bus 203 and written therein. In this case, 12-channel data is transferred in the time division fashion.

After the 12-channel data is transferred from the frame memory 201 to the buffers 205Y, 205C corresponding to the read-out request RRQ as described above, the read-out address RADo is supplied from the memory TG211 (see FIG. 3) to the buffers 205Y, 205C and the write address WADr is supplied to the rate conversion unit 215Y, 215C (see FIG. 3).

Each time when the read-out request RRQ is generated, 12-channel data, after transferred from the frame memory 201 and stored in the buffers 205Y, 205C temporarily, is transferred to the rate conversion units 215Y, 215C and stored therein.

Figure 26:
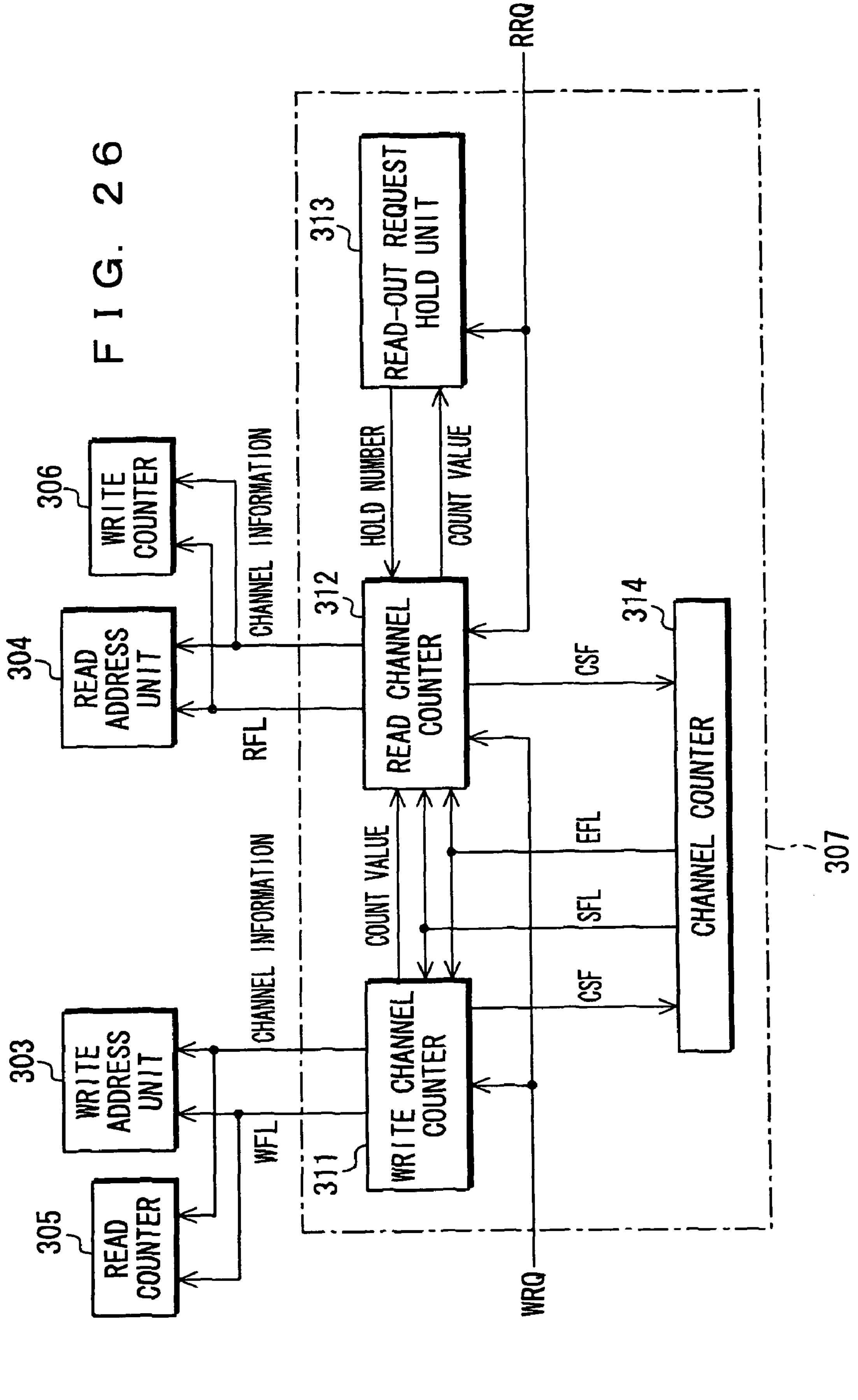
FIG. 26 is a block diagram showing a configuration of the read/write controller that constitutes the SDRAM controller.

FIG. 26 shows a configuration of a read/write control unit 307. This read/write control unit 307 is provided with a write channel counter 311, a read channel counter 312, a read-out request hold unit 313, and a channel counter 314. The write request WRQ generated in the input TG 207 (see FIG. 3) is supplied to the write channel counter 311 and the read channel counter 312. Further, the read-out request RRQ generated in the memory TG 211 (see FIG. 3) is supplied to the read channel counter 312 and the read-out request hold unit 313.

When receiving the write request WRQ, the write channel counter 311 sets up the number of write channels as its self count value and decrements it when write to each channel begins. When this count value reaches 0, the write operation is terminated. When setting the number of write channels as the self count value as described above, the write channel counter 311 sends a count start flag CSF to the channel counter 314 and starts the count of the channel counter 314.

When receiving a write request WRQ, the write channel counter 311 sets 2 as the self count value. The reason why 2 is set up in this way is that the luminance signal Ya and color-difference signals Ua/Va are written into the frame memory 201 separately, so that writing of 2-channel data is required.

When a read-out request RRQ is supplied or the read-out request RRQ is held in the request hold unit 313, the read channel counter 312 sets up the number of read-out channels as the self count value if write is not being ON when the count value of the write channel counter 311 is checked. When the read-out of each channel begins, the read channel counter 312 decrements the value. When this count value reaches 0, the read operation is terminated.

When the number of the read-out channels is set up as the self count value as described above, the read channel counter 312 sends a count start flag CSF to the channel counter 314 so as to start the count of the channel counter 314. When the write request WRQ and the read-out request RRQ are inputted at the same time as described above, the number of read-out channels is set up as the count value, however, no counter start flag CSF is supplied to the channel counter 314.

When receiving the count start flag CSF, the channel counter 314 starts the count operation thereof. In this case, the channel counter 314 increments the count value from 0 successively synchronous with the memory clock CKm (108 MHz) and if the count value reaches the maximum value corresponding to the data length of a channel, that count value is returned too, so that the condition gets into standby condition for input of the count start flag CSF.

Here, the maximum value corresponds to the number of clocks of the memory clock CKm corresponding to 1-channel data transfer time from the buffers 204Y, 204C to the frame memory 201, or from the frame memory 201 to the buffers 205Y, 205C. As described above, when the input image signal Sa is 480i signal, the number of the effective pixels in the horizontal direction is 720 pixels. Because 8-bit data is transferred in the form that it is converted to 32-bit data, the maximum value is MAX=720/4=180.

Further, when the count value turns to 1, the channel counter 314 generates a start flag SFL and supplies it to the write channel counter 311 and the read channel counter 312. Further, when the count value reaches the maximum value, the channel counter 314 generates an end flag EFL and supplies it to the write channel counter 311 and the read channel counter 312.

When the start flag SFL is supplied from the channel counter 314, the write channel counter 311 generates a write flag WFL accompanying channel information corresponding to the count value when the self count value is not 0, and supplies it to the read counter 305 and the write address unit 303 and further decrements the self count value.

Consequently, the read-out address RADi for reading out data of channel corresponding to the channel information is generated from the read counter 305. The write address WADm for writing data of a channel corresponding to the channel information is generated from the write address unit 303. Channel data corresponding to channel information is transferred from the buffers 204Y, 204C to the frame memory 201 and written therein.

When the end flag EFL is supplied from the channel counter 314, the write channel counter 311 generates the count start flag CSF for writing to a next channel when the self count value is not 0 and supplies it to the channel counter 314.

When the start flag SFL is supplied from the channel counter 314, the read channel counter 312 generates the read-out flag RFL accompanying channel information corresponding to the count value when the count value of the write channel counter 311 is 0 while the self count value is not 0, and supplies it to the read address unit 304 and the write counter 306 and then decrements the self count value.

Consequently, the read address unit 304 generates the read-out address RADm for reading out data of a channel corresponding to the channel information. The write counter 306 generates the write address WADo for writing data of a channel corresponding to the channel information. Data of channel corresponding to the channel information is transferred from the frame memory 201 to the buffers 205Y, 205C and written therein.

When the end flag EFL is supplied from the channel counter 314, the read channel counter 312 generates the count start flag CSF for reading a next channel when the count value of the write channel counter 311 is 0 while the self count value is not 0 and supplies it to the channel counter 314.

Further, when receiving the read-out request RRQ, the read-out request hold unit 313 increments the number of holds. Further, this read-out request hold unit 313 sets the number of read-out channels as a count value in the read channel counter 312 based on the read-out request RRQ and when the count value changes to 0, decrements the number of the holds.

The write side has no write request hold. The reason is that the write request WRQ has a precedence over the read-out and no write request WRQ is supplied in terms of timing during a write.

With the above-described structure, the standby condition of the read-out request RRQ and write request WRQ will be described. In an initial state in which no read-out or write is executed, this condition arises. The write channel counter 311, the read channel counter 312, the read request hold unit 313 and the channel counter 314 are in the initial state of having 0. The write channel counter 311 waits for input of the write request WRQ and the read channel counter 312 waits for an input of the read-out request RRQ. The read-out request hold unit 313 waits for the read-out request RRQ.

Next, an operation in case where a write request WRQ is supplied independently under the initial state will be described using "(1) writing/reading out independently" in FIGS. 27A-J.

When a write request WRQ is inputted synchronously with a horizontal synchronous signal HDi relating to the input image signal Sa (FIGS. 27A, B), the write channel counter 311 sets 2, which is the number of the write channel, as its self count value (FIG. 27E) and supplies the count start flag CSF to the channel counter 314. The channel counter 314 increments the count value synchronously with the memory clock CKm and when the count value reaches 1, the start flag SEL is generated. FIG. 27I shows the count value of the channel counter 314 and a unit not having 0 indicates that the condition changes gradually from 1 to the maximum value.

Thus, the write channel counter 311 generates the write flag WFL accompanying channel information (FIG. 27D). Consequently, write to the first channel begins. At this time, the write channel counter 311 decrements the self count value to 1 (FIG. 27E). FIG. 27J shows data transmission condition of the SDRAM bus 203.

When the count value of the channel counter 314 reaches the maximum value corresponding to a termination of the write to the first channel, the channel counter 314 generates the end flag EFL. The write channel counter 311 supplies the count start flag CSF to the channel counter 314 again because the self count value is not 0, but 1 (FIG. 27E). The channel counter 314 increments the count value synchronously with the memory clock CKm and when its count value changes to 1, the start flag SFL is generated.

Thus, the write channel counter 311 generates the write flag WFL accompanying channel information (FIG. 27D). As a result, the write to the second channel begins. At this time, the write channel counter 311 decrements the self count value to 0 (FIG. 27E).

Corresponding to the termination of the write to the second channel, that is, when the count value of the channel counter 314 reaches the maximum value, the channel counter 314 generates the end flag EFL. Because the self count value is 0, the write channel counter 311 refrains from generating of the count start flag CSF and the like. Consequently, the write in the same amount as of two channel is terminated by inputting the write request WRQ.

Next, the operation in case where the read-out request RRQ is supplied independently under the initial state will be described using "(1) writing/reading out independently" in FIGS. 27A-J.

When the read-out request PRQ is inputted (FIG. 27C), the read channel counter 312 sets the number of read-out channels as the self count value (FIG. 27G) because the count value of the write channel counter 311 is 0 (FIG. 27E). Although the number of the read-out channels is actually 12, it is set to 4 for convenience in the examples of FIGS. 27A-J. If a read-out request RRQ is inputted (FIG. 27C), the read-out request hold unit 313 increments the number of holds to 1 (FIG. 27H).

After the read channel counter 312 sets up the number of read-out channels, it supplies the count start flag CSF to the channel counter 314. The channel counter 314 increments the count value synchronously with the memory clock CKm and when the count value reaches 1, generates a start flag SFL. Thus, the read channel counter 312 generates the read-out flag RFL accompanying the channel information (FIG. 27F). Consequently, reading of the first channel begins. At this time, the read channel counter 312 decrements the self count value (FIG. 27G).

Corresponding to the termination of read-out from the first channel, that is, when the count value of the channel counter 314 reaches its maximum value, the channel counter 314 generates the end flag EFL. The read channel counter 312 supplies the count start flag CSF to the channel counter 314 again because the count value of the write channel counter 311 is 0 while the self count value is not 0. The channel counter 314 increments the count value synchronously with the memory clock CKm and when the count value reaches 1, generates a start flag SFL.

Thus, the read channel counter 312 generates the read-out flag RFL accompanying the channel information (FIG. 27F). As a result the read-out of the second channel begins. At this time, the read channel counter 312 further decrements the self count value (FIG. 27G).

In the same way, read-out up to a last channel is carried out. Corresponding to the termination of read-out of the last channel, that is, when the count value of the channel counter 314 reaches its maximum value, the channel counter 314 generates the end flag EFL. The read channel counter 312 refrains from generating of the count start flag CSF or the like because the self count value is 0. Consequently, read-out by the same number as read-out channels by an input of the read-out request RRQ is terminated. In the meantime, the read request hold unit 313 decrements the number of holds when the count value of the read channel counter 312 changes to 0.

Next, the operation in case where the write request WRQ and the read-out request RRQ are inputted at the same time under the initial state will be described.

Although the read channel counter 312 sets up the number of read-out channels as the self count value because it sees both the read-out request RRQ and write request WRQ, it refrains from supplying the count start flag CSF to the channel counter 314.

In this case, the write channel counter 311 sets up 2 which is the number of write channels as its self count value and supplies the count start flag CSF to the channel counter 314. For the reason, the write is carried out in the same way as when the write request WRQ is supplied independently.

When the channel counter 314 generates the end flag EFL corresponding to the termination of the write to the second channel, as described above, the write channel counter 311 refrains from generating of the count start flag CSF or the like because the self count value is 0 and then, the write operation is terminated.

Because in this case, the count value of the write channel counter 311 is 0 and the self count value is not 0, the read channel counter 312 supplies the count start flag CSF to the channel counter 314. Consequently, after the write operation has ended, the read-out operation is started. This read-out operation is carried out in the same way as when the read-out request RRQ is supplied independently.

Next, the operation in case where the read-out request RRQ is supplied during the write operation will be described using "(2) reading out during write" in FIGS. 27A-J.

When a read-out request RRQ is inputted during the write operation (FIG. 27C), the read channel counter 312 refrains from setting the number of read-out channels as the self count value and supplying the count start flag CSF to the channel counter 314 because the count value of the write channel counter 311 is not 0.

In this case, the read-out request hold unit 313 increments the number of holds of the read-out request RRQ to 1 (FIG. 27H). The read channel counter 312 determines whether or not the write operation is being executed based on a count value of the write channel counter 311. That is, when the count value is not 0, it is determined that the write operation is being executed and when the count value is 0, it is determined that the write operation is not being executed.

When the channel counter 314 generates the end flag EFL corresponding to the termination of the write to the second channel as described above, the write channel counter 311 refrains from generating of the count start flag CSF or the like because the self count value is 0 and then, the write operation is terminated.

In this case, the read channel counter 312 refrains from setting of the number of read-out channels as the self count value and supplying of the count start flag CSF to the channel counter 314 because the count value of the write channel counter 311 is 0 but the self count value is 0 also.

However, when the read-out request RRQ is held in the read-out request hold unit 313, the read channel counter 312 sets up the number of read-out channels as the self count value (FIG. 27G) and after that, it supplies the count start flag CSF to the channel counter 314. Consequently, after the write operation has terminated, the read-out operation begins. This read-out operation is executed in the same way as when the aforementioned read-out request RRQ is supplied independently. When the read-out operation is terminated and the count value of the read channel counter 312 changes to 0, the read-out request hold unit 313 decrements the number of holds to 0 (FIG. 27H).

The read channel counter 312 determines whether or not the read-out request RRQ is held based on the number of holds in the read-out request hold unit 313. That is, when the number of holds is not 0, it is determined that holding is executed and when the number of holds is 0, it is determined that the holding is not carried out.

Figure 27:
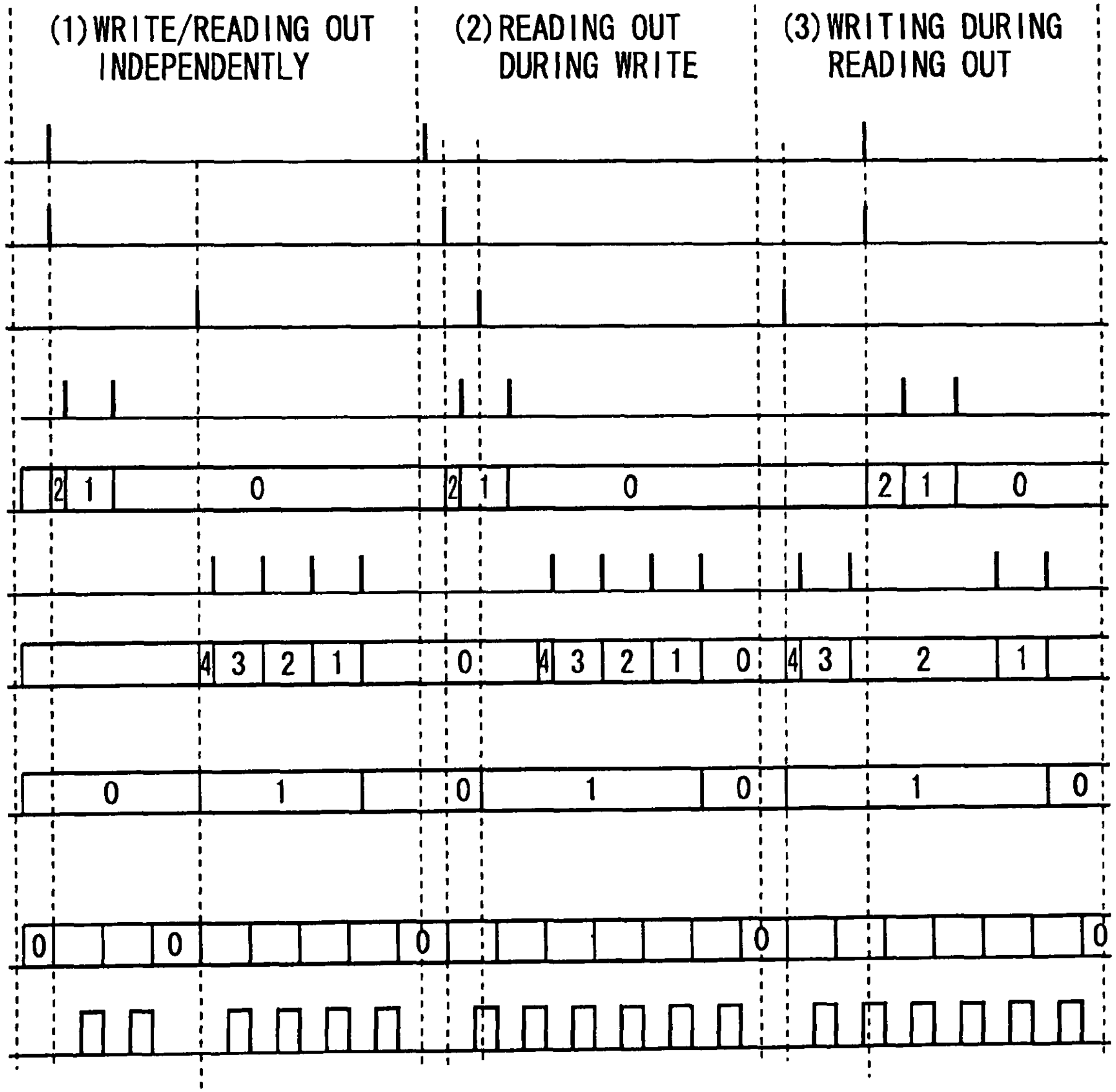
FIGS. 27A-J are timing charts for illustrating the operations of the read/write controller.

Next, the operation in case where a read-out request WRQ is supplied during the read-out operation will be described using "(3) writing during reading out" in FIG. 27.

When the write request WRQ is inputted (FIG. 27B), the write channel counter 311 sets 2, which is the number of write channels, as its self count value (FIG. 27E) and supplies the count start flag CSF to the channel counter 314. In this case, because the read-out operation is being executed, the channel counter 314 has already started its count operation based on the count start flag CSF from the read channel counter 312 (FIG. 27I).

When the count value of the channel counter 314 reaches the maximum value corresponding to the termination of this read-out channel, the channel counter 314 generates the end flag EFL. Because the count value of the write channel counter 311 is not 0, the read channel counter 312 refrains from supplying of the count start flag CSF to the channel counter 314.

At this time, because the self count value is not 0, the write channel counter 311 generates the count start flag CSF and supplies it to the channel counter 314. Consequently, the read-out operation is stopped temporarily and the write operation is started.

If as described above, the end flag EFL is generated in the channel counter 314 corresponding to the termination of write to the second channel, the write channel counter 311 refrains from generating of the count start flag CFS because the self count value is 0 and then, the write operation terminates.

In this case, the read channel counter 312 supplies the count start flag CSF to the channel counter 314 because although the count value of the write channel counter 311 is 0, the self count value is not 0 (the count value is 2 in the example shown in FIGS. 27A-J). Consequently, after the write operation has terminated, the read-out operation restarts. When the read operation ends and the count value of the read channel counter 312 reaches 0, the number of holds is decremented to 0 (FIG. 27H).

Figure 28:
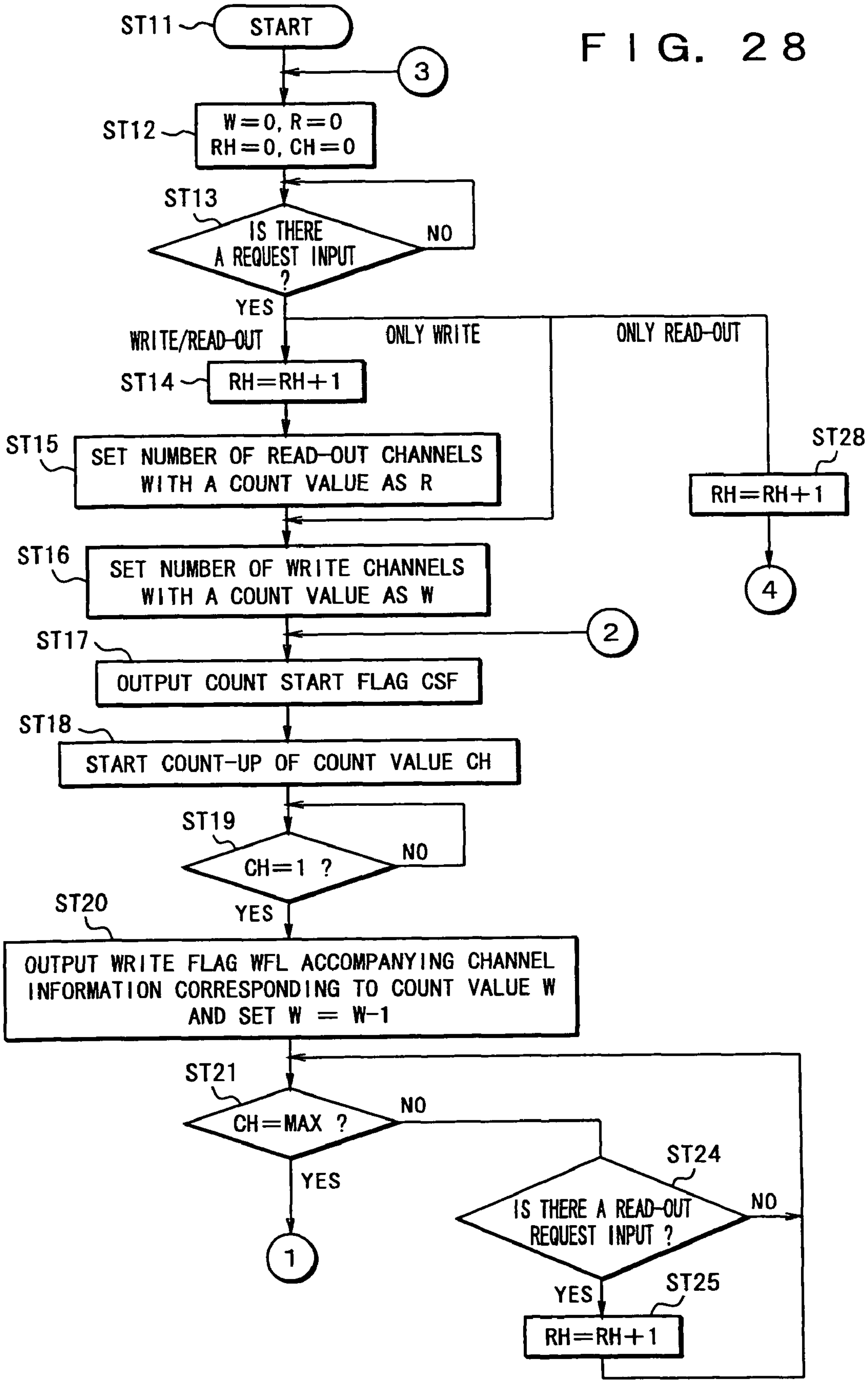
FIG. 28 is a flow chart (1/2) showing processing procedure for achieving the operation of the read/write controller with software.
Figure 29:
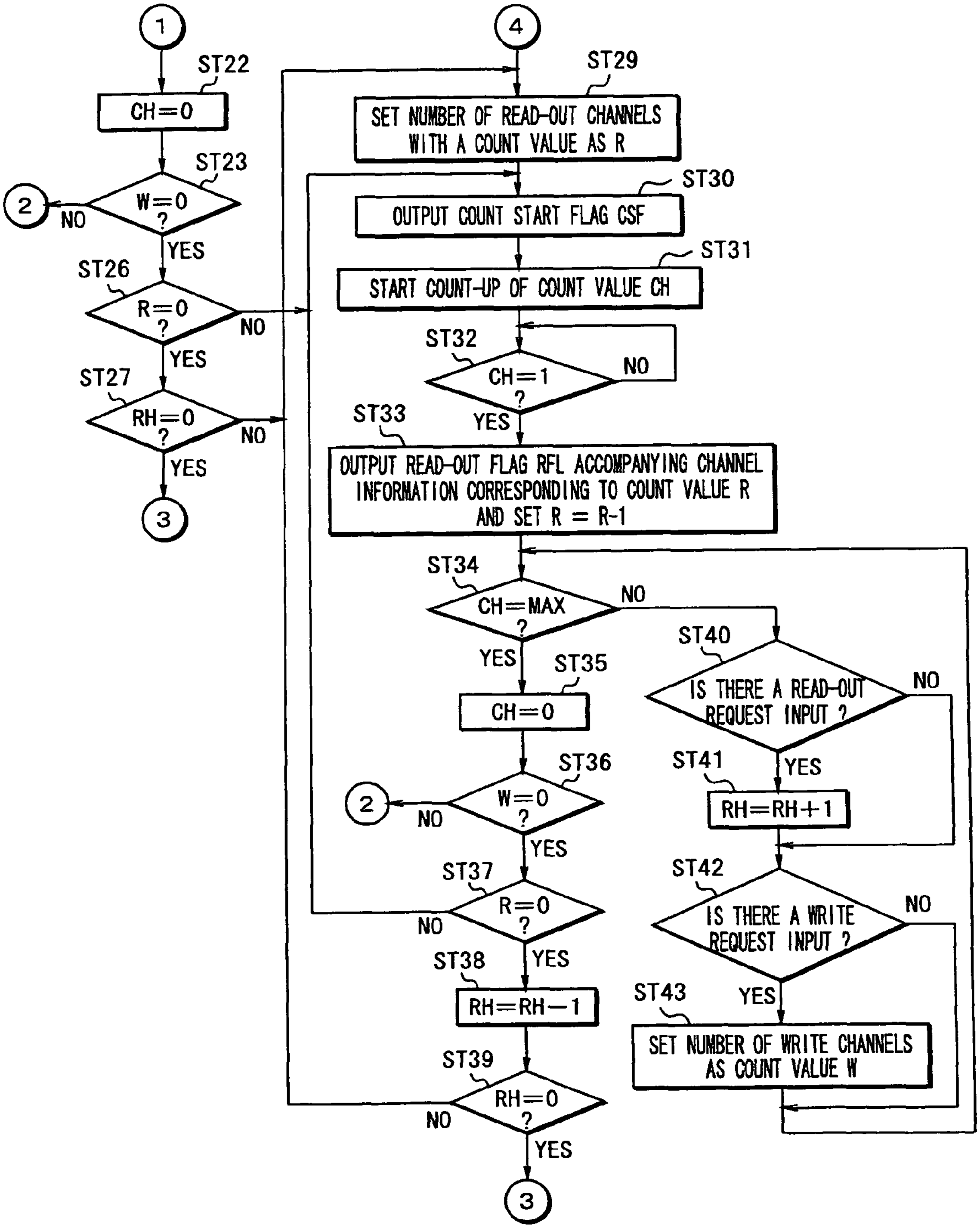
FIG. 29 is a flow chart (2/2) showing the processing procedure for achieving the operation of the read/write controller with software.

The flow charts of FIGS. 28, 29 show a procedure of processing for achieving the operation of the aforementioned read/write control unit 307 with software.

First, the processing is started at step ST11 and in step ST12, it is set that W=0, R=0, RH=0 and CH=0. Here, W corresponds to the count value of the write channel counter 311, R corresponds to the count value of the read channel counter 312, RH corresponds to the number of holds in the read-out request hold unit 313, and CH corresponds to the count value of the channel counter 314.

Next, in step ST13, whether or not request input arises is determined. If both the write request WRQ and the read-out request RRQ exist, the hold number RH of the read-out request RRQ is incremented in step ST 14. Then, in step ST15, the number of read-out channels, for example, 12 is set up as the count value R. In step ST16, 2, which is the number of write channels, are set up as the count value W.

If only the write request WRQ is inputted in step ST13, the procedure proceeds to step ST16 immediately and then, 2, which is the number of write channels, are set as the count value W. After the processing of step ST16, the procedure proceeds to step ST17. In this step ST17, the count start flag CSF is outputted. Then, in step ST18, count up of the count value CH is started. This count up is executed synchronously with the memory clock CKm.

Next, in step ST19, whether or not CH=1 is set is determined. If CH=1, a write flag WFL accompanying channel information corresponding to the count value W is outputted and supplied to the read counter 305 and the write address unit 303 (see FIG. 26). In this step ST20, the count value W is decremented. After the processing of step ST20, the procedure proceeds to step ST21.

In step ST21, whether or not CH=MAX is set is determined. If CH=MAX is set, in step ST22, the count up is stopped with CH=0. Then, in step ST23, whether or not the count value W is 0 is determined. Unless W=0, the procedure returns to step ST17, in which write processing for a next channel is carried out.

Unless CH=MAX is set in the step ST21, in step ST24, whether or not a read-out request RRQ is inputted is determined. If the read-out request RRQ is inputted, the hold number RH of the read-out request RRQ is incremented in step ST25. If no read-out request RRQ is inputted in step ST24 or after the processing of step ST25, the procedure returns to step ST21. Consequently, when the read-out request RRQ is inputted during a write operation, that read-out request RRQ is held.

When W=0 is set in the step ST23, the write ends. Then, whether or not the count value R is 0 is determined in step ST26. If R=0 is set up, whether or not the hold number RH of the read-out request RRQ is 0 is determined in step ST27. If RH=0 is set up, no interruption of reading or holding of the read-out request RRQ arises, and thus, the procedure returns to step ST12, in which the standby condition arises.

If only the read-out request RRQ is inputted in the aforementioned step ST13, the hold number RH is incremented in step ST28 and after that, the procedure proceeds to step ST29. In this step ST29, the number of the read-out channels, for example, 12 is set up as the count value R. Then, in step ST30, a count start flag CSF is outputted. Unless R=0 is set up in the step ST26, the procedure proceeds to step ST30. Then, in step ST31, the count-up of the count value CH is started. This count-up is executed synchronously with the memory clock CKm.

Next, in step ST32, whether or not CH=1 is set up is determined. If CH=1 is set up, a read-out flag RFL accompanying channel information corresponding to the count value R is outputted in step ST33 and supplied to the read address unit 304 and write counter 306 (see FIG. 26). Further, the count value R is decremented in this step ST33. After the processing of this step ST33, the procedure proceeds to step ST34.

In step ST34, whether or not CH=MAX is set up is determined. If CH=MAX is set up, in step ST35, the count-up is stopped with CH=0. Then, in step ST36, whether or not the count value W is 0 is determined. Unless W=0 is set up, it means that the write request WRQ is inputted during read-out operation as described later and the procedure returns to step ST17, in which the write processing is executed. On the other hand, when W=0 is set up in step ST36, the procedure returns to step ST37.

In this step ST37, whether or not the count value R is 0 is determined. Unless R=0 is set up, the procedure returns to step ST30, in which the procedure proceeds to a read-out processing for a next channel. On the other hand, when R=0 is set up, the hold number RH of the read-out request RRQ is decremented in step ST38 because read-out of the same number as that of the read-out channels terminates.

Next, whether or not the hold number RH is 0 is determined in step ST39. Unless RH=0 is set up, the procedure returns to step ST29, in which the procedure proceeds to read-out processing corresponding to a next read-out request RRQ held. On the other hand, when RH=0 is set up, the procedure returns to step ST12, in which the standby condition arises, because any read-out request RRQ is not held.

Unless CH=MAX is set up in the step ST34, whether or not any read-out request RRQ is inputted is determined in step ST40. If any read-out request RRQ is inputted, the hold number RH of the read-out request RRQ is incremented in step ST 41 and after that, the procedure proceeds to step ST42. Unless any read-out request RRQ is inputted in step ST40, the procedure proceeds to step ST42 immediately. Consequently, if any read-out request RRQ is inputted during the read-out operation, that read-out request RRQ is held.

In step ST42, whether or not any write request WRQ is inputted is determined. If any write request WRQ is inputted, 2, which is the number of write channels, are set up as the count value W in step ST43. Unless any write request WRQ is inputted in step ST42 or after the processing in step ST43, the procedure returns to step ST34. Consequently, if any write request WRQ is inputted during the read-out operation, the read-out processing is stopped in the step ST36 and then, the procedure proceeds to write processing.

Unless R=0 is set up in step ST26, the procedure proceeds to step ST30, in which the read-out processing arises. If the read-out request RRQ is inputted at the same time when the write request WRQ arises or if the write request WRQ is inputted during the read-out operation and the read-out processing is stopped, the procedure changes to the read-out processing after the write operation ends.

As described above, in the SDRAM controller 202 shown in FIG. 25, the write with the write request WRQ and read-out with the read-out request RRQ are controlled by the read/write control unit 307. In this case, the write with the write request WRQ has a precedence over a read-out with the read-out request RRQ and the write and read-out performed through the same SDRAM bus 203 are adjusted. Consequently, as described above, the read-out request RRQ can be inputted every predetermined time and then read out regardless of the write timing with the write request WRQ.

Instead of it that the write request WRQ has a precedence over the read-out request RRQ, the read-out request RRQ may have a precedence over the write request WRQ. In that case, because the adjustment of the write and read-out through the same SDRAM bus 203 is carried out, it is possible to input the read-out request RRQ every predetermined time and then read out regardless of the write timing by the write request WRQ.

As described above, the number of the write channels is 2 and the number of the read-out channels is, for example, 12. Thus, if the write request WRQ has a precedence over the read-out request RRQ, read-out waiting time by the read-out request RRQ is for two channels max. However, if the write request WRQ has a precedence over the read-out request RRQ, the write waiting time by the write request WRQ is the same as the number of read-out channels max, for example, for 12 channels.

The write request WRQ is generated synchronously with a horizontal synchronous signal HDi of the input image signal Sa. If this input image signal Sa is, for example, a reproduction signal of video tape recorder (VTR), deflection occurs in the horizontal cycle. However, as described above, the SDRAM controller 202 shown in FIG. 25 can input the read-out request RRQ every predetermined time and read out it regardless of the write timing by the write request WRQ. Thus, by using the SDRAM controller 202 shown in FIG. 25, the deflection in the horizontal cycle of the input image signal Sa can be absorbed and a circuit of a time base corrector (TBC) or the like for absorbing that deflection can be omitted.

Figures 30A, 30B:
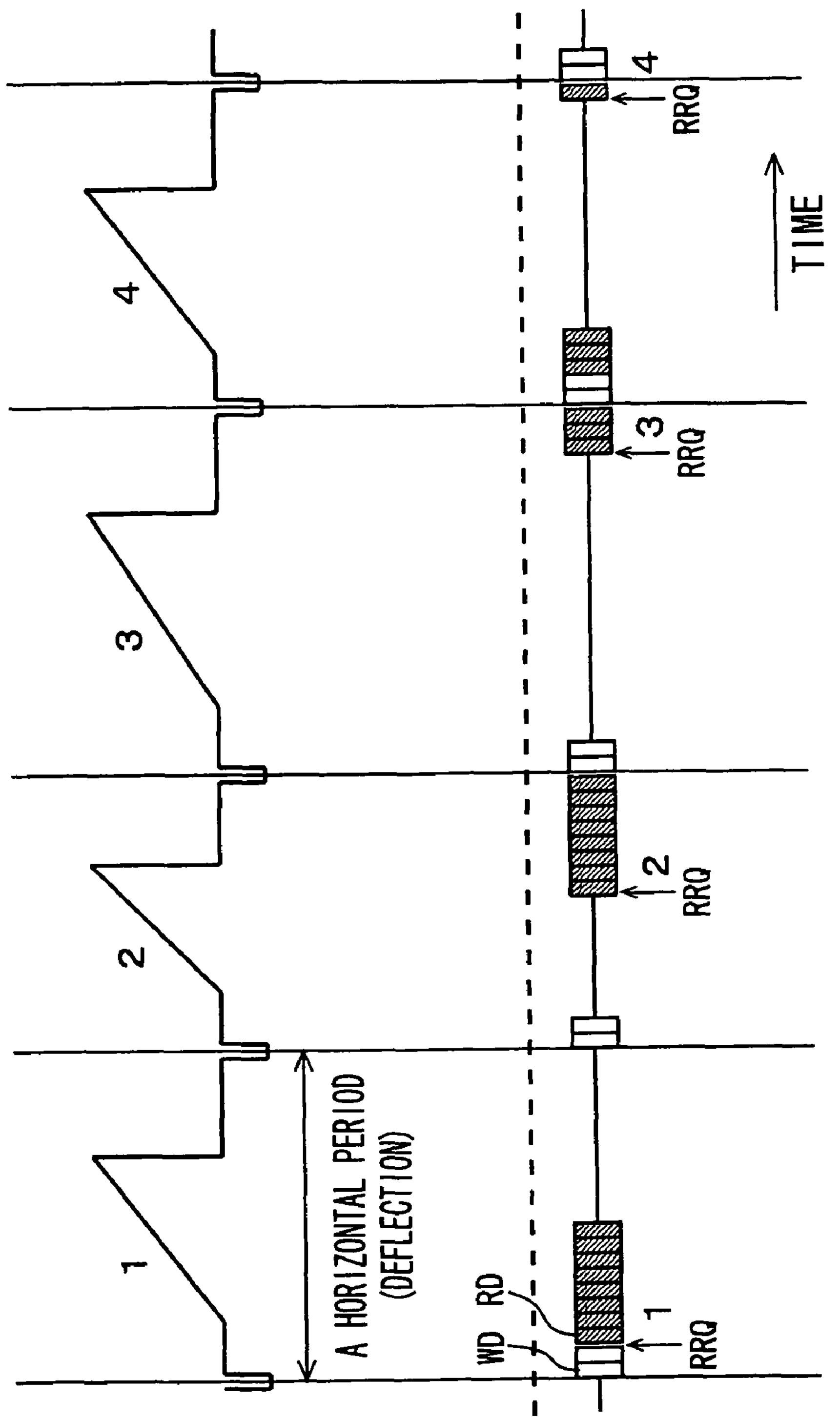
FIGS. 30A, 30B are diagrams showing a timing of the input image signal Sa and an example of data transmission condition of the SDRAM bus.

FIGS. 30A, B show an example of timing of the input image signal Sa and data transmission condition of the SDRAM bus 203. FIG. 30A shows the input image signal Sa, stressing deflections in its horizontal period. FIG. 30B shows the data transmission condition of the SDRAM bus 203. In this example, the number of the write channels is 2 and the number of the read-out channels is 8. Further, WD indicates data of the same amount as a channel for write and RD indicates data of the same amount as a channel for read-out.

Next, returning to FIG. 1, the image-signal-processing unit 106 will be described more in detail.

As described above, the rate conversion circuit 105 outputs an image signal Sc in which the quantities of pixels in the horizontal direction and vertical direction are converted. This image signal Sc is comprised of the luminance signal Yc and the color-difference signals Uc, Vc. In this case, signals of 18 lines×horizontal five taps extended in the time direction, vertical direction and horizontal direction are outputted as the luminance signal Yc in parallel. Likewise, as each of the color-difference signals Uc, Vc, signals of 4 lines×horizontal five taps extended in the time direction, vertical direction and horizontal direction are outputted in parallel.

The image-signal-processing unit 106 executes processing for the luminance signal Yc and color-difference signals Uc, Vc independently. However, these processes are similar ones. Thus, here, the process for the luminance signal Yc and the color-difference signals Uc, Vc will be described as a process for the image signal Sc.

Based on an image signal Sc outputted from the rate conversion circuit 105, the image-signal-processing unit 106 includes a class tap extracting circuit 121 for extracting multiple items of pixel data located around a target position of the image signal Sb as class tap as a second data extracting means. According to this embodiment, the target position of the image signal Sb moves in order of raster scanning. Then, the rate conversion circuit 105 outputs multiple items of pixel data located around the target position corresponding to each target position.

In this case, in a processing for the luminance signal Yc, predetermined multiple items of intensity data are extracted as class tap from the intensity data of 18×5=90 outputted in parallel from the rate conversion circuit 105 corresponding to each target position of the image signal Sb. Likewise, in a processing for each of the color-difference signals Uc, Vc, predetermined multiple items of color-difference data are extracted as class tap from the color-difference data of 4×5=20 outputted in parallel from the rate conversion circuit 105 corresponding to each target position of the image signal Sb.

The image-signal-processing unit 106 includes a class classification circuit 122 for obtaining a class code CL indicating a class to which the pixel data of a target position in the image signal Sb belongs based on the class tap extracted by the class tap extracting circuit 121. This class classification is executed using any compression processing such as adaptive dynamic range coding (ADRC), prediction coding (DPCM), vector quantization (VQ) and the like.

A case of executing the ADRC with K bits will be described. In the K-bit ADRC, dynamic range DR=MAX−MIN, which is a differential between the maximum value and minimum value of pixel data contained in the class tap, is detected and each pixel data contained in the class tap is re-quantized based on this dynamic range DR.

That is, as for each pixel data included in the class tap, minimum value MIN is subtracted from the pixel data and that subtraction value undergoes subtraction (quantization) by $DR2^K$. Consequently, each pixel data constituting the class tape is re-quantized to K bits and bit strings arranged in a predetermined order are outputted as the class code CL.

Thus, in a 1-bit ADRC, the minimum value MIN is subtracted from each pixel data included in this class tap and the subtraction value undergoes subtraction with DR/2. Consequently, each pixel data included in the class tap is re-quantized to 1-bit and bit strings arranged in a predetermined order are outputted as the class code CL.

This image-signal-processing unit 106 has read only memory (ROM) 123. This ROM 123 stores coefficient seed data of each class. An estimated prediction-computing circuit 126, which will be described later, obtains pixel data y of a target position in the image signal Sb from the pixel data xi and coefficient data Wi as the prediction tap according to the following estimation equation (1).

$$y = \sum_{i=1}^{n} W_i \cdot x_i \tag{1}$$

wherein, "n" is the number of pixel data xi as the prediction tap.

The coefficient seed data stored in the ROM 123 is coefficient data of a generation equation with phase information "h, v" and image quality adjustment information "f, g" as parameters for generating the coefficient data Wi (i=1 to n) of the aforementioned estimation equation. The following equation (2) indicates an example of the generation equation. Here, the phase information "h" refers to phase information in the horizontal direction and the phase information "v" refers to phase information in the vertical direction. Further, the image quality adjustment information "f" refers to image quality adjustment information for adjusting the resolution and the image quality adjustment information "g" refers to image quality adjustment information for adjusting the noise suppression degree. The ROM 123 stores coefficient seed data for wi0-wi30 (i=1 to n), for each class, which is coefficient data in, for example, the generation equation (2). The generation method of the coefficient seed data will be described later.

$$\begin{aligned} W_i = {} & w_{i0} + w_{i1}f + w_{i2}g + w_{i3}f^2 + w_{i4}fg + w_{i5}g^2 + w_{i6}f^3 + \\ & w_{i7}f^2g + w_{i8}fg^2 + w_{i9}g^3 + w_{i10}v + w_{i11}vf + w_{i12}vg + \\ & w_{i13}vf^2 + w_{i14}vfg + w_{i15}vg^2 + w_{i16}h + w_{i17}hf + w_{i18}hg + \\ & w_{i19}hf^2 + w_{i20}hfg + w_{i21}hg^2 + w_{i22}v^2 + w_{i23}v^2f + w_{i24}v^2g + \\ & w_{i25}vh + w_{i26}vhf + w_{i27}vhg + w_{i28}h^2 + w_{i29}h^2f + w_{i30}h^2g \end{aligned} \tag{2}$$

The image-signal-processing unit 106 has a coefficient-generating circuit 124 for generating coefficient data Wi for obtaining the pixel data at a target position in the image signal Sb. This coefficient-generating circuit 124 reads out the coefficient seed data wi0-wi30 of classes indicated with the class code CL obtained by a class classification circuit 122 and generates coefficient data Wi using the phase information "h, v" of a target position in the image signal Sb outputted from the rate conversion circuit 105 and the image quality adjustment information "f, g" supplied from the system controller 101 according to the generation equation (2).

Here, the phase information "h, v" are phase information "phy, pvy" obtained by the output TG 217 (see FIG. 3) of the rate conversion circuit 105 in a processing for the luminance signal Yc and on the other hand, in a processing for the color-difference signal Uc, Vc, phase information "phc, pvc" obtained by the output TG 217 (see FIG. 3) of the rate conversion circuit 105. Because there exist the tap building circuits 221Y, 221C in the image signal Sc system between the phase information "h, v" and image signals Sc outputted from the rate conversion circuit 105, deflection of time occurs.

For the reason, although not shown, a delay circuit for time adjustment is disposed on, for example, the system of phase information "h, v". Because according to this embodiment, the output start delay in the tap building circuits 221Y, 221C is fixed regardless of the conversion magnification of the number of pixels, a fixed delay circuit may be used.

The image-signal-processing unit 106 has a prediction-tap-extracting circuit 125 for extracting multiple items of image data located around a target position in the image signal Sb as the prediction tap based on the image signal Sc outputted from the rate conversion circuit 105, as a first data extracting means.

In this case, in the processing for the luminance signal Yc, predetermined multiple items of intensity data are extracted as the prediction tap from intensity data of 18×5=90 outputted in parallel from the rate conversion circuit 105 corresponding to each target position of the image signal Sb. Likewise, in the processing for each of the color-difference signals Uc, Vc, predetermined multiple items of color-difference data are extracted as the prediction tap from color-difference data of 4×5=20 outputted in parallel from the rate conversion circuit 105 corresponding to each target position of the image signal Sb.

The image-signal-processing unit 106 has the estimated prediction-computing circuit 126. This estimated prediction-computing circuit 126 computes the pixel data of a target position in the image signal Sb using pixel data xi (i=1 to n) as a prediction tap extracted by the prediction-tap-extracting circuit 125 and coefficient data Wi (i=1 to n) generated in the coefficient-generating circuit 124 according to the estimation equation (1). The pixel data y of each target position in the image signal Sb computed successively by this estimated prediction-computing circuit 126 is outputted to the output terminal 107.

Next, the operations of the image-signal-processing unit 106 will be described.

The image signal Sc outputted from the rate conversion circuit 105 is supplied to the class-tap-extracting circuit 121. This class-tap-extracting circuit 121 extracts multiple items of pixel data located around a target position in the image signal Sb as a class tap based on the image signal Sc.

A class tap extracted by the class-tap-extracting circuit 121 is supplied to the class classification circuit 122. This class classification circuit 122 carries out compression processing such as ADRC upon multiple items of pixel data as the class tap so as to obtain a class code CL expressing the class to which pixel data of the target position in the image signal Sb belongs. This class code CL is supplied to the coefficient-generating circuit 124.

This coefficient-generating circuit 124 is supplied with the phase information "h, v" of the target position in the image signal Sc from the rate conversion circuit 105 and further supplied with the image quality adjustment information "f, g" from the system controller 101. As a result, the coefficient generating circuit 124 reads coefficient seed data wi0-wi30 (i=1 to n) expressing the class code CL out of the ROM 123 corresponding to each target position in the image signal Sc and generates coefficient data Wi (i=1 to n) using the phase information "h, v" and the image quality adjustment information "f, g" according to the generation equation (2).

The image signal Sc outputted from the rate conversion circuit 105 is supplied to the prediction-tap-extracting circuit 125. This prediction-tap-extracting circuit 125 extracts multiple items of pixel data located around a target position in the image signal Sb as a prediction tap based on the image signal Sc. The pixel data xi as this prediction tap is supplied to the estimated prediction-computing circuit 126. This estimated prediction-computing circuit 126 is also supplied with the coefficient data Wi generated by the coefficient-generating circuit 124.

This estimated prediction-computing circuit 126 computes pixel data y of a target position in the image signal Sb corresponding to each target position in the image signal Sb using pixel data xi (i=1 to n) as a prediction tap extracted by the prediction tap extracting circuit 125 and coefficient data Wi (i=1 to n) generated by the coefficient generating circuit 124 according to the estimation equation. The pixel data y of each target position in the image signal Sb, computed successively by this estimated prediction-computing circuit 126, is outputted to the output terminal 107.

This image-signal-processing unit 106 aims at acquiring the pixel data y at each target position in the image signal Sb based on the image signal Sc, which is outputted from the rate conversion circuit 105 and converted to the same rate as that of the image signal Sb, and accompanies no processing for rate conversion. Thus, this unit can be constructed easily.

This image-signal-processing unit 106 uses multiple items of pixel data located around a certain target position outputted in parallel from the rate conversion circuit 105 corresponding to each target position in the image signal Sb, and the class-tap-extracting circuit 121 and the prediction-tap-extracting circuit 125 can be constructed with only a latch circuit. Thus, any delay circuit or the like for expansion in the time direction, vertical direction, and horizontal direction is not required.

As described above, the horizontal five taps obtained corresponding to each pixel position in the effective pixel section of the luminance signal Yc and color-difference signals Uc, Vc by the tap-building circuits 221Y, 221C are obtained in an arrangement of the intensity data and color-difference data in the luminance signal Ya and color-difference signals Ua, Va before rate conversion without depending on the magnification of the number of pixels. Thus, even if the magnification of the number of pixels is changed, the relationship between this horizontal five taps and the phase information "h, v" based on the pixel position of the luminance signal Ya and color-difference signals Ua, Va never collapse, so that the image-signal-processing unit 106 can generate pixel data at a target position in the image signal Sb excellently.

As described above, in the tap building circuits 221Y, 221C, output start delay until the horizontal five taps are outputted from the shift register since a pixel data string of image signal after rate conversion is inputted to the shift register at each line is fixed to clock time (no+ni) without depending on the magnification of the number of pixels. Therefore, in the image-signal-processing unit 106, time adjustment between this horizontal five taps and the phase information "h, v" can be carried out with a fixed delay circuit, and therefore, a variable delay circuit capable of changing the delay time depending on the magnification of the number of pixels is not required.

Further, the image-signal-processing unit 106 uses the phase information "h, v" obtained in the output TG 217 of the rate conversion circuit 105 as the phase information "h, v" of the target position in the image signal Sb and any circuit generating this phase information "h, v" is not required.

As described above, the coefficient seed data wi0-wi30 (i=1 to n) is stored about each class in the ROM 123. This coefficient seed data is generated as a result of learning preliminarily.

First, an example of this generating method will be described. An example for obtaining the coefficient seed data wi0-wi30, which is coefficient data in the generation equation (2), will be shown here.

Here, tj (j=0 to 30) is defined as shown in the equation (3) for following explanation.

T0=1, t1=f, t2=g, t3=f2, t4=fg, t5=g2, t6=f3, t7=f2g, t8=fg2, t9=g3, t10=v, t11=vf, t12=vg, t13=vf2, t14=vfg, t15=vg2, t16=h, t17=hf, t18=hg, t19=hf2, t20=hfg, t21=hg2, t22=v2, t23=v2f, t24=v2g, t25=vh, t26=vhf, t27=vhg, t28=h2, t29=h2f, t30=h2g (3)

The equation (2) can be rewritten to the equation (4) by using the equation (3).

Finally, an unspecified coefficient wij is obtained by learning. That is, by using $$W_i = \sum_{j=0}^{30} w_{ij} \times t_i \tag{4}$$

pixel data of student signal and pixel data of teacher signal for each class, a coefficient which minimizes the square error is determined. This is based on a solution method by least squares method. Assuming that the number of learning is m, residual in learning data of k (1<k<m) is ek and the sum of square error is E, E is expressed in the form of the equation (5) using the equations (1) and equation (2).

$$\begin{aligned} E &= \sum_{k=1}^{m} e_k^2 \\ &= \sum_{k=1}^{m} [y_k - (w_1 x_{1k} + w_2 x_{2k} + \dots + w_n x_{nk})]^2 \\ &= \sum_{k=1}^{m} \{y_k - [(t_0 w_{10} + t_1 w_{11} + \dots + t_{30} w_{130}) x_{1k} + \dots + \\ &\quad (t_0 w_{n0} + t_1 w_{n1} + \dots + t_{30} w_{n30}) x_{nk}]\}^2 \end{aligned} \tag{5}$$

wherein, xik expresses k pixel data at an i estimation tap position of the student image and yk expresses k pixel data of a corresponding teacher image.

According to the solution method by the least squares method, wij in which partial differential of the equation (5) by wij is 0 is acquired. This is expressed in the equation (6).

$$\frac{\partial E}{\partial w_{ij}} = \sum_{k=1}^{m} 2\left(\frac{\partial e_k}{\partial w_{ij}}\right) e_k = -\sum_{k=1}^{m} 2 t_j x_{ik} e_k = 0 \tag{6}$$

If Xipjq, Yip are defined as expressed in the equations (7), (8), the equation (6) can be rewritten to the equation (9) using matrix.

$$X_{ipjq} = \sum_{k=1}^{m} x_{ik} t_p x_{jk} t_q \tag{7}$$

$$Y_{ip} = \sum_{k=1}^{m} x_{ik} t_p y_k \tag{8}$$

-continued $$\begin{bmatrix} x_{1010} & x_{1011} & x_{1012} & \cdots & x_{10130} & x_{1020} & \cdots & x_{10n30} \\ x_{1110} & x_{1111} & x_{1112} & \cdots & x_{11130} & x_{1120} & \cdots & x_{11n30} \\ x_{1210} & x_{1211} & x_{1212} & \cdots & x_{12130} & x_{1220} & \cdots & x_{12n30} \\ \vdots & \vdots & \vdots & \ddots & \vdots & \vdots & \ddots & \vdots \\ x_{13010} & x_{1301} & x_{13012} & \cdots & x_{130130} & x_{13020} & \cdots & x_{130n30} \\ x_{2010} & x_{2011} & x_{2012} & \cdots & x_{20130} & x_{2020} & \cdots & x_{20n30} \\ \vdots & \vdots & \vdots & \ddots & \vdots & \vdots & \ddots & \vdots \\ x_{n3010} & x_{n3011} & x_{n3012} & \cdots & x_{n30130} & x_{n3020} & \cdots & x_{n30n30} \end{bmatrix} \begin{bmatrix} w_{10} \\ w_{11} \\ w_{12} \\ \vdots \\ w_{130} \\ w_{20} \\ \vdots \\ w_{n30} \end{bmatrix} = \begin{bmatrix} Y_{10} \\ Y_{11} \\ Y_{12} \\ \vdots \\ Y_{130} \\ Y_{20} \\ \vdots \\ Y_{n30} \end{bmatrix} \quad (9)$$

This equation (9) is generally referred as to normal equation. According to this normal equation, wij is solved based on sweeping-out method (Gauss-Jordan elimination method) to compute coefficient seed data.

Figure 31:
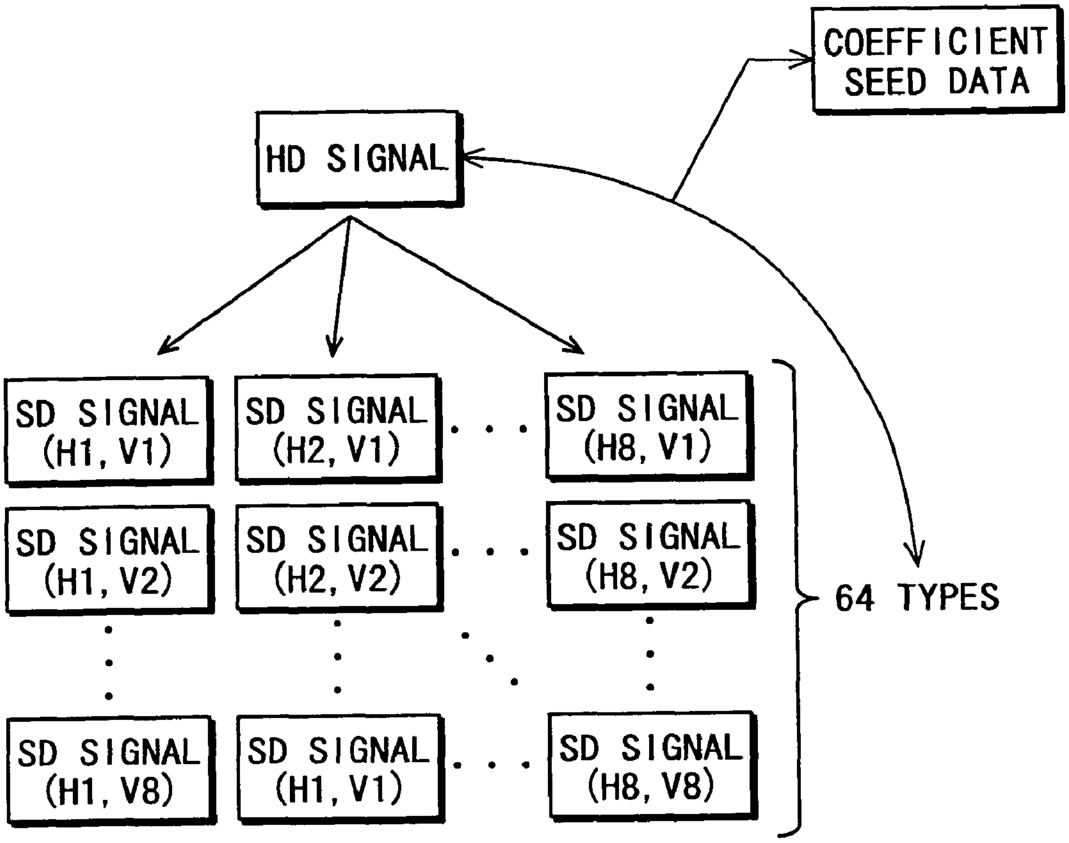
FIG. 31 is a diagram showing an example of generation method of coefficient seed data.

FIG. 31 shows a concept about generation method of the above-described coefficient seed data. From a HD signal (1050i signal) as the teacher signal, a SD signal (525i signal) as a student signal is generated. The 525i signal means interlace type image signal having 525 lines. The 1050i signal means interlace type image signal having 1050 lines.

Figure 32:
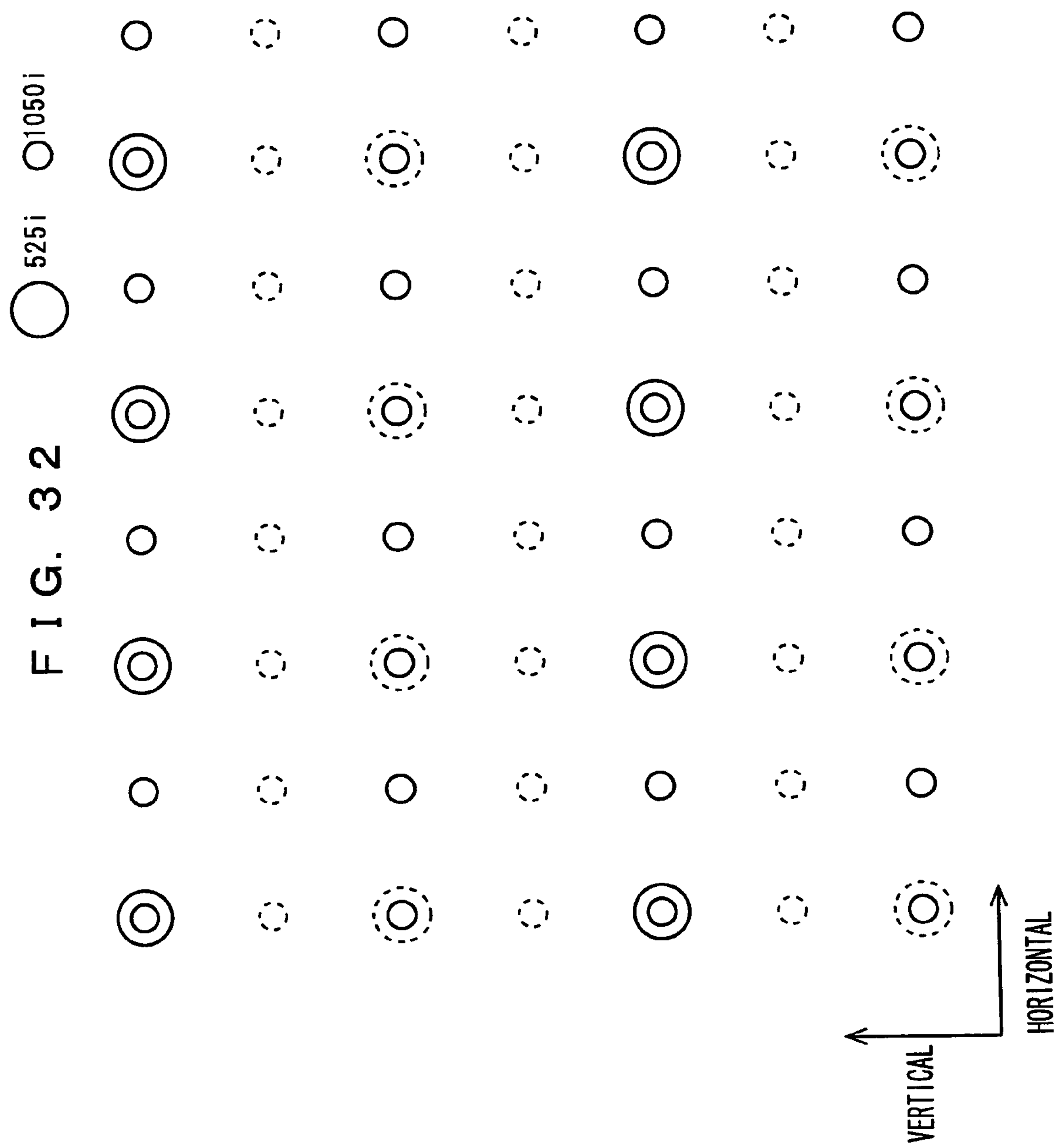
FIG. 32 is a diagram showing a relationship between a pixel position of the 525i signal (SD signal) and that of 1050i signal (HD signal)

FIG. 32 shows the relationship in pixel positions between the 525i signal and 1050i signal. Here, a large dot expresses a pixel of the 525i signal and a small dot expresses a pixel of the 1050i signal. Further, the pixel position in odd field is expressed with a solid line and the pixel position in even field is expressed with dotted line.

Figure 33:
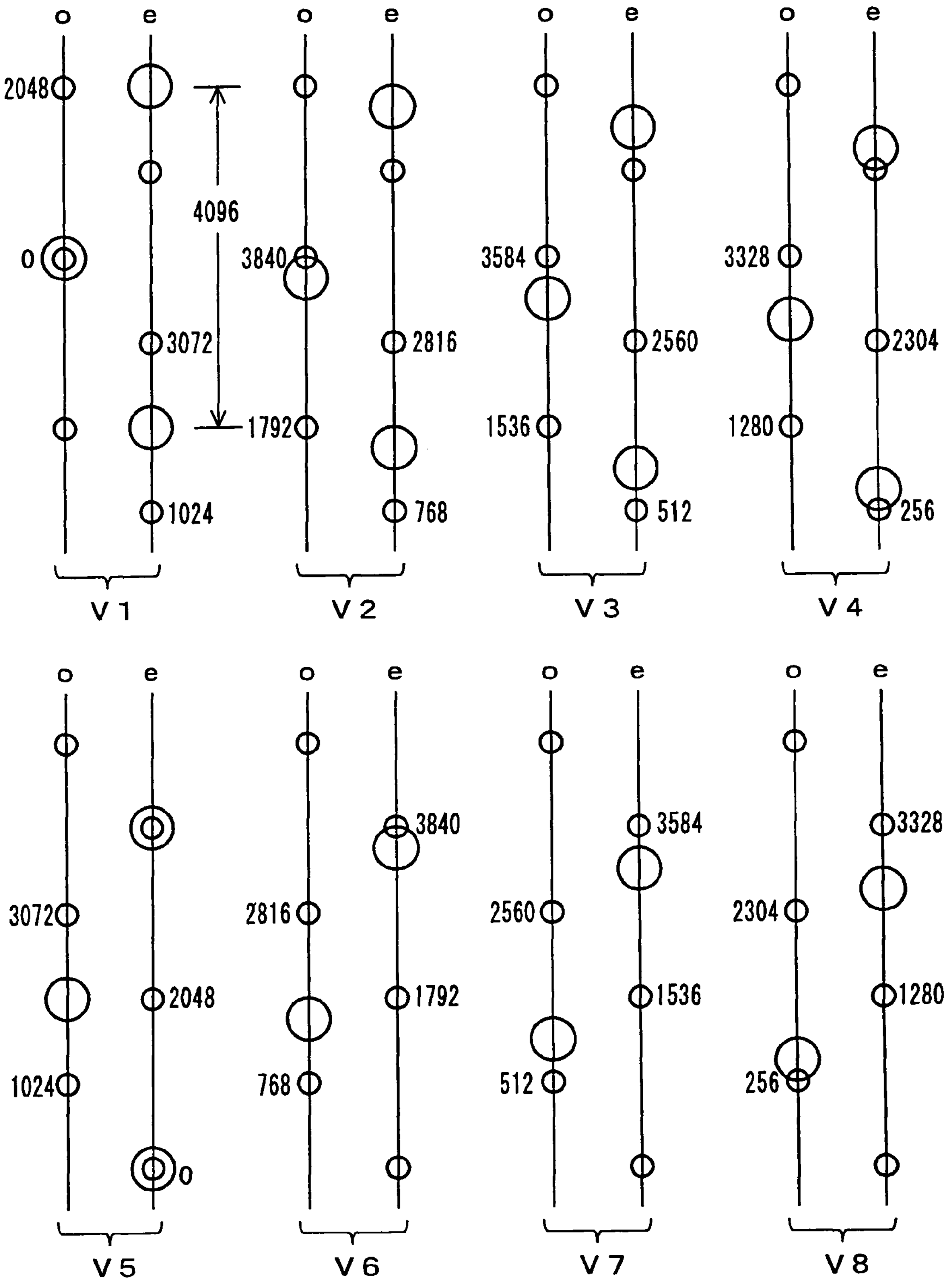
FIG. 33 is a diagram for illustrating the phase shift by eight steps in the vertical direction.

By shifting the phase of the SD signal by eight grades in the vertical direction and by eight grades in the horizontal direction, SD signals of 8×8=64, SD1-SD64 are generated. FIG. 33 shows phase shift conditions V1-V8 of eight grades in the vertical direction. Here, the pixel gap in the vertical direction of the SD signal is 4096. "o" indicates odd field and "e" indicates even field.

The V1 condition means that the shift amount of the SD signal is 0 and in this case, the pixel of the HD signal comes to have phases 0, 1024, 2048, 3072 relative to the pixel of the SD signal. The V2 condition means that the shift amount of the SD signal is 1 and in this case, the pixel of the HD signal comes to have phases 768, 1792, 2816, 3840 relative to the pixel of the SD pixel. The V3 condition means that the shift amount of the SD signal is 2 and in this case, the pixel of the HD signal comes to have phases 512, 1536, 2560, 3584 relative to the pixel of the SD signal. The V4 condition means that the shift amount of the SD signal is 3 and in this case, the pixel of the HD signal comes to have the phases 256, 1280, 2304, 3328 relative to the pixel of the SD signal.

The V5 condition means that the shift amount of the SD signal is 4 and in this case, the pixel of the HD signal comes to have phases 0, 1024, 2048, 3072 relative to the pixel of the SD signal. The V6 condition means that the shift amount of the SD signal is 5 and in this case, the pixel of the HD signal comes to have phases 768, 1792, 2816, 3840 relative to the pixel of the SD signal. The V7 condition means that the shift amount of the SD signal is 6 and in this case, the pixel of the HD signal comes to have phases 512, 1536, 2560, 3584 relative to the pixel of the SD signal. The V8 condition means that the shift amount of the SD signal is 7 and in this case, the pixel of the HD signal comes to have phases 256, 1280, 2304, 3328 relative to the pixel of the SD signal.

Figure 34:
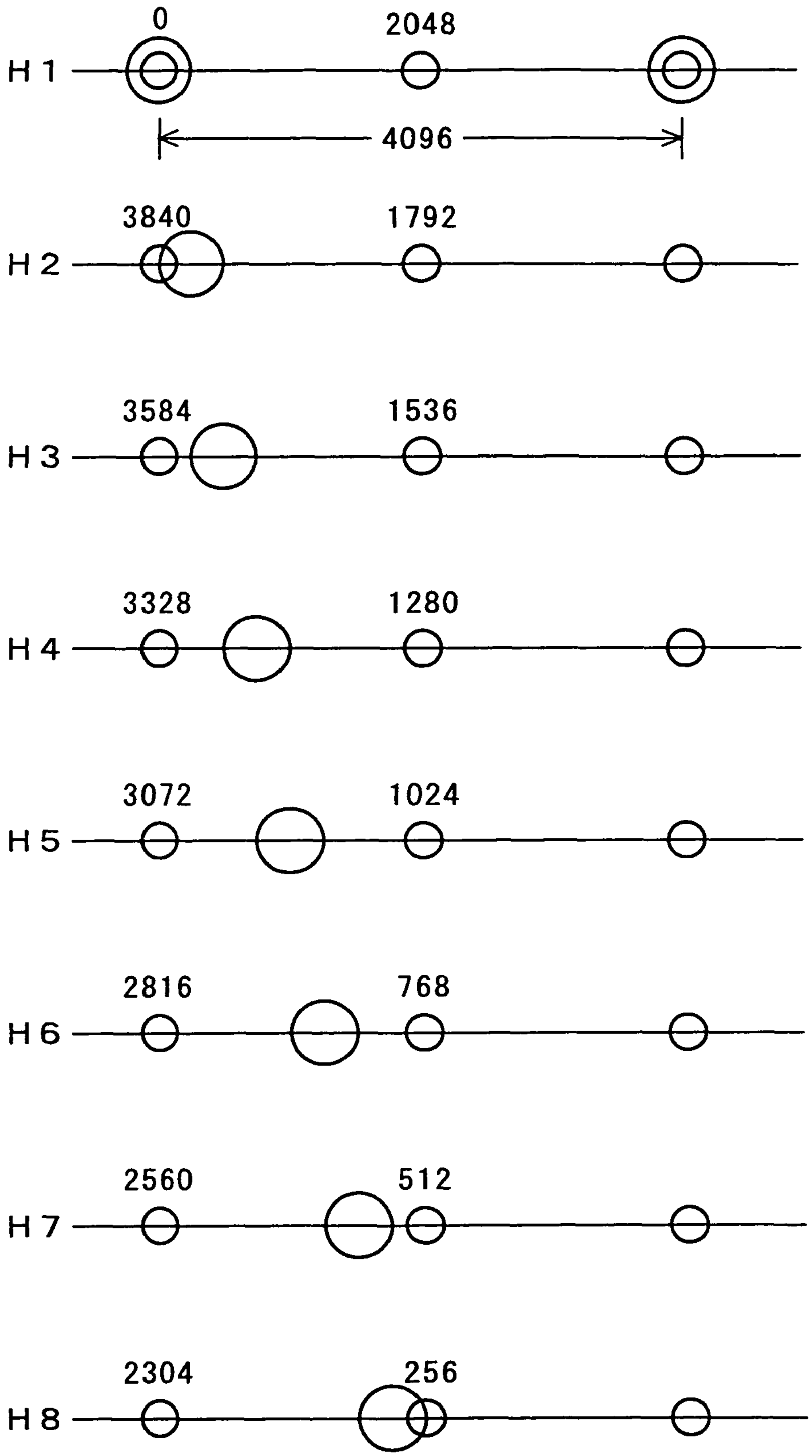
FIG. 34 is a diagram for illustrating the phase shift by eight steps in the horizontal direction.

FIG. 34 shows the phase shift conditions H1-H8 of eight grades in the horizontal direction. Here, the pixel interval in the horizontal direction of the SD signal is 4096.

The H1 condition means that the shift amount of the SD signal is 0 and in this case, the pixel of the HD signal comes to have phases 0, 2048 relative to the pixel of the SD signal. The H2 condition means that the shift amount of the SD signal is 1 and in this case, the pixel of the HD signal comes to have phases 1792, 3840 relative to the pixel of the SD signal. The H3 condition means that the shift amount of the SD signal is 2 and in this case, the pixel of the HD signal comes to have 1536, 3584 relative to the pixel of the SD signal. The H4 condition means that the shift amount of the SD signal is 3 and in this case, the pixel of the HD signal comes to have phases 1280, 3328 relative to the pixel of the SD signal.

The H5 condition means that the shift amount of the SD signal is 4 and in this case, the pixel of the HD signal comes to have phases 1024, 3072 relative to the pixel of the SD signal. The H6 condition means that the shift amount of the SD signal is 5 and in this case, the pixel of the HD signal comes to have phases 768, 2816 relative to the pixel of the SD signal. The H7 condition means that the shift amount of the SD signal is 6 and in this case, the pixel of the HD signal comes to have 512, 2560 relative to the pixel of the SD signal. The H8 condition means that the shift amount of the SD signal is 7 and in this case, the pixel of the HD signal comes to have phases 256, 2304 relative to the pixel of the SD signal.

Figure 35:
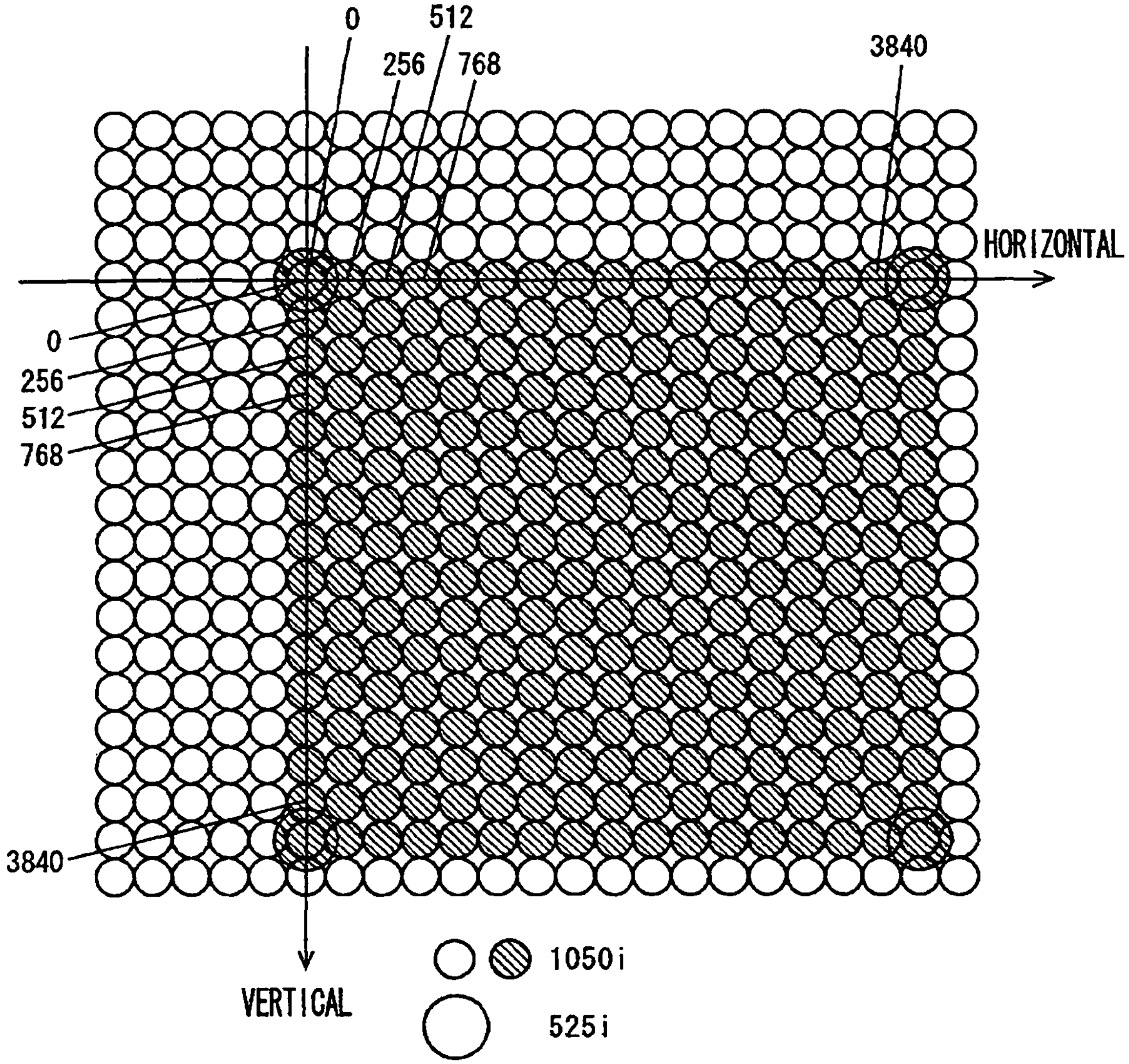
FIG. 35 is a diagram showing the phase relationship between the SD signal (525i signal) and HD signal (1050i signal)

FIG. 35 shows 64 types of the SD signals obtained by shifting by eight grades in the vertical direction and in the horizontal direction each to indicate the phase of the HD signal when the pixel of the SD signal is posted in the center. That is, with respect to the pixel of the SD signal, the pixel of the HD signal has the phase indicated with a hatched circle in the same Figure.

Here, as an example of the phase shift, a method for extracting only desired phases from an over-sampling filter will be explained. If as the aforementioned image quality adjustment, adjustment of the resolution and adjustment of noise suppression degree are taken as an example, by changing the frequency characteristic of the over-sampling filter, student images having different resolutions can be created. With student images having different resolutions, coefficients whose effects for raising the resolution are different can be created. For example, if there are a student image highly dim and a student image less dim, a coefficient having a high effect for raising the resolution is generated by learning with highly dim student images and a coefficient having a low effect for raising the resolution is generated by learning with less dim student images.

Further, by applying noise to each of student images having different resolutions, noise applied student images can be created. By changing the amount of applied noise, student images having different noise amount are generated and as a result, coefficients having different noise suppression effects are generated. For example, if there are a student image applied with much noise and a student image applied with little noise, a coefficient having a high noise suppression effect is created by learning with the student image applied with much noise and a coefficient having a low noise suppression effect is created by learning with the student image applied with little noise.

As for the amount of applied noise, if pixel value x' of a student image applied with noise is created by applying noise n to the pixel value x of the student image as shown in the equation (10), the amount of applied noise is adjusted by changing G.

$$x'=x+G\cdot n \qquad (10)$$

Figure 36:
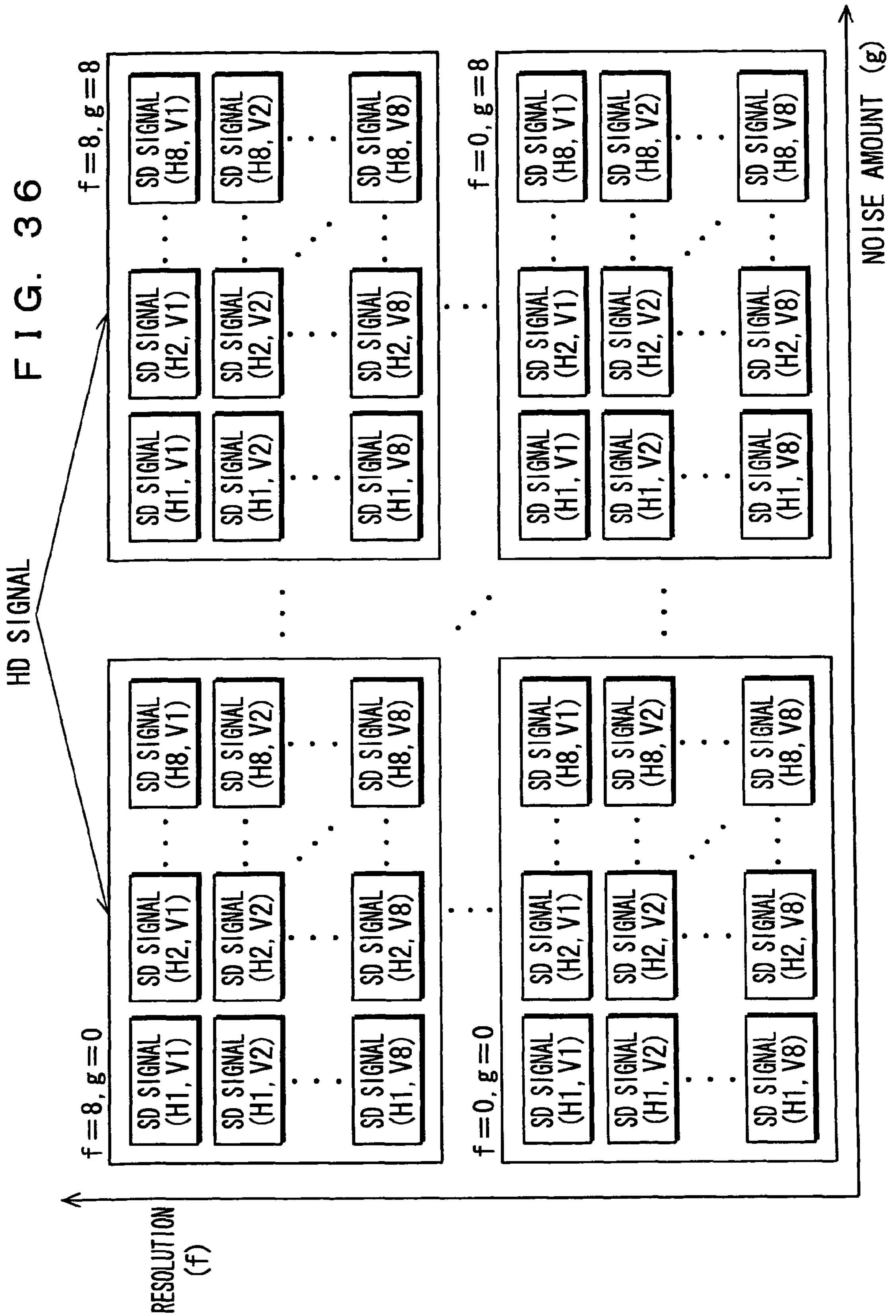
FIG. 36 is a diagram showing an example of generation method of coefficient seed data.

FIG. 36 shows a concept of final learning effect. Here, as an example, the frequency characteristics of different over-sampling filters are assumed to be classified into eight grades and noise application amount is classified into eight grades also. Coefficient data corresponding to resolution adjustment is created by learning with student images based on individual frequency characteristics and further, coefficient data corresponding to noise suppression adjustment is created by learning with student images applied with noise. Further, coefficient seed data for generating pixels corresponding to a different phase is created by learning with student images having different phases to individual frequency characteristic and noise application amount.

Figure 37:
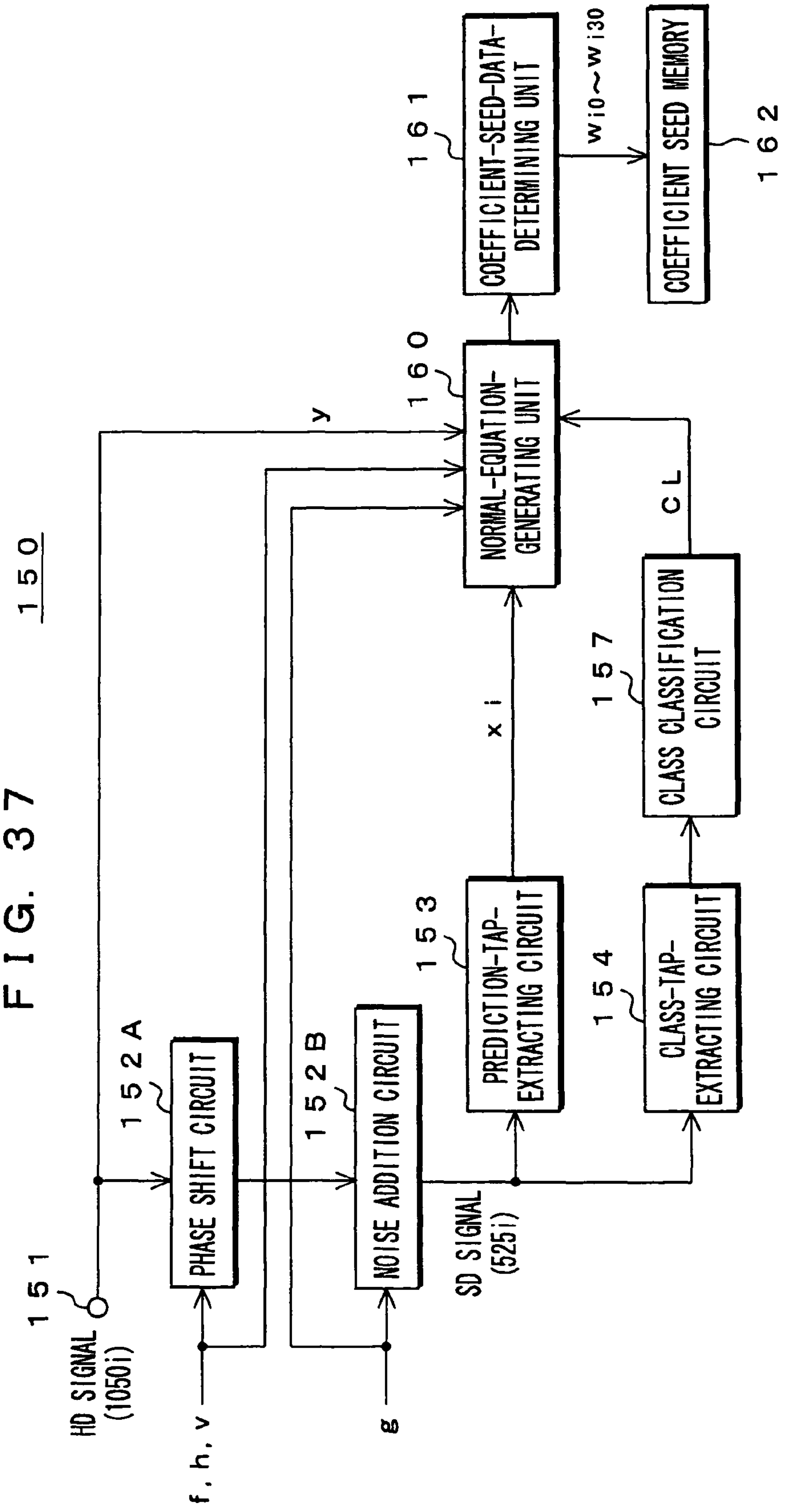
FIG. 37 is a block diagram showing a configuration of the coefficient-seed-data-generating apparatus.

FIG. 37 shows a configuration of a coefficient-seed-data-generating apparatus 150 for generating the coefficient seed data according to the above-described concept.

This coefficient-seed-data-generating apparatus 150 comprises an input terminal 151 for receiving an HD signal (1050i) as a teacher signal, a phase shift circuit 152A for obtaining a SD signal (525i) by extracting desired phase by applying over-sampling filter in the horizontal direction and vertical direction, and a noise addition circuit 152B for adding noise to this SD signal.

Parameter “f” for specifying the frequency characteristic of the over-sampling filter and parameters “h, v” for specifying the phase shift amount in the horizontal direction and vertical direction are inputted to the phase shift circuit 152A. A parameter “g” for specifying noise addition rate is inputted to the noise addition circuit 152B. Here, the parameter “f” corresponds to the resolution adjustment information “f” in the image-signal-processing unit 106 of FIG. 1, the parameters “h, v” correspond to the phase information “h, v” in the image-signal-processing unit 106 of FIG. 1, and the parameter “g” corresponds to the noise suppression degree adjustment information “g” in the image-signal-processing unit 106 of FIG. 1.

The coefficient-seed-data-generating apparatus 150 comprises a class-tap-extracting circuit 154 for extracting multiple items of pixel data located around a target position of the HD signal as a class tap based on the SD signal outputted from the noise addition circuit 152B and a class classification circuit 157 for obtaining a class code CL expressing a class to which the pixel data of the target position in the HD signal belongs based on this class tap.

Further, the coefficient-seed-data-generating apparatus 150 further comprises a prediction-tap-extracting circuit 153 for extracting multiple items of pixel data located around the target position of the HD signal as a prediction tap based on the SD signal outputted from the noise addition circuit 152B.

The coefficient-seed-data-generating apparatus 150 further comprises a normal-equation-generating unit 160 for generating the normal equation (see the equation (9)) for obtaining the coefficient seed data wi0-wi30 (i=1 to n) for each class. This normal-equation-generating unit 160 generates the normal equation for obtaining the coefficient seed data wi0-wi30 (i=1 to n) for each class based on pixel data y of each target position in the HD signal extracted from the HD signal to be inputted to the input terminal 151, pixel data xi as a prediction tap extracted by the prediction-tap-extracting circuit 153 corresponding to the pixel data y of each target position, class code CL obtained by the class classification circuit 157 corresponding to the pixel data y of each target position, parameter “f” for specifying the frequency characteristic of the over-sampling filter, parameters “h, v” for specifying the phase shift amount in the vertical direction, and the parameter “g” for specifying the addition rate of noise.

In this case, a single item of learning data is created by combination of a single item of pixel data y and n items of pixel data xi as a prediction tap corresponding thereto. The parameters “f, h, v” to the phase shift circuit 152A and the parameter “g” to the noise addition circuit 152B are changed successively so as to generate a SD signal corresponding thereto. Consequently, the normal-equation-generating unit 160 generates a normal equation in which a number of items of learning data are registered. By creating the SD signal successively and registering the learning data, the coefficient seed data for obtaining pixel data about arbitrary resolution adjustment, noise suppression degree adjustment, and the horizontal/vertical phase can be obtained.

The coefficient-seed-data-generating apparatus 150 comprises a coefficient-seed-data-determining unit 161 for receiving the normal equation data generated by the normal-equation-generating unit 160 for each class and obtaining the coefficient seed data wi0-wi30 for each class by solving the normal equation of each class, and a coefficient seed memory 162 for storing the obtained coefficient seed data wi0-wi30.

The coefficient-seed-data-generating apparatus 150 shown in FIG. 37 will be described.

The HD signal (1050i signal) is inputted to the input terminal 151 as a teacher signal. Corresponding to this HD signal, the phase shift circuit 152A obtains the SD signal by extracting a desired phase by applying the over-sampling filter in the horizontal and vertical directions. In this case, SD signals shifted to eight grades in the vertical direction and horizontal direction each are generated successively.

Corresponding to the SD signal of each phase, the parameter “f” to be inputted to the phase shift circuit 152A and the parameter “g” to be inputted to the noise addition circuit 152B are changed successively, so that corresponding SD signals are generated successively.

The class-tap-extracting circuit 154 extracts multiple items of pixel data located around a target position in the HD signal from each SD signal outputted from the noise addition circuit 152B as a class tap. This class tap is supplied to the class classification circuit 157. This class classification circuit 157 executes compression processing such as ADRC on multiple items of pixel data as the class tap so as to obtain a class code CL expressing a class to which the pixel data of the target position in the image signal Sb belongs. This class code CL is supplied to the normal-equation-generating unit 160.

Further, the prediction-tap-extracting circuit 153 extracts multiple items of pixel data located around the target position in the HD signal as a prediction tap from each SD signal outputted from the noise addition circuit 152B. The pixel data xi as this prediction tap is supplied to the normal-equation-generating unit 160.

The HD signal inputted to the input terminal 151 is supplied to the normal-equation-generating unit 160. This normal-equation-generating unit 160 generates a normal equation for obtaining the coefficient seed data wi0-wi30 (i=1 to n) for each class based on pixel data y of each target position in the HD signal extracted from the HD signal, multiple items of pixel data xi as the prediction tap extracted by the prediction-tap-extracting circuit 153 corresponding to the pixel data y of each target position, the class code CL obtained by the class classification circuit 157 corresponding to each pixel data y of each target position and parameters "f, h, v, g".

The normal equation is solved by the coefficient-seed-data-determining unit 161 so as to obtain the coefficient seed data wi0-wi30 of each class. The coefficient seed data wi0-wi30 is stored in the coefficient seed memory 162 in which addresses are divided for each class.

The coefficient-seed-data-generating apparatus 150 shown in FIG. 37 is capable of generating the coefficient seed data wi0-wi30 of each class, to be stored in the ROM 123 of the image-signal-processing unit 106 of FIG. 1.

Figure 38:
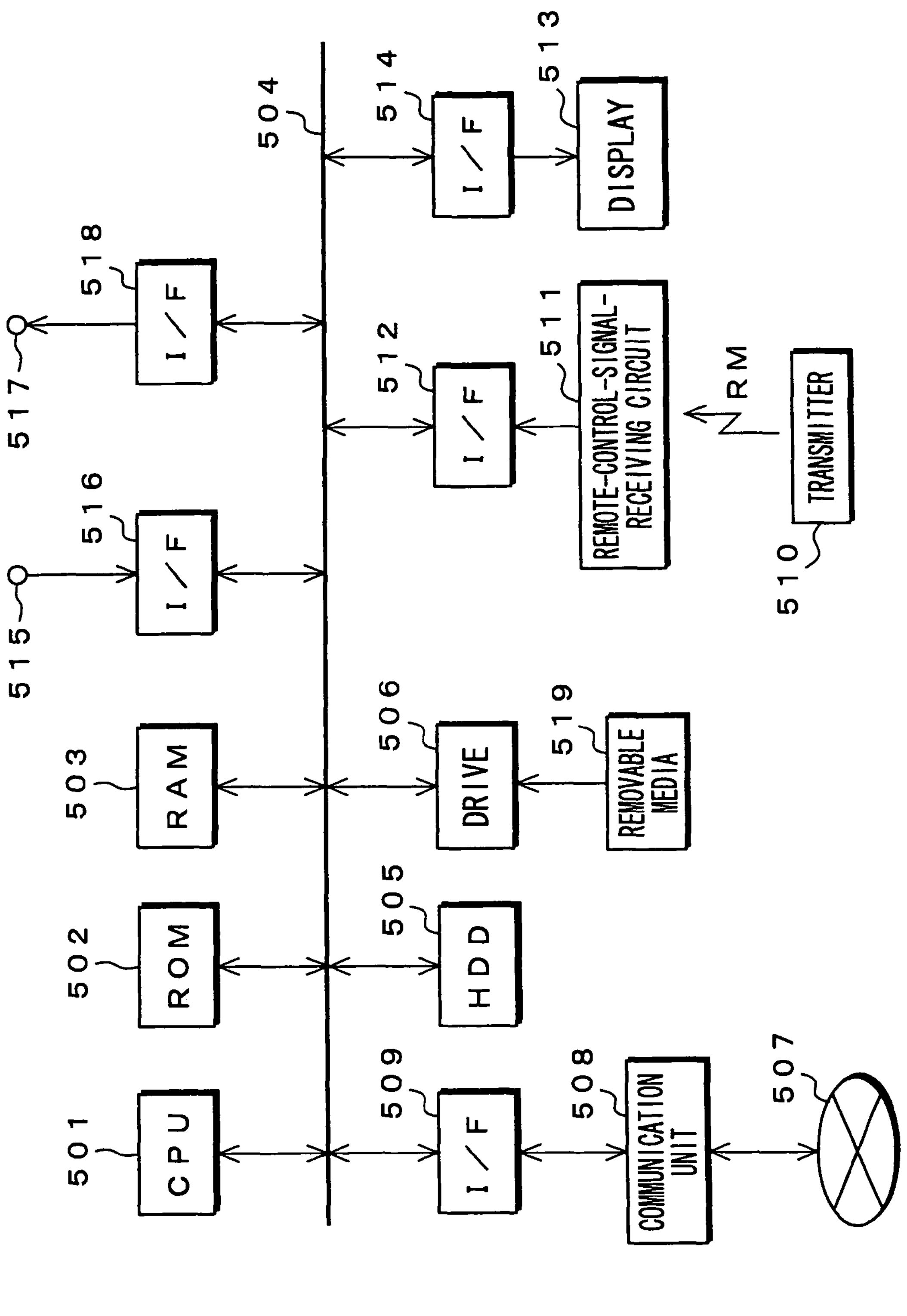
FIG. 38 is a block diagram showing a configuration of the image-signal-processing apparatus to be achieved with software.

The process of the image-signal-processing apparatus 100 shown in FIG. 1 can be executed with an image-signal-processing apparatus (computer) 500 shown in FIG. 38 using software. When a series of processes are executed with software, a program which constitutes that software is installed from a computer build in a dedicated hardware or a general purpose personal computer capable of executing various kinds of functions by installing various kinds of programs.

First, the image-signal-processing apparatus 500 shown in FIG. 38 will be described. This image-signal-processing apparatus 500 comprises a CPU 501 for controlling the operation of the entire apparatus, a read only memory (ROM) 502 for storing control programs of the CPU 501, coefficient seed data and the like, a random access memory (RAM) which constitutes the working region of the CPU 501. The CPU 501, ROM 502 and RAM 503 are respectively connected to the bus 504.

The image-signal-processing apparatus 500 comprises a hard disk drive (HDD) 505 as an external memory unit and a drive 506 which handles such a removable memory medium 519 as a flexible disc, compact disc read only memory (CD-ROM), magneto optical (MO) disc, digital versatile disc (DVD), magnetic disc, semiconductor memory. The drives 505, 506 are respectively connected to the bus 504.

The image-signal-processing apparatus 500 has a communication unit 508 to be connected to a communication network 507 such as the Internet by wire or radio. This communication unit 508 is connected to the bus 504 through an interface 509.

The image-signal-processing unit 500 has a user interface unit. This user interface unit comprises a remote-control-signal-receiving circuit 511 for receiving a remote control signal RM from a remote control signal transmitter 510, and a display 513 composed of cathode ray tube (CRT), liquid crystal display (LCD) or the like. The receiving circuit 511 is connected to the bus 504 through an interface 512 and the display 513 is connected to the bus 504 through an interface 514.

The image-signal-processing apparatus 500 comprises an input terminal 515 for inputting the image signal Sa and an output terminal 517 for outputting the image signal Sb. The input terminal 515 is connected to the bus 504 through the interface 516 and the output terminal 517 is connected to the bus 504 through the interface 518.

Instead of storing a control program or the like in the ROM 502 as described above, for example, it may be downloaded from the communication network 507 such as the Internet through the communication unit 508 and stored in the hard disc drive 505 or the RAM 303 for usage. Further, these control programs may be provided in the form of a removable memory medium.

Instead of inputting the image signal Sa to be processing through the input terminal 515, it may be supplied in the form of a removable memory medium and downloaded from the communication network 507 such as the Internet through the communication unit 508. Further, instead of outputting the image signal Sb after processing to the output terminal 517, it may be supplied to the display 513 in parallel, stored in the hard disc drive 505 or transmitted to the communication network 507 such as the Internet through the communication unit 508.

A procedure for obtaining the image signal Sb from the image signal Sa in the image-signal-processing apparatus 500 shown in FIG. 38 will be described with reference to the flow chart shown in FIG. 39.

First, in step ST51, the processing is started and in step ST52, the image signal Sa is inputted by the amount of a predetermined frame or by the amount of a predetermined field. When this image signal Sa is inputted through the input terminal 515, this image signal Sa is stored in the RAM 503 temporarily. Further, if this image signal Sa is recorded in the hard disc drive 505, the image signal Sa is read out of the hard disc 505 and this image signal Sa is stored in the RAM 503 temporarily. Then, in step ST53, whether or not the processing of the image signal Sa on the entire frame or entire field ends is determined. When the processing ends, the procedure terminates in step ST54. On the other hand, unless the processing ends, the procedure proceeds to step ST55.

In this step ST55, rate conversion processing is carried out on the image signal Sa inputted in step ST52 so as to generate the image signal Sc. In step 52, phase information "h, v" is obtained corresponding to each pixel data of the image signal Sc. Then, in step ST56, image quality adjustment information "f,g" based on user's operation are also obtained.

Next, in step ST57, pixel data of the class tap and prediction tap corresponding to a target position in the image signal Sb is obtained based on the image signal Sc generated in step ST55. Then, in step ST58, a class code CL expressing a class to which the pixel data of the target position in the image signal Sb belongs is generated based on the class tap extracted in step ST57.

Then, in step ST59, coefficient data Wi of an estimation equation for obtaining pixel data of a target position in the image signal Sb is generated using coefficient seed data of a class expressed by a class code CL generated in step ST58, phase information "h, v" corresponding to the target position in the image signal Sb obtained in step ST55, and image quality adjustment information "f, g" obtained in step ST56 according to the aforementioned equation (2).

Next, in step ST60, pixel data y of the target position in the image signal Sb is generated according to the estimation equation (1) using coefficient data Wi generated in step ST59 and pixel data xi as a prediction tap extracted in step ST57.

Next, in step ST61, whether or not processing of each field of the image signal Sa inputted in step ST52 is finished is determined. If the processing is finished, the procedure returns to step ST52, in which input processing of the image signal Sa in a predetermined frame or predetermined field is executed. On the other hand, unless the processing is finished, the procedure returns to step ST57, in which a processing for obtaining the pixel data y of a next target position in the image signal Sb is executed.

Figure 39:
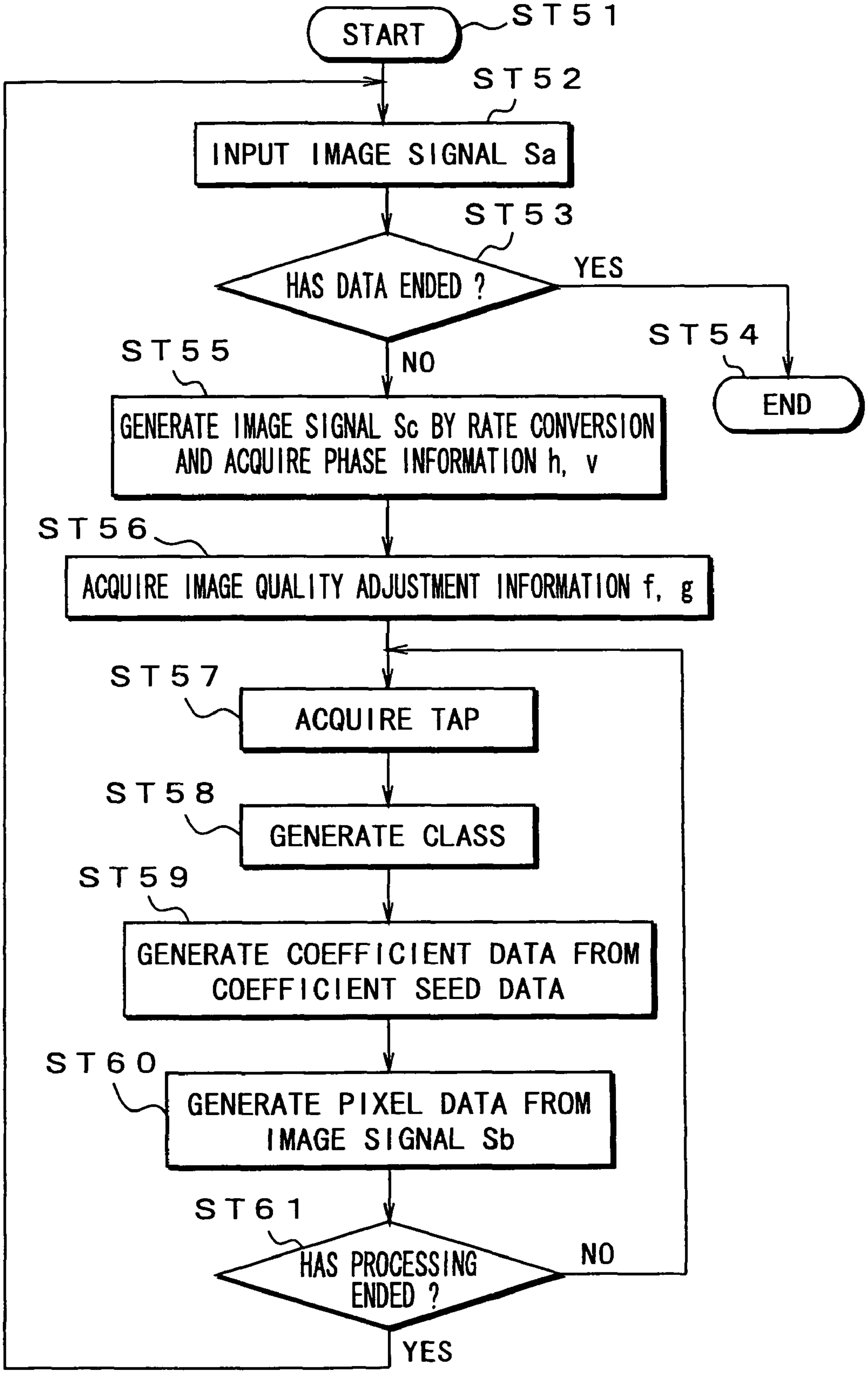
FIG. 39 is a flow chart showing the procedure of image signal processing.

By processing along the flow chart shown in FIG. 39, the inputted image signal Sa is processed so as to obtain the image signal Sb.

Although representation of the processing apparatus is omitted, the processing in the coefficient-seed-data-generating apparatus 150 of FIG. 37 can be realized with software.

The processing procedure for generating the coefficient seed data will be described by referring to the flow chart of FIG. 40.

First, in step ST71, the processing is started and in step ST72, the phase shift value (specified by, for example, the parameters "h, v") and the image quality adjustment value (specified by, for example, the parameters "f, g") of the SD signal used for learning are selected. Then, in step ST73, whether or not learning is finished for all combinations of the phase shift value and image quality adjustment values is determined. If no learning for all the combinations is finished, the procedure proceeds to step ST74.

In this step ST74, a well known HD signal is inputted by the amount of a single frame or a single field. In step ST75, whether or not the processing of the HD signal for all frames or fields is finished is determined. If it is finished, the procedure returns to step ST72, in which a next phase shift value and image quality adjustment value are selected and the same processing as described above is repeated. On the other hand, unless it is finished, the procedure proceeds to step ST76.

In this step ST76, from the HD signal inputted in step ST74, a SD signal with its phase being shifted only by a phase shift value selected in step ST72 and its image quality (in terms of resolution, noise) being adjusted corresponding to the image quality adjustment value is generated. Then, in step ST77, corresponding to the target position of the HD signal, pixel data of the class tap and the prediction tap is obtained from the SD signal generated in step ST76.

Next, in step ST78, a class code CL expressing a class to which the pixel data of a target position in the HD signal belongs is generated based on the class tap acquired in step ST77. With pixel data of the target position in the HD signal and pixel data as a prediction tap obtained in step ST77 assumed as a single item of learning data, addition for obtaining the normal equation (see the equation (9)) is carried out. This addition is carried out based on the class code CL for each class.

Next, in step ST80, whether or not the learning processing is finished in the entire region of the HD signal inputted in step ST74 is determined. If the learning processing is finished, the procedure returns to step ST74, in which the HD signal is inputted by the amount of a next single frame or single field and the same processing as described above is repeated. On the other hand, unless the learning processing is finished, the procedure returns to step ST77, in which a processing about a next target position in the HD signal is executed.

If in step ST73, learning is finished for all combinations of the phase shift value and image quality adjustment value, the procedure proceeds to step ST81. In this step ST81, by solving the normal equation based on sweep-out method or the like, coefficient seed data of each class is computed and in step ST82, the coefficient seed data is stored in a memory and then, in step ST83, the processing terminates.

Figure 40:
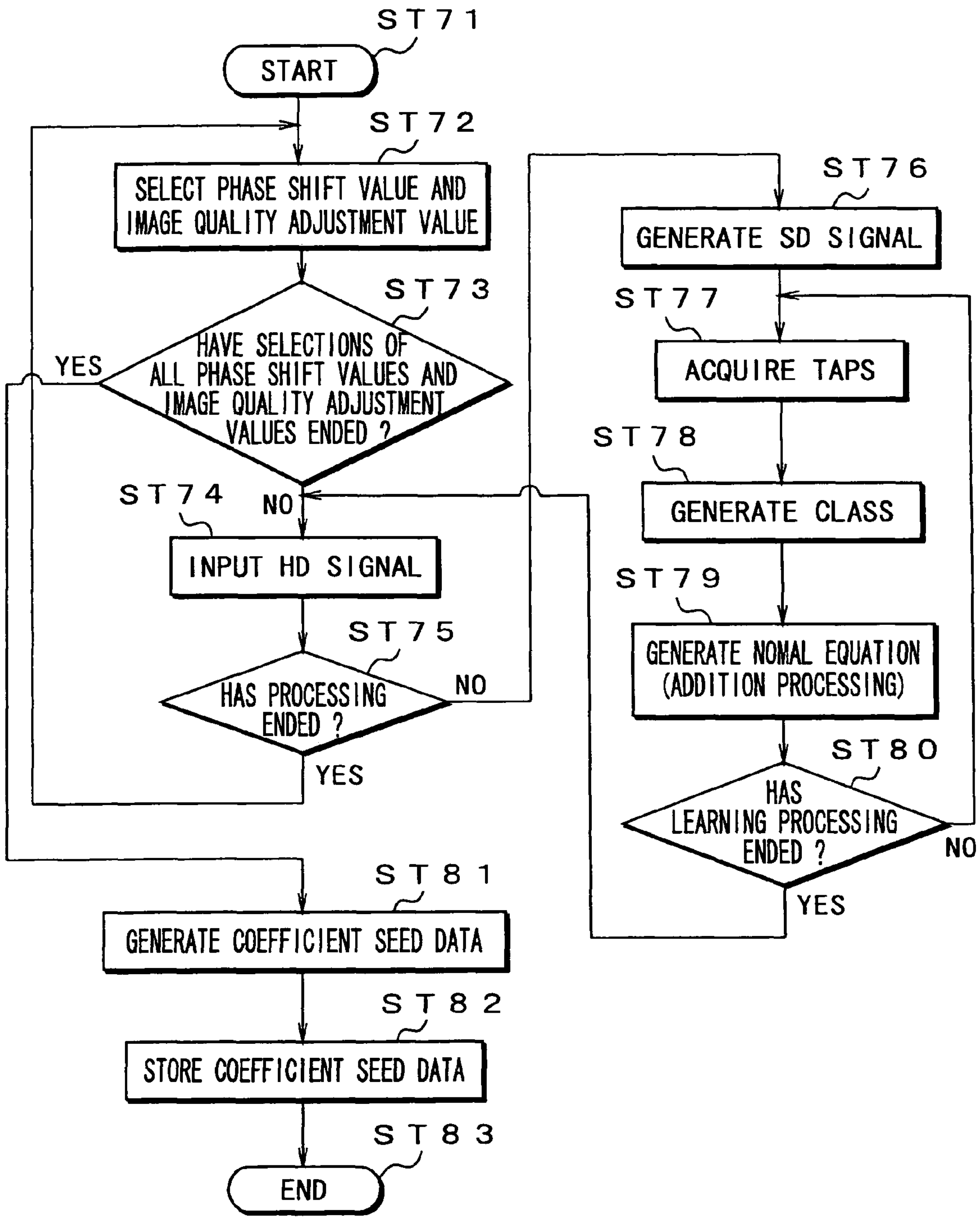
FIG. 40 is a flow chart showing the procedure of the coefficient seed data generation processing.

By processing along the flow chart shown in FIG. 40, the coefficient seed data of each class can be obtained according to the same method as in the coefficient-seed-data-generating apparatus 150 shown in FIG. 37.

According to the above-described embodiments, in the rate conversion circuit 105, the luminance signal Ya for 10 lines is read out of the frame memory 201 corresponding to a single read-out request RRQ and finally, the luminance signal Yc for 18 lines is outputted in parallel from the rate conversion unit 215Y. Further, the color-difference signals Ua/Va for two lines are read out of the frame memory 201 and finally, blue color-difference signal Uc for four lines and red color-difference signal Vc for four lines are outputted from the rate conversion unit 215C.

However, the numbers of lines of the luminance signal Ya and color-difference signals Ua/Va which should be read out of the frame memory 201 corresponding to a single read-out request RRQ are not restricted to this example.

For example, it can be considered to read out the luminance signal Ya for five lines and the color-difference signal Ua/Va for a single line from the frame memory 201 corresponding to a single read-out request RRQ. In this case also, by processing for line delay in the rate conversion units 215Y, 215C, finally, the luminance signal Yc for 18 lines, the blue color-difference signal Uc for four lines and the red color-difference signal Vc for four lines can be obtained.

Figure 41A:
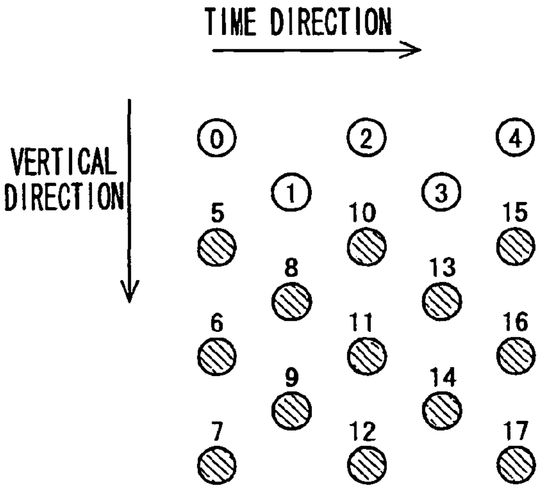
FIGS. 41A, 41B are diagrams showing an example of a tap region for extracting the class tap and the prediction tap in the luminance signal and color-difference signal obtained in the rate conversion circuit.
Figure 41B:
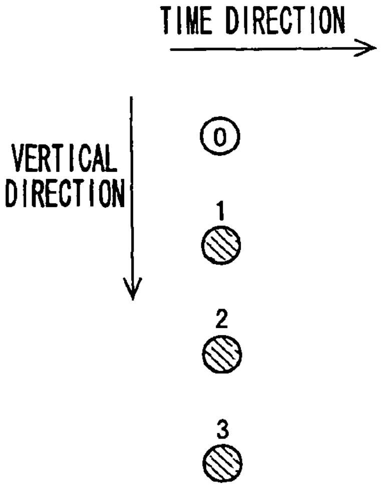

FIG. 41A shows an example of the tap region of the luminance signal and five lines 0-4 expressed with white circles indicate lines without line delay and 13 lines 5-17 expressed with hatched circles indicate lines with line delay. In this case, a line 10 is regarded as the center position. FIG. 41B shows an example of the tap region of the color-difference signal and a single line 0 expressed with a white circle indicates a line having no line delay and three lines 1-3 expressed with hatched circles indicate lines having line delay. In this case, a line 1 is regarded as the center position.

It can be considered to read out the luminance signal Ya for four lines and the color-difference signal Ua/Va for two lines from the frame memory 201 corresponding to a single read-out request RRQ, for example. In this case, by processing for line delay with the rate conversion units 215Y, 215C, finally, the luminance signal Yc for 14 lines and the blue color-difference signal Uc for eight lines and the red color-difference signal Vc for eight lines can be obtained.

Figure 42A:
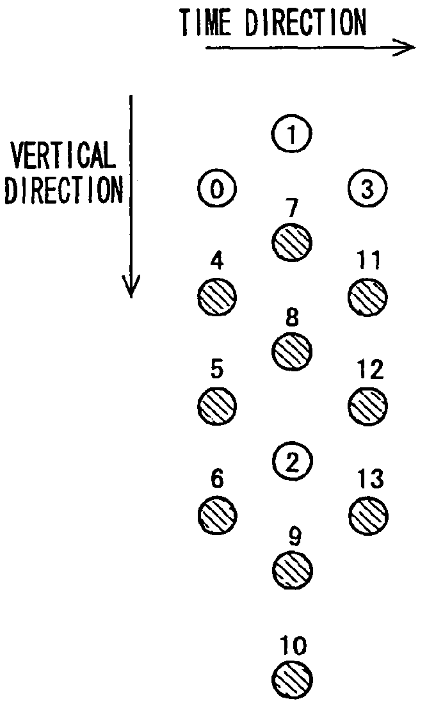
FIGS. 42A, 42B are diagrams showing an example of a tap region for extracting the class tap and the prediction tap in the luminance signal and color-difference signal obtained in the rate conversion circuit.
Figure 42B:
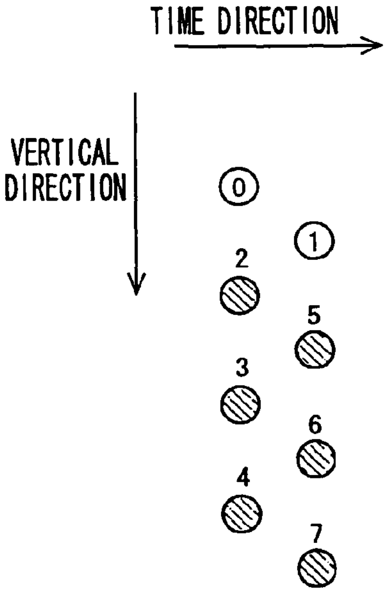

FIG. 42A shows an example of the tap region of the luminance signal and four lines 0-3 expressed with white circles indicate lines without line delay and 10 lines 4-13 expressed with hatched circles indicate lines with line delay. In this case, a line 8 is regarded as the center position. FIG. 42B shows an example of the tap region of the color-difference signal and two lines 0, 1 expressed with a white circle indicates a line having no line delay and six lines 2-7 expressed with hatched circles indicate lines having line delay. In this case, a line 3 is regarded as the center position.

Although according to the above-described embodiments, a case where five taps are built in the horizontal direction in the tap building circuits 221Y, 221C of the rate conversion circuit 105 has been indicated, the number of the taps is restricted to this example. Further, it is permissible to provide the luminance signal and the color-difference signal with different numbers of taps.

In the above-described embodiments, a case where the coefficient seed data is stored in the ROM 123 and the coefficient-generating circuit 124, using the coefficient seed data in a class expressing the class code CL, generates the coefficient data Wi corresponding to the phase information "h, v" and the image quality adjustment information "f, g" according to the generation equation (2) has been explained. However, it is permissible to store the coefficient data Wi about all combinations of the phase information "h, v" and the image quality adjustment information "f, g" for each class in the ROM 123 and read out coefficient data Wi corresponding to the phase information "h, v" and image quality adjustment information "f, g" in a class expressing the class code CL for usage.

In this case, the coefficient data Wi of each combination of the phase information "h, v" and the image quality adjustment information "f, g" stored in the information memory bank 135 can be obtained by learning on the SD signal obtained by each combination of the parameters "f, g, h, v".

In the above-described embodiments, a case where the number of pixels increases when obtaining the image signal Sc from the image signal Sa has been indicated and in the rate conversion units 215Y, 215C, it is intended to increase the quality of pixels by double reading. However, depending on the formats of the image signal Sa and the image signal Sc, the number of pixels decreases at the time of rate conversion. In this case, in the rate conversion units 215Y, 215C, the number of pixels is reduced by thinning.

In the above-described embodiments, a case where the class tap and the prediction tap are extracted from the image signal Sc expanded in the time direction, vertical direction and horizontal direction outputted from the rate conversion circuit 105 by means of the image-signal-processing unit 106 and used has been indicated. However, for the tap building circuits 221Y, 221C of the rate conversion circuit 105, it is permissible to provide with a tap building circuit for obtaining the class tap and a tap building circuit for obtaining the prediction tap so that the class tap and the prediction tap to be used in the image-signal-processing unit 106 are outputted directly from the rate conversion circuit 105. In this case, the image-signal-processing unit 106 does not need to be provided with the class-tap-extracting circuit 121 or the prediction-tap-extracting circuit 125.

Although in the above-described embodiments, as an estimation equation upon generating pixel data of the image signal Sb, usage of the linear equation has been mentioned, the present invention is not restricted to this example, but for example, it is permissible to use a high-degree equation as the estimation equation.

Although in the above-described embodiments, a case where the class code CL is detected and the coefficient data Wi corresponding to this class code is used in estimation computation has been indicated, it can be considered to omit the detecting unit for the class code CL. In such a case, only one space of the coefficient seed data is stored in the ROM 123.

According to an aspect of the present invention, an input image signal is stored in a first memory temporarily and from this first memory, the image signal is transferred to a second memory successively in the unit of line and written therein, and from this second memory, the image signal is read out at a pixel cycle and a line cycle of after-converted so as to obtain an output image signal. In this case, transfer of the image signal from the first memory to the second memory is controlled so that it is executed every specified time. Consequently, a stable data transmission band between the first memory and the second memory can be secured, thereby raising its use efficiency.

According to another aspect of the present invention, of a first control of transferring the image signal from a write buffer to a memory through a data bus based on a write request and writing therein and a second control of transferring the image signal from the memory to the read-out buffer through the data bus based on a read-out request and writing therein, any one has a precedence over the other, so that adjustments of the write and read-out through the same data bus can be executed under an excellent condition. Consequently, read-out based on input of the read-out request every specified time is enabled without depending upon the write timing by a write request.

According to still another aspect of the present invention, the write control based on the write request has a precedence over the read-out request based on the read-out request and a waiting time for read-out based on the read-out request can be generated. However, if n image signals of a single horizontal period are written into the memory corresponding to a single write request and m image signals (m>n) of a single horizontal period are written from the memory corresponding to a single read-out request, the maximum waiting time is that for n. Consequently, this is shorter than the maximum waiting time (for m) for a write based on a write request in case where the read-out control based on the read-out request has a precedence over the write control based on the write request.

According to yet still another aspect of the present invention, by using the conversion objective pixel data string of first image signals such that the same pixel data are disposed continuously at a rate corresponding to the magnification of the number of pixels, proper pixel data string of effective pixel section in the horizontal direction of the second image signal is generated and a modified pixel data string obtained by modifying this proper pixel data string is supplied to a shift register and pixel data of the change position of the modified pixel data string are taken successively into this shift register with a shift trigger. Consequently, a specified number of taps in the horizontal direction are built corresponding to each pixel position of the effective pixel section in the horizontal direction of the second image signal and the modified pixel data string is obtained by modifying the change position of the pixel data in the proper pixel data string so that the change of the center tap meets the arrangement of the proper pixel data string.

Consequently, according to the present invention, the predetermined number of taps in the horizontal direction can be obtained in the arrangement of the pixel data in the image signal (first image signal) before rate conversion regardless of the magnification of the number of pixels. Thus, if the pixel data of a target position in the output image signal is generated using the predetermined number of the taps in the horizontal direction according to phase information based on the pixel position of the image signal before rate conversion, the correspondence relation between the predetermined number of the taps in the horizontal direction and the phase information never collapses even if the magnification of the number of the pixels changes, so that the pixel data of the target position in the output image signal can be produced under an excellent condition.

According to a further aspect of the present invention, when the shift register has "no" registers and "ni" registers on the output side and input side respectively of a register which outputs the center tap, it is regarded that first (no+ni) pixel data in the modified pixel data string changes continuously, so that the first (no+ni) pixel data is taken into the shift register continuously at each line.

Consequently, according to the present invention, the output start delay until the predetermined number of the taps in the horizontal direction is outputted from the shift register since pixel data string of the image signal after rate conversion are inputted into the shift register can be fixed to (no+ni) clock time at each line without depending on the magnification of the number of pixels. Thus if pixel data of a target position in the output image signal is generated using the predetermined number of the taps in the horizontal direction based on the phase information of the target position of the output image signal, it is not necessary to provide with any variable delay circuit capable of changing the delay time depending on the magnification of the number of pixels for time adjustment between the taps of the predetermined number in the horizontal direction and the phase information.

According to the present invention, transfer of the image signal from the first memory to the second memory is so controlled to be executed every specified time, securing a data transmission band between the first memory and the second memory to raise the use efficiency. The present invention can be applied to a purpose for obtaining output image signals by storing input image signals in a first memory temporarily, transferring the image signals from this first memory to the second memory successively in the unit of line and writing therein and then reading out the image signal from the second memory at a pixel cycle and a line cycle after the conversion.

According to the present invention, the write and read-out through the same data bus can be executed favorably, so that the read-out based on input of a read-out request every specified time without depending on write timing by a write request is enabled. The present invention can be applied to a purpose for obtaining output image signals by storing input image signals in a first memory temporarily, transferring the image signals from this first memory to the second memory successively in the unit of line and writing therein and then reading out the image signal from the second memory at a pixel cycle and a line cycle of after-converted.

According to the present invention, the taps of a predetermined number in the horizontal direction can be obtained in the arrangement of the pixel data in the image signal before rate conversion without depending on the magnification of the number of pixels. Thus, the present invention can be applied to a purpose for obtaining a predetermined number of the taps in the horizontal direction in order to create new pixel data corresponding to each pixel position of the effective pixel section in the horizontal direction of output image signal by using the predetermined number of the taps in the horizontal direction after rate conversion.

The present application contains subject matter related to Japanese patent applications Nos. JP2003-295511, JP2003-295512, and JP2003-295513, filed in the Japanese Patent Office on Aug. 19, 2003, the entire contents of which being incorporated herein by reference.

While the foregoing specification has described preferred embodiment(s) of the present invention, one skilled in the art may make many modifications to the preferred embodiment without departing from the invention in its broader aspects. Therefore, the appended claims are intended to cover all such modifications as fall within the true scope and spirit of the invention.

What is claimed is:

1. A rate conversion apparatus comprising:

a first memory configured to store an input image signal temporarily;

a second memory configured to store an image signal transferred from said first memory successively in the unit of line and reading out the image signal at a pixel period and a line period to obtain an output image signal; and a controller configured to control the write to and read-out of said first memory and said second memory, wherein said controller controls transferring of the image signal from said first memory to said second memory at a fixed period such that the output image signal has a different number of pixels than the input image signal, a period for said transfer being a length of time obtained according to an equation, $t=mo/mi/fo\times no$ wherein the period of said transfer is t, the pixel frequency of said output image signal is fo, the number of lines objective for conversion of said input image signal is mi, the number of lines of a single vertical effective period of said output image signal is mo, and the number of pixels per line of said output image signal is no.

2. The rate conversion apparatus according to claim 1 wherein said first memory includes a burst transfer type frame memory and said second memory includes a random access type dual port line memory.

3. The rate conversion apparatus according to claim 1 wherein the period for said transfer is a length of time obtained by dividing a single vertical effective period of said output image signal equally by the number of lines objective for conversion of said input image signal.

4. The rate conversion apparatus according to claim 1 comprising a plurality of said second memories, wherein an image signal for each of a plurality of lines are transferred from said first memory to said plurality of second memories for each period of said transfers in time division fashion through an identical data bus.

5. The rate conversion apparatus according to claim 4 wherein said image signals are a luminance signal and a color-difference signal.

6. The rate conversion apparatus according to claim 1 wherein to obtain pixels of a single horizontal period in said output image signal corresponding to a predetermined number of pixels in the horizontal direction of said input image signal, any one of repeated reading-out and thinness for a predetermined pixel determined based on a proportion of number of the pixels is performed when reading the image signal out of said second memory.

7. The rate conversion apparatus according to claim 6 wherein the predetermined number of pixels is pixels of a single horizontal period.

8. The rate conversion apparatus according to claim 6 wherein the predetermined number of pixels is fewer than the pixels of a single horizontal period.

9. The rate conversion apparatus according to claim 1 wherein to obtain lines of a single vertical period in said output image signal corresponding to a predetermined number of lines in the vertical direction of said input image signal, any one of repeated reading-out and thinness for a predetermined line determined based on a proportion of lines is performed when reading out the image signal from said second memory.

10. The rate conversion apparatus according to claim 9 wherein the predetermined number of lines is lines of a single vertical period.

11. The rate conversion apparatus according to claim 9 wherein the predetermined number of lines is fewer than the lines of a single vertical period.

12. The rate conversion apparatus according to claim 1 wherein said controller comprises:

a write buffer configured to store an image signal temporarily to write the image signal into said first memory;

a read buffer configured to store an image signal read out of said first memory temporarily;

a write-address-generating unit configured to generate a write address of said first memory;

a read-address-generating unit configured to generate a read-out address of said first memory; and a write/read-out control unit configured to control said write buffer, said read buffer, said write-address-generating unit, and said read-address-generating unit based on a write request supplied each time when the image signal of a line is stored in said write buffer and a read-out request supplied said every specified time, wherein said write/read-out control unit gives a precedence to a control of transferring the image signal from said write buffer to said first memory through said data bus based on said write request and storing the image signal therein over a control of transferring the image signal from said first memory to said read buffer through said data bus based on said read-out request and storing the image signal therein.

13. The rate conversion apparatus according to claim 1, wherein said input image signal has 480 pixels in the vertical direction, 720 pixels in a horizontal direction, and 345,600 total pixels and said output image signal has 1,080 pixels in the vertical direction, 1,920 pixels in a horizontal direction, and 2,073,600 total pixels.

* * * * *